United States Patent
Saito et al.

(10) Patent No.: US 6,841,819 B2
(45) Date of Patent: Jan. 11, 2005

(54) SEMICONDUCTOR DEVICE

(75) Inventors: Takeyasu Saito, Kawasaki (JP); Seiji Ueno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/391,200

(22) Filed: Mar. 19, 2003

(65) Prior Publication Data

US 2003/0185068 A1 Oct. 2, 2003

(30) Foreign Application Priority Data

Mar. 20, 2002  (JP) ........................................ 2002-079415
Mar. 13, 2003  (JP) ........................................ 2003-067654

(51) Int. Cl.[7] ............................................. H01L 29/76
(52) U.S. Cl. ...................................................... 257/295
(58) Field of Search ................................. 257/295, 296, 257/308, 311

(56) References Cited

U.S. PATENT DOCUMENTS 6,229,172 B1    5/2001  Kobayashi
6,603,161 B2 *  8/2003  Kanaya et al. ............... 257/295
6,642,563 B2 * 11/2003  Kanaya ....................... 257/296

FOREIGN PATENT DOCUMENTS

JP          9-23009       1/1997
JP         11-345946     12/1999

* cited by examiner

Primary Examiner—David Nelms
Assistant Examiner—Mai-Huong Tran
(74) Attorney, Agent, or Firm—Westerman, Hattori, Daniels & Adrian, LLP

(57) ABSTRACT

There are provided a first insulating film formed over a semiconductor substrate, actual operating capacitors formed on the first insulating film in a memory cell region vertically and horizontally, dummy capacitors formed selectively at four corners of the memory cell region, and a second insulating film formed on the actual operating capacitors and the dummy capacitors.

39 Claims, 34 Drawing Sheets

FIG. 30A
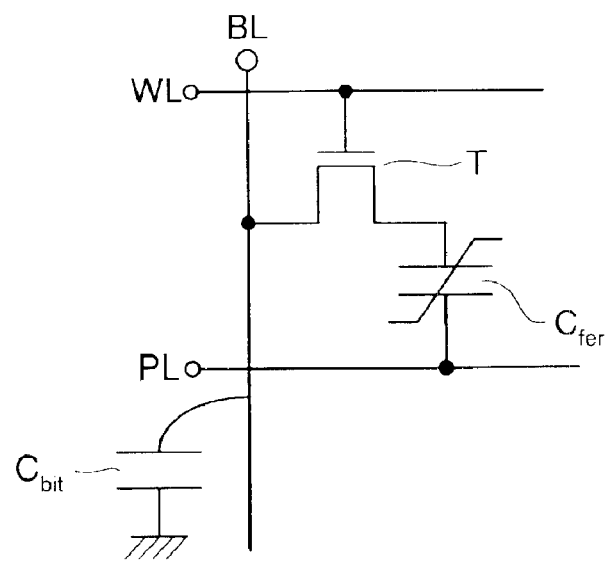
FIG. 30B
FIG. 30C
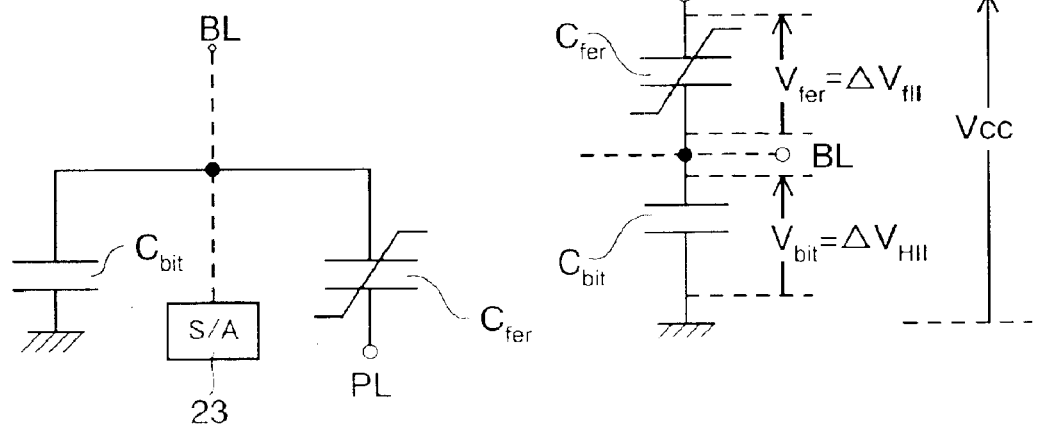

SEMICONDUCTOR DEVICE

CROSS-REFERENCE TO RELATED APPLICATIONS

This application is based upon and claims priority of Japanese Patent Applications No. 2002-079415, filed on Mar. 20, 2002, and NO. 2003-067654, filed on Mar. 13, 2003, the contents being incorporated herein by reference.

BACKGROUND OF THE INVENTION

1. Field of the Invention

The present invention relates to a semiconductor device and, more particularly, a semiconductor device having memory cells.

2. Description of the Prior Art

In the memory cell region of the FeRAM (Ferroelectric Random Access Memory), a plurality of ferroelectric capacitors are formed on the insulating film vertically and horizontally. The ferroelectric capacitors of the FeRAM that are mass-produced currently have a planar structure in which contact portions are provided on upper surfaces of the lower electrodes.

FIG. 1 is a plan view showing the planar structure of the memory cell region in which the capacitors having the planar structure, the word lines, the bit lines, etc. are arranged, and connections between the memory cell region and the circuits. In this case, in FIG. 1, the insulating films are omitted from the illustration.

In FIG. 1, a plurality of active regions 101 that are surrounded by the element isolation insulating film (not shown) are formed on the surface of the semiconductor substrate. The stripe-like plate lines 102 constituting the lower electrodes of the capacitors are formed on the first interlayer insulating film (not shown) that covers the active regions 101 and the element isolation insulating film. Also, a plurality of upper electrodes 104 are formed at an interval over the plate lines 102 in the length direction. In addition, the ferroelectric films 103 are formed between the plate lines 102 and the upper electrodes 104.

In this structure, the ferroelectric capacitor is constructed by the upper electrode 104, the ferroelectric film 103, and the plate line (lower electrode) 102. That is, the ferroelectric capacitors are formed on one plate line 102 as many as the upper electrodes 104.

The active region 101 is formed in plural at an interval under the region between the neighboring plate lines 102 in the plate-line extending direction. Two word lines 105 that extend in the length direction of the plate line 102 are formed at an interval on the active regions 101 between the plate lines 102. The word lines 105 are formed on the active regions 101 via the gate insulating film to extend onto the element isolation insulating film. The word line 105 functions as the gate electrode of the MOS transistor on the active region 101. Also, the impurity diffusion regions serving as the source/drain of the MOS transistor are formed in the active region 101 on both sides of the word line 105.

Accordingly, two MOS transistors that use one impurity diffusion region commonly are formed in respective active regions 101 that are present between two plate lines 102. The MOS transistors and the word lines 105 are covered with the first interlayer insulating film, and the ferroelectric capacitors are covered with the second insulating film (not shown).

The first contact holes 106 are formed in the first and second interlayer insulating films on the active region 101 on both sides of the word lines 105, and the second contact holes 107 are formed in the second insulating film on the upper electrodes 104. The conductive plugs are buried in the first and second contact holes 106, 107.

The impurity diffusion region in the active region 101 between the upper electrode 104 and the word line 105 is connected electrically to the upper electrode 104 via the metal wiring 108 on the second interlayer insulating film and the conductive plugs in the first and second contact holes 106, 107. Also, the impurity diffusion region in the active region 101 put between two word lines 105 is connected electrically to the metal pad 109 on the second interlayer insulating film via the conductive plug in the first contact holes 106.

The third interlayer insulating film (not shown) is formed on the metal wiring 108 and the metal pad 109. The bit line 110 formed on the third interlayer insulating film is connected electrically to the impurity diffusion region at the center of the active region 101 via the metal pad 109. The bit line 110 is formed in plural at an interval to extend in the direction that intersects orthogonally with the plate line 102.

A plurality of bit lines 110 are connected to the sense amplifier SA in the memory cell region respectively except the first and final bit lines. Also, a plurality of plate lines 102 are connected to the plate line driver PD in the memory cell region respectively except the first and final plate lines. In addition, the word lines 105 are connected to the word line driver WD in the memory cell region respectively except the first and final word lines.

In the memory cell region, two outermost plate lines 102 and two outermost bit lines 110 are connected to the fixed potential, e.g., the ground voltage, respectively.

Accordingly, the outermost peripheral region in the memory cell region is the dummy capacitor region 120, and the ferroelectric capacitors being positioned in the dummy capacitor region 120 are used as the dummy capacitors that are not actually operated. Also, the ferroelectric capacitors being surrounded by the dummy capacitor region 120 become the memory cells.

In this case, it is set forth in following Patent Document 1 that the dummy capacitors are formed uniformly along the outermost periphery of the memory cell region of the DRAM.

Also, it is set forth in following Patent Document 2 that, if the long side of the upper electrode of the ferroelectric capacitor is arranged perpendicularly to the long side of the lower electrode and also the contact hole that is formed on the upper electrode is displaced along the long side direction, variation in capacitor characteristic is reduced.

However, in order to improve characteristics of the capacitor that is actually operated in the initial state, the formation of the dummy capacitor is needed in the prior art.

(Patent Document 1)
Patent Application Publication (KOKAI) Hei 11-345946 (on and after page 14, line 19 in Specification, FIG. 3)

(Patent Document 2)
International Publication 97/40531 Pamphlet (Specification page 14, line 19 et seq., FIG. 1 to FIG. 3)

In the meanwhile, the optimum arrangement and structure of the dummy capacitors are not clear, and thus the state of the deterioration of the capacitor is different according to the arrangement and structure of the memory cell.

Also, the deterioration of the capacitor appears conspicuously as the memory cell area is reduced in response to the request for the higher integration of the FeRAM. But the rule to reduce the arrangement of the dummy capacitors to the lowest minimum is not apparent.

SUMMARY OF THE INVENTION

It is an object of the present invention to provide a semiconductor device capable of improving the degradation resistance of the capacitor located near the outer periphery in the memory cell region.

According to one aspect of the present invention, there is provided a semiconductor device comprising: a first insulating film formed over a semiconductor device; actual operating capacitors formed on the first insulating film in a memory cell region vertically and horizontally; dummy capacitors formed selectively at four corners of the memory cell region; and a second insulating film formed on the actual operating capacitors and the dummy capacitors.

According to another aspect of the present invention, there is provided a semiconductor device comprising: a first insulating film formed over a semiconductor substrate; first actually-operating capacitors formed in a memory cell region on the first insulating film, and having first upper electrodes, first dielectric films, and first lower electrodes; second actually-operating capacitors formed in four corners in the memory cell region on the first insulating film, and having second upper electrodes whose area is wider than the first upper electrodes, second dielectric films, and second lower electrodes; and a second insulating film for covering the first actually-operating capacitors and the second actually-operating capacitors.

According to another aspect of the present invention, there is provided a semiconductor device comprising: a first insulating film formed over a semiconductor substrate; first actually-operating capacitors formed in plural in a memory cell region on the first insulating film, and having first upper electrodes, first dielectric films, and first lower electrodes; second actually-operating capacitors formed in four corners in the memory cell region on the first insulating film, and having second upper electrodes, second dielectric films, and second lower electrodes; a second insulating film for covering the first actually-operating capacitors and the second actually-operating capacitors; first bit lines connected electrically to the first upper electrodes of the first actually-operating capacitors via first transistors; second bit lines connected electrically to the second upper electrodes of the second actually-operating capacitors via second transistors; and one or two capacitance supplementing elements or more connected to the second bit lines.

According to another aspect of the present invention, there is provided a semiconductor device comprising: a first insulating film formed over a semiconductor substrate; a plurality of plate lines formed on the first insulating film in a memory cell region; a plurality of capacitors connected to the plate lines respectively; and a boost circuit connected to first plate lines, which are arranged closest to four corners of the memory cell region, out of the plate lines.

According to the present invention, the dummy capacitors are formed selectively at four corners or their neighborhoods of the memory cell region.

The actual operating capacitors arranged in plural in the memory cell region are ready to deteriorate at four corner portions of the memory cell region. Therefore, if the dummy capacitors are formed selectively at four corners or their neighborhoods to protect the actual operating capacitors on the inner side, the deterioration of the characteristic of the actual operating capacitors can be prevented.

Also, since the structure in which the conductive pattern, which is the same layer structure as the wiring contacted with the upper electrode of the capacitor, is connected to the upper electrode of the dummy capacitor may be employed, the distribution of the reaction gas employed to manufacture the actual operating capacitors, etc. can be easily uniformized in the memory cell region. Thus, the deterioration is difficult to occur in the characteristic of the actual operating capacitors.

In addition, the volume of the interlayer insulating film on the actual operating capacitors in the memory cell region can be reduced by arranging the dummy capacitors on the outermost periphery of the memory cell region, or arranging them on the further outside of the memory cell region, or arranging them in the positions to surround the memory cell region. Therefore, the influence of the reducing gas employed to form the interlayer insulating film upon the actual operating capacitors can be reduced. As a result, the deterioration of the ferroelectric film constituting the actual operating capacitors can be prevented.

According to above another invention, the areas of the capacitors, which are located closest to four corners of the memory cell region, out of a plurality of capacitors formed in the memory cell region vertically and horizontally are set wider than the areas of other capacitors.

Therefore, such an event is suppressed that, if the storage capacitances of the capacitors that are located closest to four corners of the memory cell region are lowered locally, a quantity of stored charge in the capacitors that are located closest to four corners is reduced smaller than that of other capacitors.

Also, capacitance supplementing elements are formed in the bit line that are connected to the capacitors, which are located closest to four corners of the memory cell region, via the transistors. Therefore, even if the storage capacitances of the capacitors that are located closest to four corners are lowered locally, it is suppressed that the error of the reading of the data stored in the capacitor is caused.

In addition, the booster circuit is connected to the plate line that is connected to the capacitors that are located closest to four corners of the memory cell region. Therefore, even if the storage capacitances of the capacitors that are located closest to four corners are lowered locally, it is prevented that the error of the reading of the data stored in the capacitor is caused.

BRIEF DESCRIPTION OF THE DRAWINGS

FIGS. 30A to 30C are equivalent circuit diagrams of memory cells of a semiconductor device according to a twelfth embodiment of the present invention;

DESCRIPTION OF THE PREFERRED EMBODIMENTS

Embodiments of the present invention will be explained with reference to the drawings hereinafter.

(First Embodiment)

Figure 1:
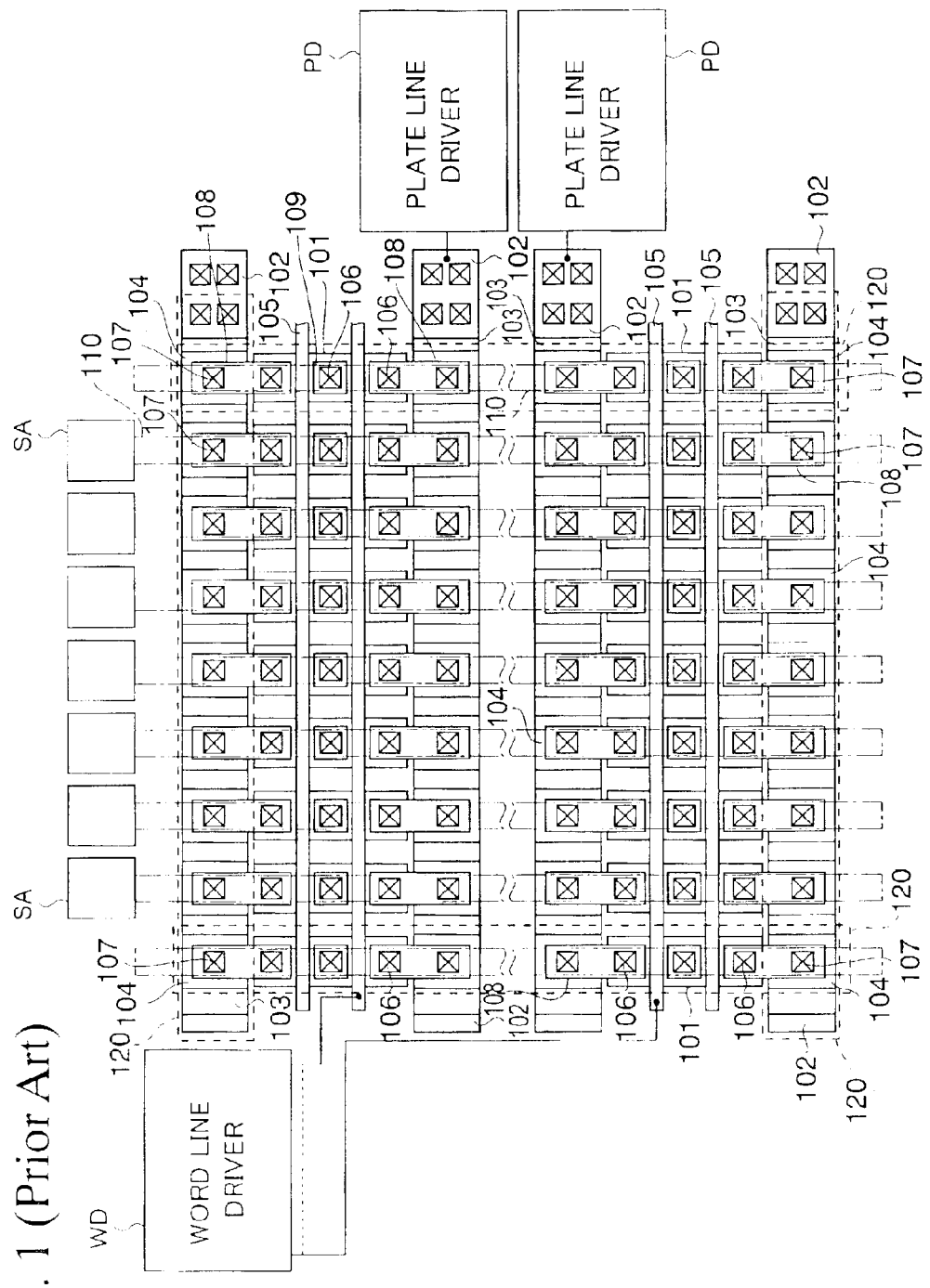
FIG. 1 is a plan view showing the semiconductor device having capacitors in the prior art.
Figure 2:
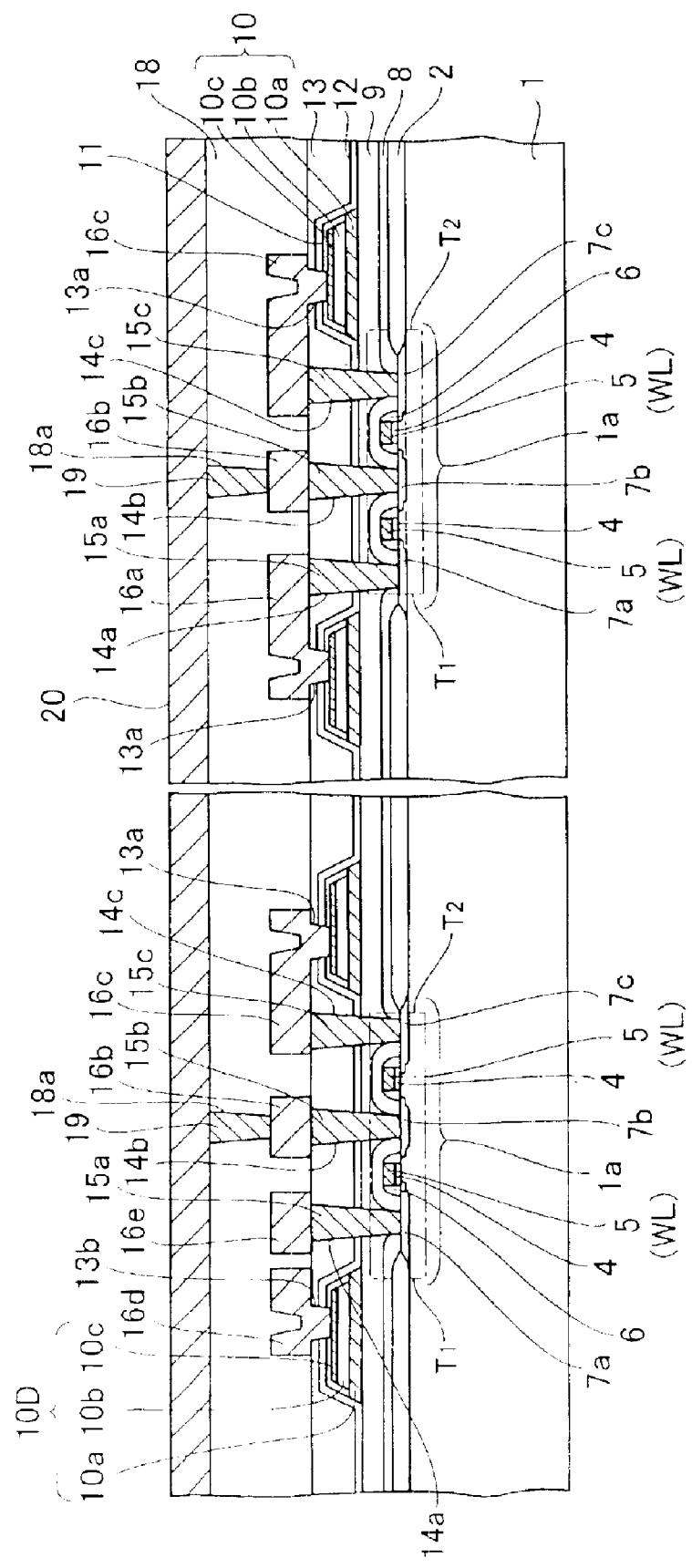
FIG. 2 is a sectional view showing memory cells of a semiconductor device according to a first embodiment of the present invention.
Figure 3:
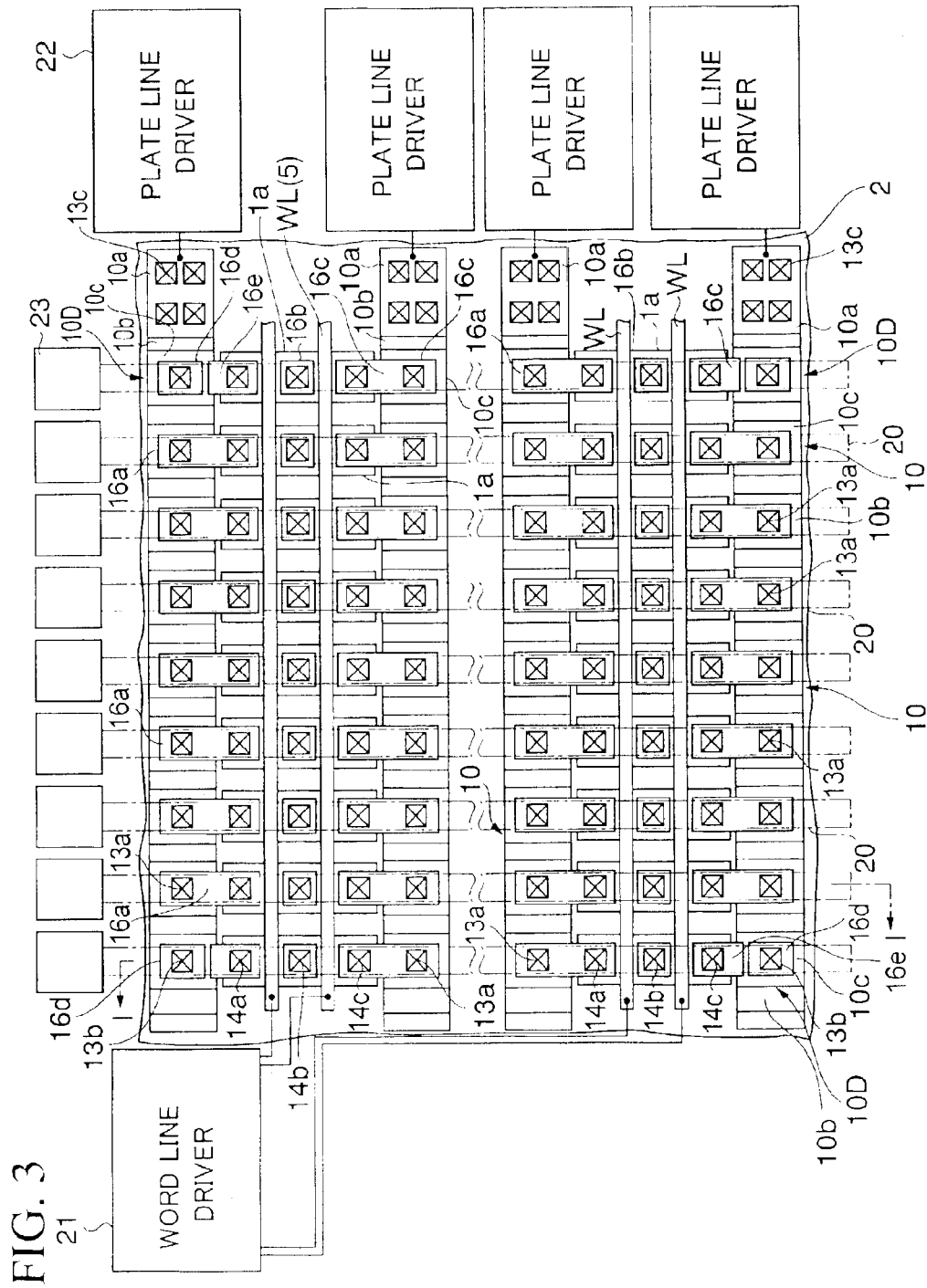
FIG. 3 is a plan view showing a memory cell region of the semiconductor device according to the first embodiment of the present invention.

FIG. 2 is a sectional view showing a part of a memory cell region of a semiconductor device according to a first embodiment of the present invention. FIG. 3 is a plan view showing the memory cell region of the semiconductor device according to the first embodiment. In this case, FIG. 2 is a sectional view taken along a I—I line in FIG. 3. In FIG. 3, the insulating films formed over the element isolation insulating film are omitted from the illustration.

In FIG. 2, an element isolation insulating film 2 is formed on a surface of a p-type silicon (semiconductor) substrate 1 by the LOCOS (Local Oxidation of Silicon) method. The element isolation insulating film 2 is formed in a region to surround a plurality of active regions (transistor forming regions) 1a that are arranged vertically and horizontally on a surface layer of the silicon substrate 1. In this case, STI (Shallow Trench Isolation) may be employed as the element isolation insulating film 2.

A planar shape of the active region 1a is almost rectangle, and gate electrodes 5 are formed on the active region 1a via a gate insulating film 4. The gate electrode 5 constitutes a part of the word line WL that extends in the direction that intersects orthogonally with the length direction of the active region 1a. Also, two gate electrodes 5 are formed in almost parallel at an interval on the active region 1a. Sidewall insulating films 6 are formed on side surfaces of the gate electrode 5.

First to third n-type impurity diffusion regions 7a, 7b, 7c having the LDD structure are formed on surface layers of each active region 1a on both sides of two gate electrodes 5. Also, a silicide layer (not shown) is formed on surfaces of the first to third n-type impurity diffusion regions 7a, 7b, 7c, which are not covered with the gate electrodes 5 and the sidewall insulating films 6.

The second n-type impurity diffusion region 7b positioned in the middle of the active region 1a is connected electrically to the bit line described later. The first and third n-type impurity diffusion regions 7a, 7c positioned on both sides of the active region 1a are connected electrically to the capacitors described later.

In each active region 1a, the first and second n-type impurity diffusion regions 7a, 7b and one gate electrode 5 constitute a first n-MOS transistor $T_1$, and also the second and third n-type impurity diffusion regions 7b, 7c and the other gate electrode 5 constitute a second n-MOS transistor $T_2$.

An insulating cover film 8 is formed on the first and second n-MOS transistors $T_1$, $T_2$ and the element isolation insulating film 2. As this cover film 8, a silicon oxide nitride (SiON) film is formed by the plasma CVD method, for example. Then, a first interlayer insulating film 9 is formed on the cover film 8. As the first interlayer insulating film 9, a silicon oxide ($SiO_2$) film is formed by the plasma CVD method using the TEOS gas, for example.

An upper surface of the first interlayer insulating film 9 is planarized by the CMP (Chemical Mechanical Polishing) method. Ferroelectric capacitors 10 are formed on the first interlayer insulating film 9 over the element isolation insulating film 2 in front of and at the back of the active region 1a in the longitudinal direction. The ferroelectric capacitor 10 consists of a lower electrode 10a, a ferroelectric film 10b, and an upper electrode 10c. The lower electrode 10a is called the plate line, and is formed to extend in almost parallel with the word line WL, as shown in FIG. 3. Also, the ferroelectric film 10b is formed on the lower electrode 10a like a stripe. In addition, the upper electrode 10c is formed in plural on the ferroelectric film 10b at an interval in the length direction of the plate line 10a.

Also, dummy capacitors 10D each having the same structure as the ferroelectric capacitor 10 of the actual operating cell are formed at four corners of the memory cell region on the first interlayer insulating film 9. The ferroelectric capacitors 10 and the dummy capacitors 10D are formed simultaneously.

The lower electrode 10a has a double-layered structure that consists of a titanium (Ti) film of 10 to 30 nm thickness and a platinum (Pt) film of 100 to 300 nm thickness, for example. Also, the ferroelectric film 10b is formed of a plumbum zirconate titanate (PZT:$Pb(Zr_{1-x}Ti_x)O_3$) film of 100 to 300 nm thickness. Such ferroelectric film 10b is crystallized by RTA (Rapid Thermal Annealing) in the oxygen atmosphere at the temperature of 650 to 850° C. for 30 to 120 seconds after the growth. In this case, as the ferroelectric film 10b, other PZT material such as PLCSZT, PLZT, etc., the Bi layer-structured compound such as $SrBi_2Ta_2O_9$ (SBT, Y1), $SrBi_2(Ta, Nb)_2O_9$ (SBTN, YZ), etc., and other metal oxide ferroelectric substance may be employed in addition to PZT. In addition, the upper electrode 10c is formed of an iridium oxide ($IrO_2$) film of 100 to 300 nm thickness, for example.

The upper electrode 10c and the ferroelectric film 10b of the capacitor 10 are patterned by using separate masks or the same mask, and a first capacitor protection insulating film 11 is formed on them. Also, the lower electrode 10a is patterned, and then a second capacitor protection insulating film 12 is formed on the first capacitor protection insulating film 11, the lower electrode 10a, and the first interlayer insulating film 9. The first and second capacitor protection insulating films 11, 12 are formed of insulating material such as alumina, PZT, or the like that has the reduction preventing function respectively.

In addition, a second interlayer insulating film 13 is formed on the second capacitor protection insulating film 12. For example, as the second interlayer insulating film 13, a silicon oxide film is formed by the CVD method using TEOS. An upper surface of the second interlayer insulating film 13 is planarized by the CMP method.

First to third contact holes 14a to 14c are formed in the first and second interlayer insulating films 9, 13, the second capacitor protection insulating film 12, and the cover film 8 on the first to third n-type impurity diffusion regions 7a to 7c respectively. First to third conductive plugs 15a to 15c are formed in the first to third contact holes 14a to 14c respectively. Also, upper electrode contact holes 13a are formed in the second interlayer insulating film 13 and the first and second capacitor protection insulating films 11, 12 on the upper electrodes 10c of the capacitors 10 respectively. Also, an upper electrode contact hole 13b is formed on the upper electrode 10c of the dummy capacitor 10D.

The first to third conductive plugs 15a to 15c have a glue film and a tungsten film respectively. The glue film serving as the underlying layer of the tungsten film has a double-layered structure that consists of a titanium (Ti) film of about 20 nm thickness and a titanium nitride (TiN) film of about 50 nm thickness. In this case, the tungsten film and the glue film on the second interlayer insulating film 13 are removed by the CMP method.

A first metal wiring 16a, which connects the first conductive plug 15a and the upper electrode 10c of the nearest capacitor 10, and a second metal wiring 16c, which connects the third conductive plug 15c and the upper electrode 10c of the nearest capacitor 10, are formed on the second interlayer insulating film 13. Also, an island-like metal pad 16b is formed on the second conductive plug 15b.

The first metal wiring 16a is formed in the region that extends from an upper surface of the first conductive plug 15a to the inside of the upper electrode contact hole 13a. The second metal wiring 16c is formed in the region that extends from an upper surface of the third conductive plug 15c to the inside of another upper electrode contact hole 13a.

Also, an isolated first dummy metal pad 16d that is connected to the upper electrode 10c via the upper electrode contact hole 13b is formed in the second interlayer insulating film 13 over the dummy capacitor 10D. Also, an isolated second dummy metal pad 16e is formed on the first conductive plug 15a or the third conductive plug 15c, which is positioned nearest to the dummy capacitor 10D. As a result, since the dummy capacitor 10D is not connected to the MOS transistors $T_1$, $T_2$, such dummy capacitor 10D never operates as the capacitor.

The first and second metal wirings 16a, 16c, the metal pad 16b, and the first and second dummy metal pads 16d, 16e are formed by patterning a metal film having a quintuple-layered structure consisting of a TiN film of about 150 nm thickness, a Ti film of about 5 nm thickness, an Al—Cu film of about 500 nm thickness, a TiN film of about 50 nm thickness, and a Ti film of about 20 nm thickness, for example, respectively.

A third interlayer insulating film 18 is formed on the first and second metal wirings 16a, 16c, the metal pad 16b, the first and second dummy metal pads 16d, 16e, and the second interlayer insulating film 13. As the third interlayer insulating film 18, an $SiO_2$ film is formed by the CVD method using TEOS, for example. An upper surface of the third interlayer insulating film 18 is made flat by the CMP method.

A bit-line contact hole 18a is formed in the third interlayer insulating film 18 on the metal pad 16b that is connected to the second n-type impurity diffusion region 7b. A fourth conductive plug 19 consisting of a TiN glue film and a tungsten film is buried in the bit-line contact hole 18a.

A bit line 20, which is connected to upper surfaces of the fourth conductive plugs 19 and extends in the direction that intersects orthogonally with the word line WL, is formed on the third interlayer insulating film 18. Accordingly, the bit line 20 is connected electrically to the second n-type impurity diffusion region 7b via the fourth conductive plug 19, the metal pad 16b, and the second conductive plug 15b.

Next, planar structures of the active region 1a, the capacitor 10, the dummy capacitor 10D, the word line WL, and the bit line 20 will be explained with reference to FIG. 3 hereunder.

In FIG. 3, a plurality of stripe-like plate lines (lower electrodes) 10a are formed in almost parallel at an interval on the first interlayer insulating film 9. Also, the plate lines 10a are formed before and after plural active regions 1a that are aligned in the extending direction of the word line WL, and also is connected electrically to a plate line driver 22 to extend in almost parallel with the word line WL. A plurality of upper electrodes 10c are formed over respective plate lines 10a in the length direction of the plate line 10a. In addition, the stripe-like ferroelectric film 10b is formed between the plate line 10a and the overlying upper electrodes 10c.

Lower electrode contact holes 13c are formed in the second interlayer insulating film 13 at end portions of the plate line 10a, which are projected from the ferroelectric film 10b. Then, lower electrode leading wiring (not shown) formed on the second interlayer insulating film 13 is connected to the plate line 10a via the contact hole 13c.

A plurality of word lines WL are passed over the active regions 1a and the element isolation insulating film 2 and are connected electrically to a word line driver 21 respectively.

Also, the bit line 20 on the third interlayer insulating film 18 extends in the direction that intersects orthogonally with the word line WL. This bit line 20 is connected electrically to the second n-type impurity diffusion region 7b in the middle of the active region 1a via the second conductive plug 15b and the metal pad 16b, and also is connected electrically to a sense amplifier 23.

The first to third contact holes 14a to 14c, in which the first to third conductive plugs 15a to 15c are buried respectively, are formed on the n-type impurity diffusion regions 7a to 7c on both sides of two word lines WL in the active region 1a. Also, the upper electrode contact hole 13a is formed on the upper electrode 10c of the capacitor 10 of the memory cell, and also the upper electrode contact hole 13b is formed on the upper electrode 10c of the dummy capacitor 10D.

As the dummy capacitor 10D, the capacitor that is present at four corners of the square memory cell region, in which plural capacitors are aligned vertically and horizontally, respectively is applied. The contact hole 13b is formed on the upper electrode 10c of the dummy capacitor 10D, like other capacitors 10. However, only the electrically-isolated dummy metal pad 16d is connected to the upper electrode 10c of the dummy capacitor 10D via the contact hole 13b. As a result, the dummy capacitor 10D is isolated from the MOS transistors T1, T2 and does not store the information. The capacitors 10 for storing the information are arranged vertically and horizontally (in a matrix fashion) in the range except four corners of the memory cell region.

The reason why the dummy capacitors 10D are arranged selectively at four corners of the memory cell region and the actual operating capacitors are arranged in other outermost peripheral portions will be given as follows.

Figure 4:
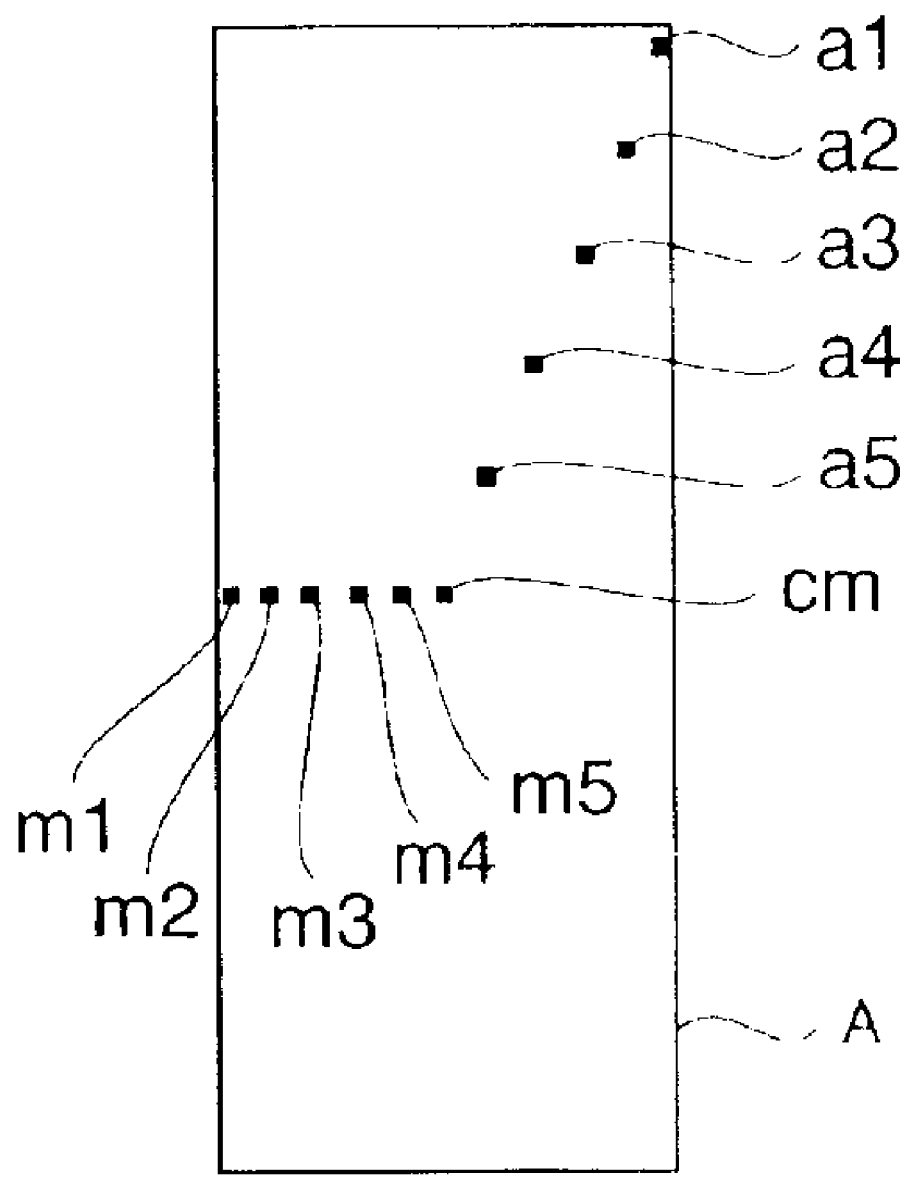
FIG. 4 is a plan view showing a range of the memory cell region of the semiconductor device according to the first embodiment of the present invention.
Figure 5:
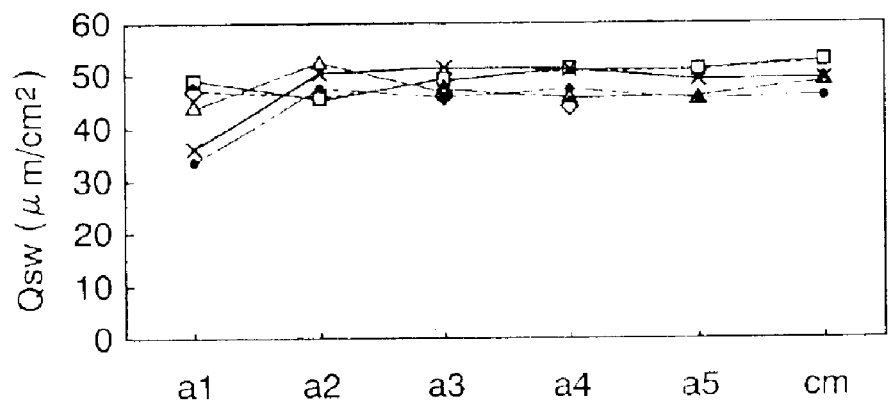
FIG. 5 is a view showing the difference in a quantity of stored charge of plural ferroelectric capacitors that are aligned in a diagonal direction of the memory cell region of the semiconductor device according to the first embodiment of the present invention.
Figure 6:
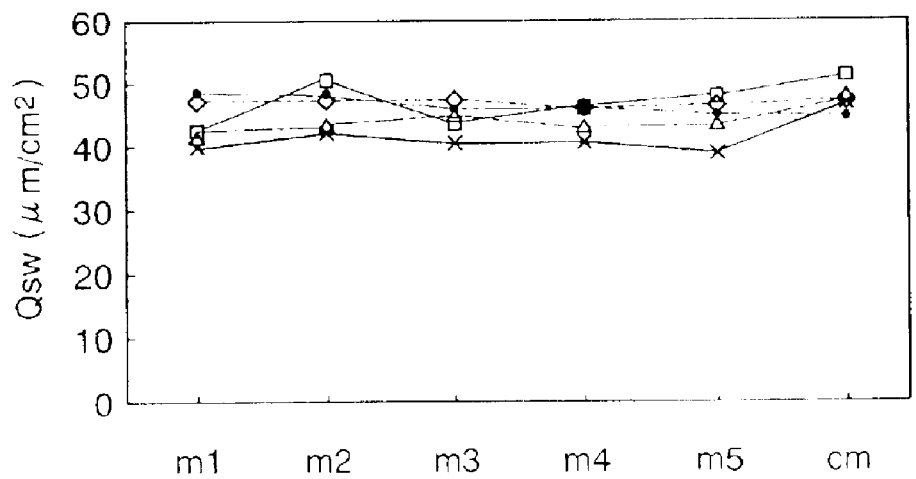
FIG. 6 is a view showing the difference in a quantity of stored charge of plural ferroelectric capacitors that are aligned on a plate line that passes through a center of one side of the memory cell region of the semiconductor device according to the first embodiment of the present invention.

First, when a plurality of ferroelectric capacitors having the above structure were formed vertically and horizontally in the memory cell region A whose planar shape is a quadrangle, as shown in FIG. 4, and then a quantity of stored charge (switching charge) $Q_{SW}$ of the capacitor was measured at predetermined positions respectively, results shown in FIG. 5 and FIG. 6 were obtained.

FIG. 5 shows the difference in a quantity of stored charge $Q_{SW}$ of plural ferroelectric capacitors a1 to a5, cm that are aligned in a diagonal direction from one corner of the memory cell region A. Also, FIG. 6 shows the difference in a quantity of stored charge $Q_{SW}$ of plural ferroelectric capacitors m1 to m5, cm that are aligned on a plate line that passes through a center of one side of the square memory cell region.

As apparent from FIG. 5 and FIG. 6, although the ferroelectric capacitors have the same structure, the ferroelectric capacitors a1 provided at four corners of the memory cell region A are degraded most remarkably. Thus, the capacitors provided at four corners are applied as the dummy capacitor. If the dummy capacitor 10D are not formed, the degradation of the ferroelectric capacitors a2 formed near four corners becomes conspicuous. Therefore, it is preferable that the dummy capacitors should be formed at four corners of the memory cell region A respectively.

Meanwhile, the reason why the electrically-isolated dummy metal pad 16d is connected to the upper electrode 10c of the dummy capacitor 10D will be set forth in the following.

Figure 7:
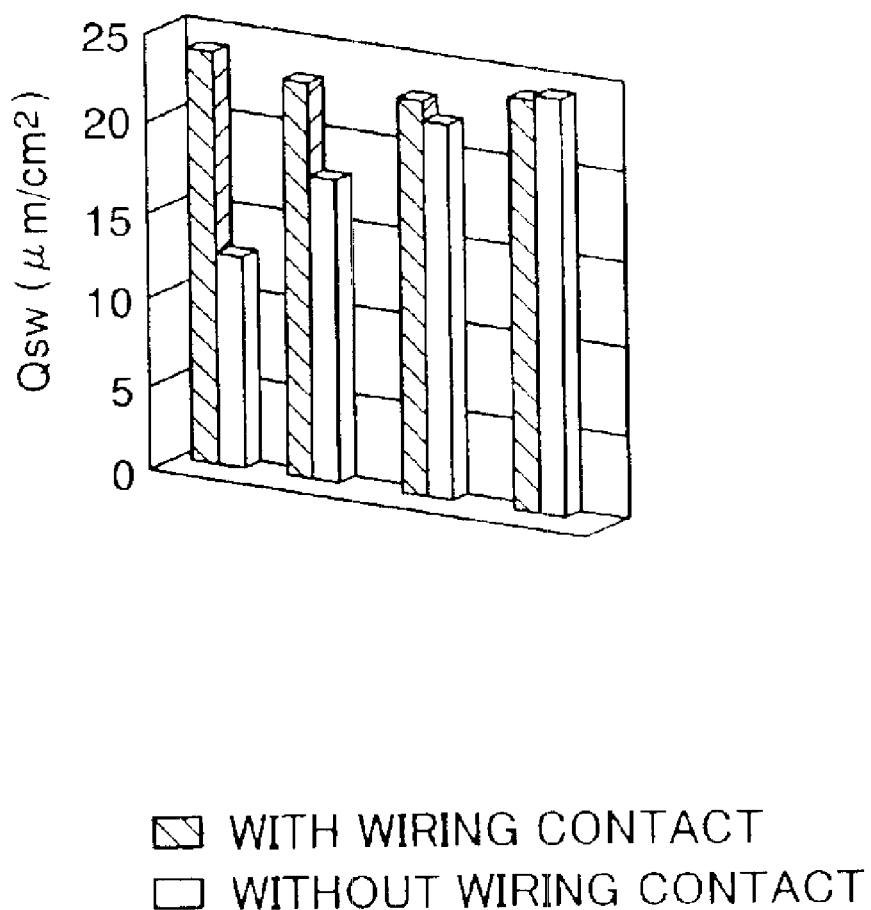
FIG. 7 is a view showing the influence of the presence of the wiring contact of the dummy capacitor employed in the semiconductor device according to the first embodiment of the present invention upon the quantity of stored charge of other capacitor.

When the case where the wiring (dummy metal pad 16d) is connected to the upper electrode 10c of the dummy capacitor 10D via the upper electrode contact hole 13b and the case where such wiring is not connected to the upper electrode 10c are compared with each other, results shown in FIG. 7 were obtained. According to FIG. 7, if the wiring is connected to the upper electrode of the dummy capacitor, a quantity of stored charge $Q_{SW}$ of the ferroelectric capacitor around the wiring is seldom changed according to the position. In contrast, if the wiring is not connected to the upper electrode of the dummy capacitor, a quantity of stored charge $Q_{SW}$ of the actual operating ferroelectric capacitor 10 becomes smaller as the position of the ferroelectric capacitor become closer to the dummy capacitor.

The reason for this may be considered such that, if the upper electrode contact hole 13b is not formed on the dummy capacitor 10D, the density of the etching gas, which is employed to form the upper electrode contact hole 13a on the actual operating ferroelectric capacitor 10, is increased near the dummy capacitor 10D to cause the actual operating ferroelectric capacitor 10 to deteriorate.

With the above, if the ferroelectric capacitors at four corners of the memory cell region are used as the dummy capacitors and the isolated metal patterns are connected to the dummy capacitors, the deterioration of the information-storing ferroelectric capacitor 10 can be prevented. As a result, while improving the yield of the memory cell array and also maintaining the retention characteristic of the actual operating capacitor, the occupied area of the memory cell array can be reduced to the lowest minimum in manufacturing the FeRAM.

(Second Embodiment)

In the first embodiment, out of a plurality of capacitors formed regularly in the memory cell region vertically and horizontally, the capacitors at four corners of the outermost periphery of the memory cell region are applied as the dummy capacitors and the capacitors in other portions of the outermost periphery are applied as the actual operating capacitors.

In the present embodiment, the dummy capacitors are arranged selectively to protrude from four corners on the outermost periphery of the memory cell region, and all capacitors are used as the actual operating capacitors on the outermost periphery and the inner region.

Figure 8:
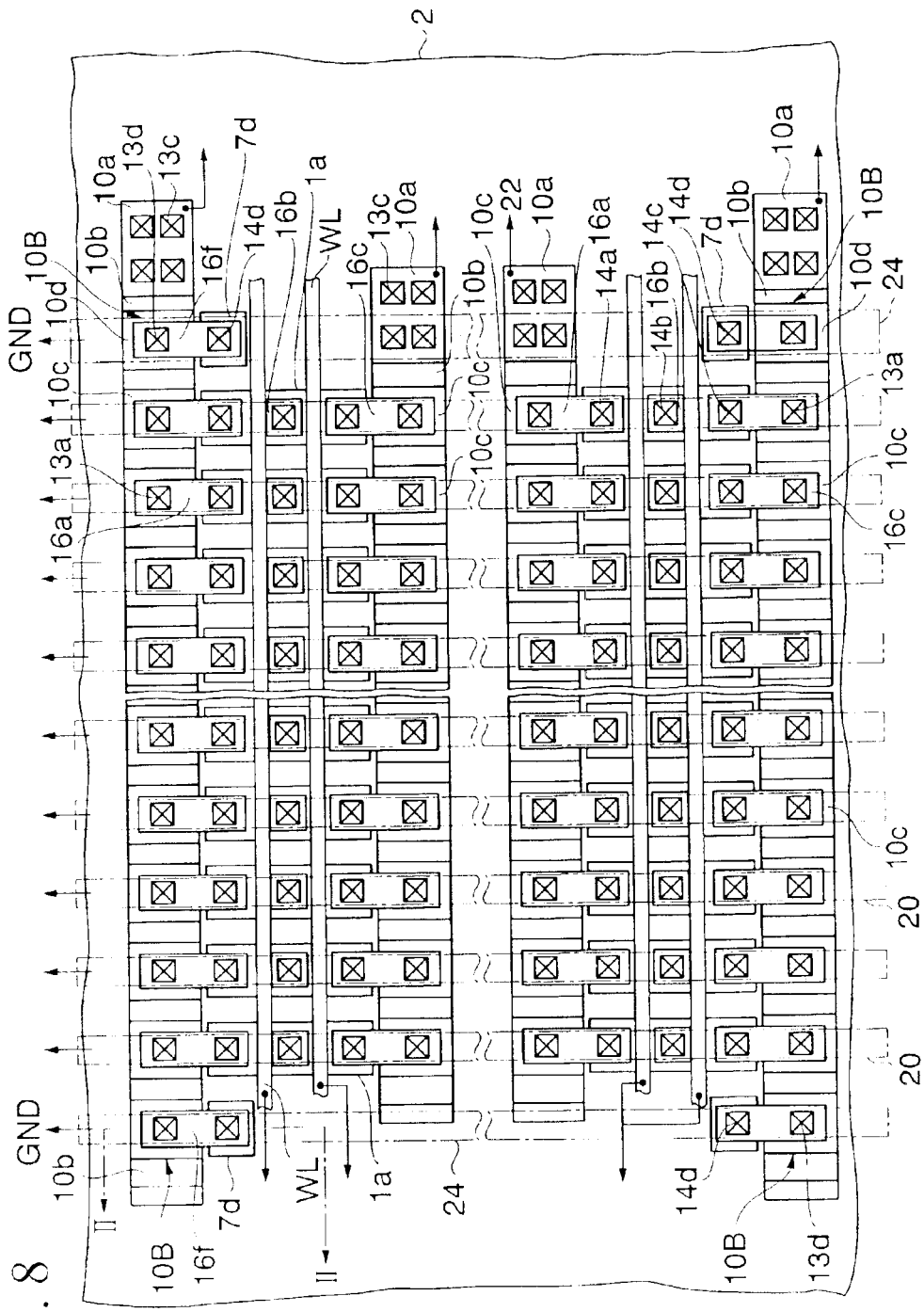
FIG. 8 is a plan view showing a memory cell region of a semiconductor device according to a second embodiment of the present invention.

FIG. 8 is a plan view showing a memory cell region of an FeRAM according to a second embodiment of the present invention. In this case, in FIG. 8, the insulating films formed over the element isolation insulating film are omitted from the illustration.

In FIG. 8, a length of the first and last plate lines of a plurality of plate lines 10a is formed longer than remaining plate lines 10a. Dummy capacitors 10B are formed in the regions extended from ends of the remaining plate lines 10a.

Figure 9:
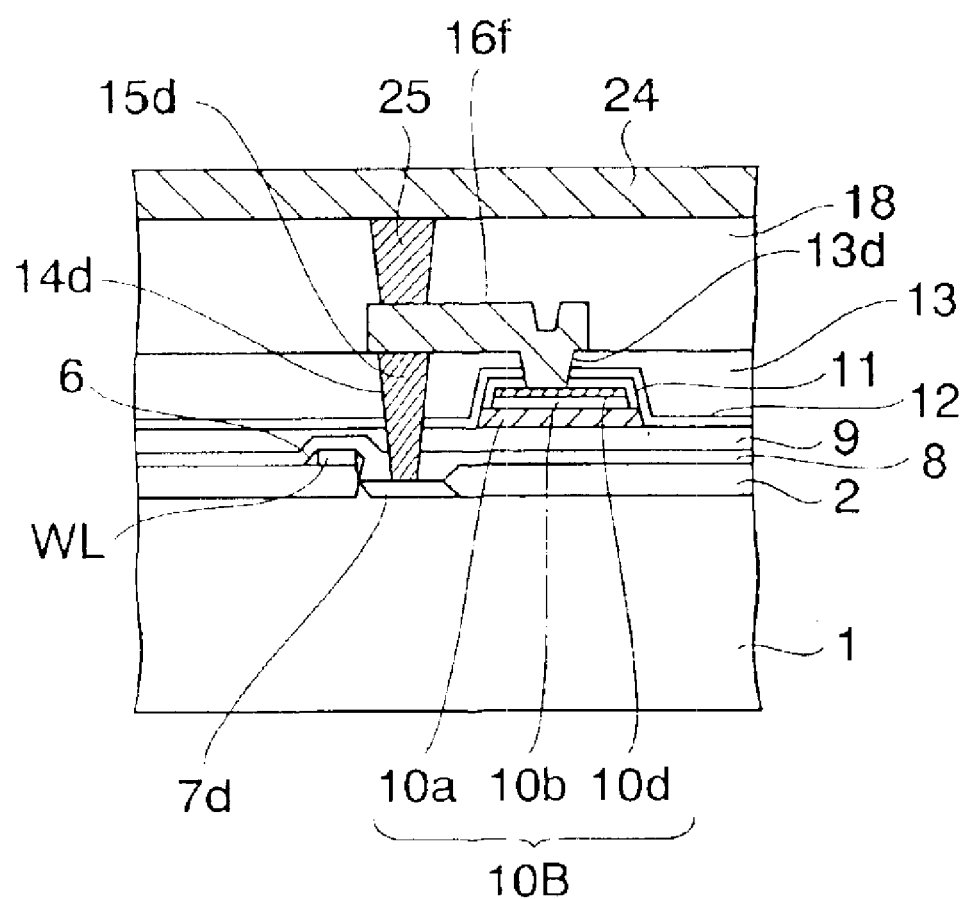
FIG. 9 is a sectional view showing the dummy capacitor employed in the semiconductor device according to the second embodiment of the present invention.

A sectional structure of the dummy capacitor 10B, taken along a II—II line in FIG. 8, is shown in FIG. 9. Also, sectional structures of the capacitors 10 acting as the actual operating cells, the MOS transistors $T_1$, $T_2$, the metal wirings 16a, 16c, etc. are similar to those in the structure shown on the right side in FIG. 2.

In FIG. 8 and FIG. 9, upper electrodes 10d of the dummy capacitors 10B are formed on the extended regions near the contact region of the first and last plate lines 10a via the ferroelectric film 10b. In other words, the dummy capacitor 10B is constructed by the plate line (lower electrode) 10a, the ferroelectric film 10b, and the upper electrode 10d.

Like the first embodiment, the dummy capacitors 10B as well as other capacitors are covered with the capacitor protection insulating films 11, 12, and the second interlayer insulating film 13. Also, a fourth n-type impurity diffusion region 7d is formed on the silicon substrate 1 before or after the dummy capacitor 10B.

Also, a contact hole 14d is formed in the cover film 8, the first interlayer insulating film 9, the capacitor protection insulating films 11, 12, and the second interlayer insulating film 13 on the fourth n-type impurity diffusion region 7d. A fifth conductive plug 15d having the same structure as the first to third conductive plugs 15a to 15c is formed in the contact hole 14d.

A capacitor contact hole 13d is formed in the capacitor protection insulating film 12 and the second interlayer insulating film 13 on the dummy capacitor 10B. Then, a dummy metal wiring 16f is formed on the second interlayer insulating film 13 in the range extended from an upper surface of the fifth conductive plug 15d to an inside of the capacitor contact hole 13d. The dummy metal wiring 16f is formed simultaneously with the first and second metal wirings 16a, 16c.

A ground wiring 24 is formed on the third interlayer insulating film 18 in parallel with the bit line 20. The ground wiring 24 is connected to the dummy metal wiring 16f via a sixth dummy conductive plug 25.

Accordingly, the dummy capacitors 10B do not operate as the memory cell.

As described above, in the present embodiment, the dummy capacitors 10B are formed near the outside of four corners of the memory cell region, in which the actual operating capacitors 10 are formed vertically and horizontally, and also the actual operating capacitors 10 are formed entirely in the memory cell region containing the outermost periphery. Therefore, the deterioration of the actual operating capacitors 10 that are present on the inner side of the region, which is partitioned with lines connecting four dummy capacitors 10B, can be prevented.

In this case, like the first embodiment, the word line WL is connected to the word line driver, the plate line 10a is connected to the plate line driver, and the bit line is connected to the sense amplifier. If not particularly mentioned, these connections are similarly applied in following embodiments.

(Third Embodiment)

Figure 10:
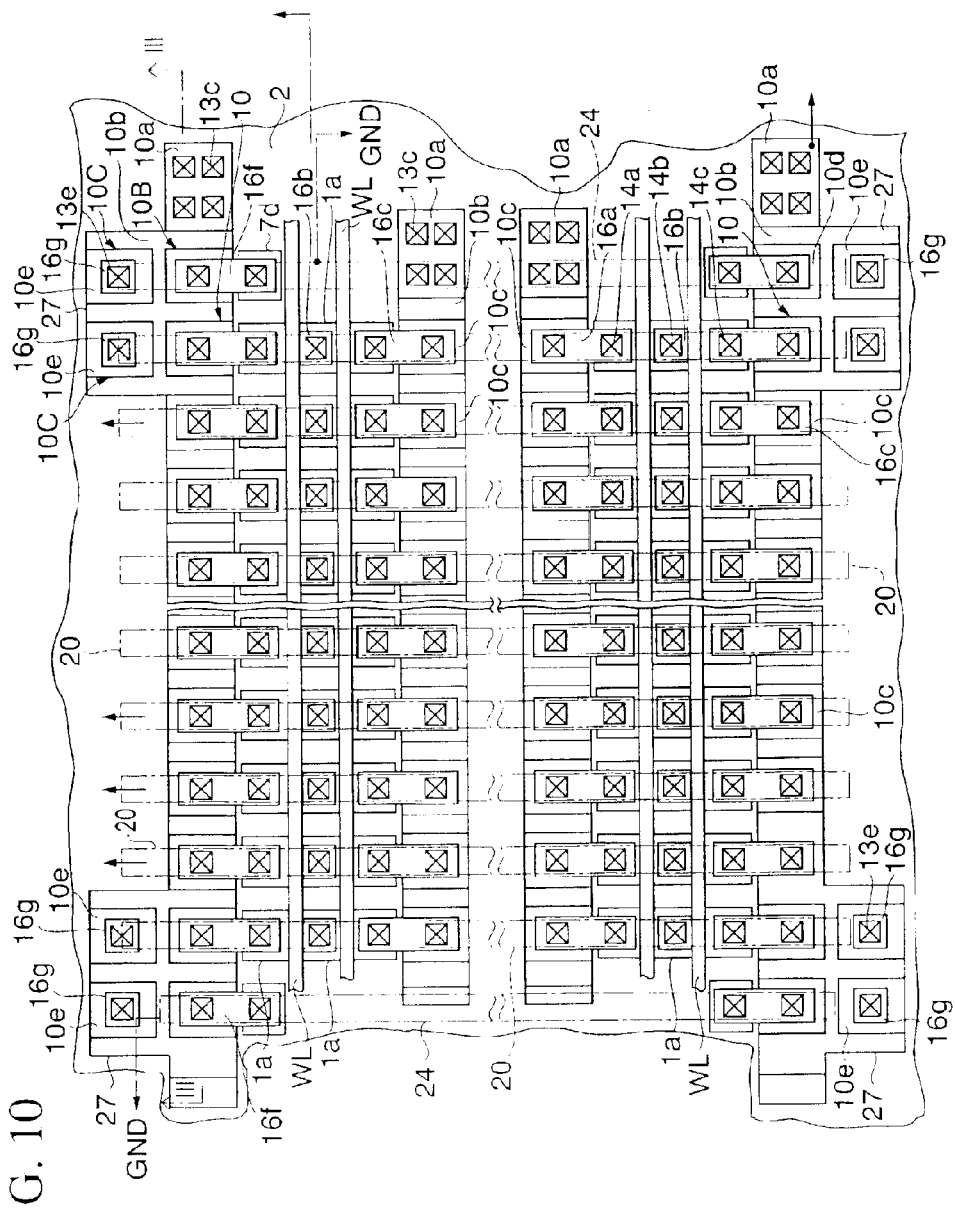
FIG. 10 is a plan view showing a memory cell region of a semiconductor device according to a third embodiment of the present invention.

FIG. 10 is a plan view showing a memory cell region of a semiconductor device according to a third embodiment of the present invention. In FIG. 10, the insulating films formed over the element isolation insulating film are omitted from the illustration.

In FIG. 10, as explained in the second embodiment, both end portions of the first and last plate lines of the plate lines 10a are formed longer than remaining plate lines 10a. Then, the first dummy capacitors 10B formed in the extended regions of the first and last plate lines 10a have the same structure as those in the second embodiment, and are connected electrically to the fourth n-type impurity diffusion region 7d via the metal wiring 16f respectively.

Also, plate extended portions 27 are formed in and near the extended regions of the first and last plate lines 10a on the opposite side to the active region 1a. Then, two second dummy capacitors 10C are formed in the plate extended portion 27. The second dummy capacitor 10C consists of a lower electrode formed of the plate extended portion 27 of the plate line 10a, the ferroelectric film 10b that extends onto the plate extended portion 27, and an upper electrode 10e formed on the ferroelectric film 10b.

According to the above structure, four corners of the memory cell region in which a plurality of capacitors 10 are formed are surrounded by the first and second dummy capacitors 10B, 10C from three sides on the outside respectively. As a result, the deterioration of the characteristics of a plurality of actual operating capacitors 10, that are formed in the memory cell region, can be prevented by the first and second dummy capacitors 10B, 10C.

However, in some cases the deterioration of the quantity of stored change $Q_{SW}$ of the capacitors 10 in the memory cell region cannot be sufficiently prevented even after four corners of the memory cell region are surrounded by the dummy capacitors 10B, 10C from three sides respectively. In other words, a part of the plate lines 10a is exposed in the outermost periphery of the memory cell region A and acts as the catalyst. Therefore, the ferroelectric capacitors formed near the peripheral portion of the memory cell region are more readily deteriorated than those formed in the middle portion by the reducing gas.

Figure 11:
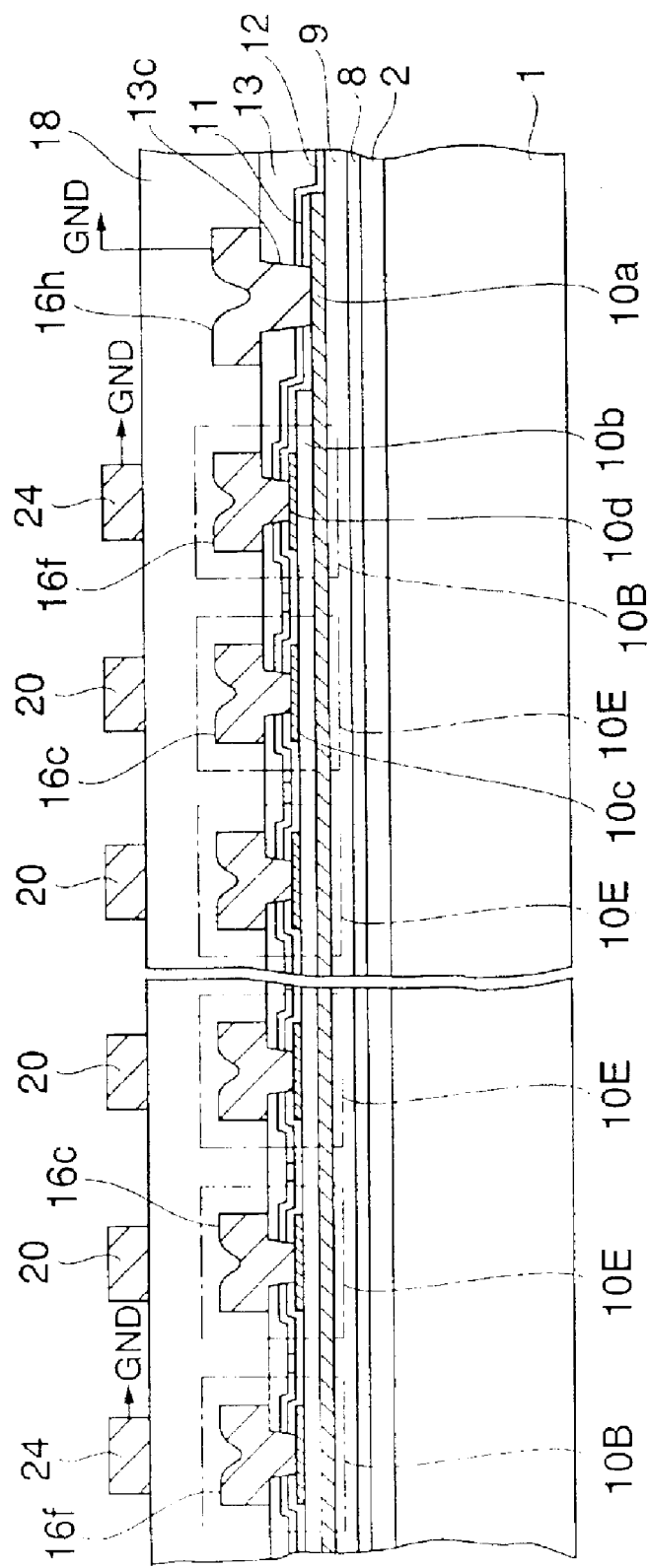
FIG. 11 is a sectional view taken along the plate line in the memory cell region of the semiconductor device according to the third embodiment of the present invention.

In this case, as shown in FIG. 11 which is a sectional view taken along a III—III line in FIG. 10, a plurality of capacitors formed in the first and last plate lines of a plurality of plate lines 10a may be employed entirely as the dummy capacitors 10E, and also a plurality of capacitors connected electrically to the first and last bit lines of a plurality of bit lines 20 may be employed entirely as the dummy capacitors. In such case, the first and last plate lines 10a are not connected to the plate line drivers 22 but connected to a ground wiring 16h via the contact hole 13c, and also the first and last bit lines 20 are not connected to the sense amplifiers 23 but connected to the ground.

Accordingly, the dummy capacitors 10E are aligned like a frame along the outermost periphery of the memory cell region, and also the dummy capacitors 10B, 10E are formed doubly near four-corner regions, in which the actual operating capacitors 10 are especially ready to deteriorate, such that four corners of the frame-like-aligned dummy capacitors 10E are surrounded from three sides on the outside respectively. Therefore, the deterioration of the characteristic of the actual operating capacitors 10 in the memory cell region can be prevented more surely. In other words, there may be employed such a structure that the resistance of the ferroelectric film of the actual operating capacitor against the deterioration can be enhanced by changing the number or area of the dummy capacitor arrangement such that two dummy capacitors are arranged at four corner portions and one dummy capacitor is aligned along the outermost periphery except four corner portions. As a result, the actual operating capacitors can be protected from the surroundings to suppress the deterioration, and also the increase in the area of the dummy capacitor regions can be suppressed to the lowest minimum.

In this case, in the second embodiment, it may also be employed to form the dummy capacitors selectively at four corners of the memory cell region and also to align the dummy capacitors along the outermost periphery on the inner side of the region that is surrounded by the dummy capacitors.

(Fourth Embodiment)

Figure 12:
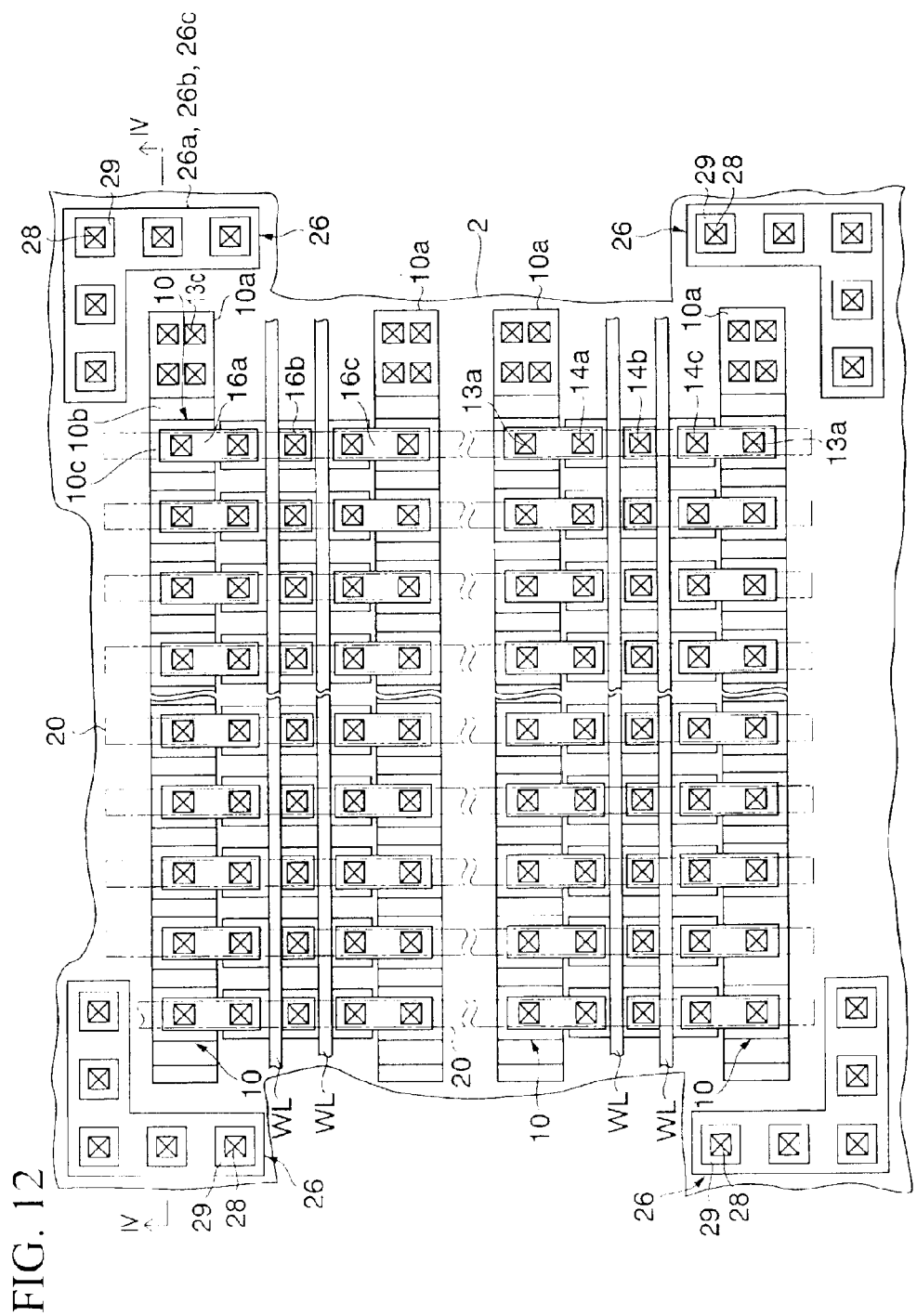
FIG. 12 is a first plan view showing a memory cell region of a semiconductor device according to a fourth embodiment of the present invention.

FIG. 12 is a plan view showing a memory cell region of a semiconductor device according to a fourth embodiment of the present invention. In FIG. 12, the insulating films formed over the element isolation insulating film are omitted from the illustration.

The memory cell region shown in FIG. 12 has a plurality of active regions 1a that are formed vertically and horizontally at an interval on the silicon substrate 1, the word lines WL that pass over the element isolation insulating film 2 and the active regions 1a, the plate lines (lower electrodes) 10a that are formed on the first interlayer insulating film 9 and over the active regions 1a in front of or at the back of the active regions 1a, the upper electrodes 10c that are formed at an interval on the plate lines 10a, and the ferroelectric film 10b that is formed between the plate lines 10a and the upper electrodes 10c. The sectional structure of the active region 1a and its periphery has the same structure as that shown on the right side of FIG. 2.

In this case, unlike the structure shown in the first embodiment, a plurality of upper electrodes 10c formed on all plate lines 10a constitute the actual operating capacitors 10.

In FIG. 12, dummy capacitors 26 having an L-shaped planar shape are formed in the regions that surround four corners of the memory cell region, i.e., the both ends of the first and last plate lines of a plurality of plate lines 10a from three sides on the outside respectively. The dummy capacitor 26 consists of an lower electrode 26a having an L-shaped plane form, an ferroelectric film 26b, and an L-shaped upper electrode 26c having an L-shaped plane form.

The lower electrode 26a of the dummy capacitor 26 has the same layer structure as the plate line 10a. The ferroelectric film 26b is formed of the same material as the ferroelectric film 10b on the plate line 10a. The dummy upper electrode 26c has the same layer structure as the upper electrode on the plate line 10a.

The dummy capacitors 26 are covered with the second interlayer insulating film 13, like the capacitor 10 of the memory cell. Then, in the second interlayer insulating film 13, a plurality of contact holes 28 are formed on the upper electrode 26c, and a dummy metal pad 29 is formed in the contact holes 28 and on their peripheral portions.

The size of the dummy capacitor 26 may be formed equal to or larger than the actual operating capacitor 10. According to this, the size of the contact hole 28 on the dummy upper electrode 26c of the dummy capacitor 26 may be formed equal to or larger than the contact hole 13a on the actual operating capacitor 10.

According to the above structure, four corners of the memory cell region, in which a plurality of actual operating capacitors 10 are formed, are surrounded by a plurality of dummy capacitors 26 from three sides on the outside respectively. Therefore, as shown in the first embodiment, the reduction in a quantity of stored charge $Q_{SW}$ of the capacitors 10 of plural memory cells, which are formed in the memory cell region, can be prevented by the dummy capacitors 26.

Figure 13:
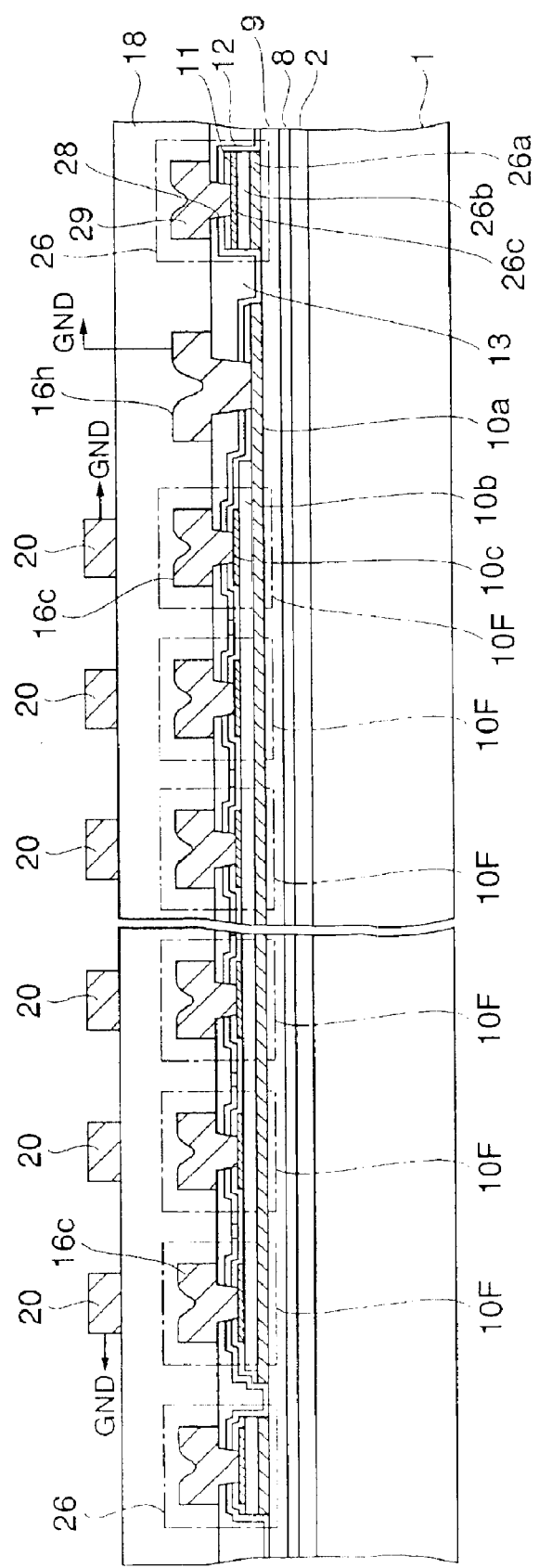
FIG. 13 is a sectional view taken along the plate line in the memory cell region of the semiconductor device according to the fourth embodiment of the present invention.

Meanwhile, sometimes it is impossible to cope sufficiently with the prevention of the characteristic deterioration of the actual operating capacitor 10 only by surrounding locally four corners of the memory cell region by the dummy capacitors 26 from three sides. As the measure for this, as shown in a sectional view in FIG. 13, not only a plurality of capacitors formed on the first and last plate lines of a plurality of plate lines 10a may be employed entirely as the dummy capacitor 10F, but also a plurality of capacitors connected electrically to the first and last bit lines of a plurality bit lines 20 may be employed entirely as the dummy capacitor 10F. In such case, the first and last plate lines 10a are not connected to the plate line driver 22 but connected to the ground wiring 16h via the contact hole 13c, and also the first and last bit lines 20 are not connected to the sense amplifier 23 but connected to the ground. In this case, FIG. 13 is a sectional view taken along a IV—IV line in FIG. 12.

Therefore, a plurality of dummy capacitors 1OF are aligned like a frame on the outermost side of the memory cell region, and also the dummy capacitors 26 are formed to surround the frame-like-aligned dummy capacitors 10F from three sides on the outside. Therefore, the dummy capacitors 10F, 26 are arranged doubly at four corners of the memory cell region. As a result, the deterioration of the memory cell capacitor 10 can be prevented more firmly.

Figure 14:
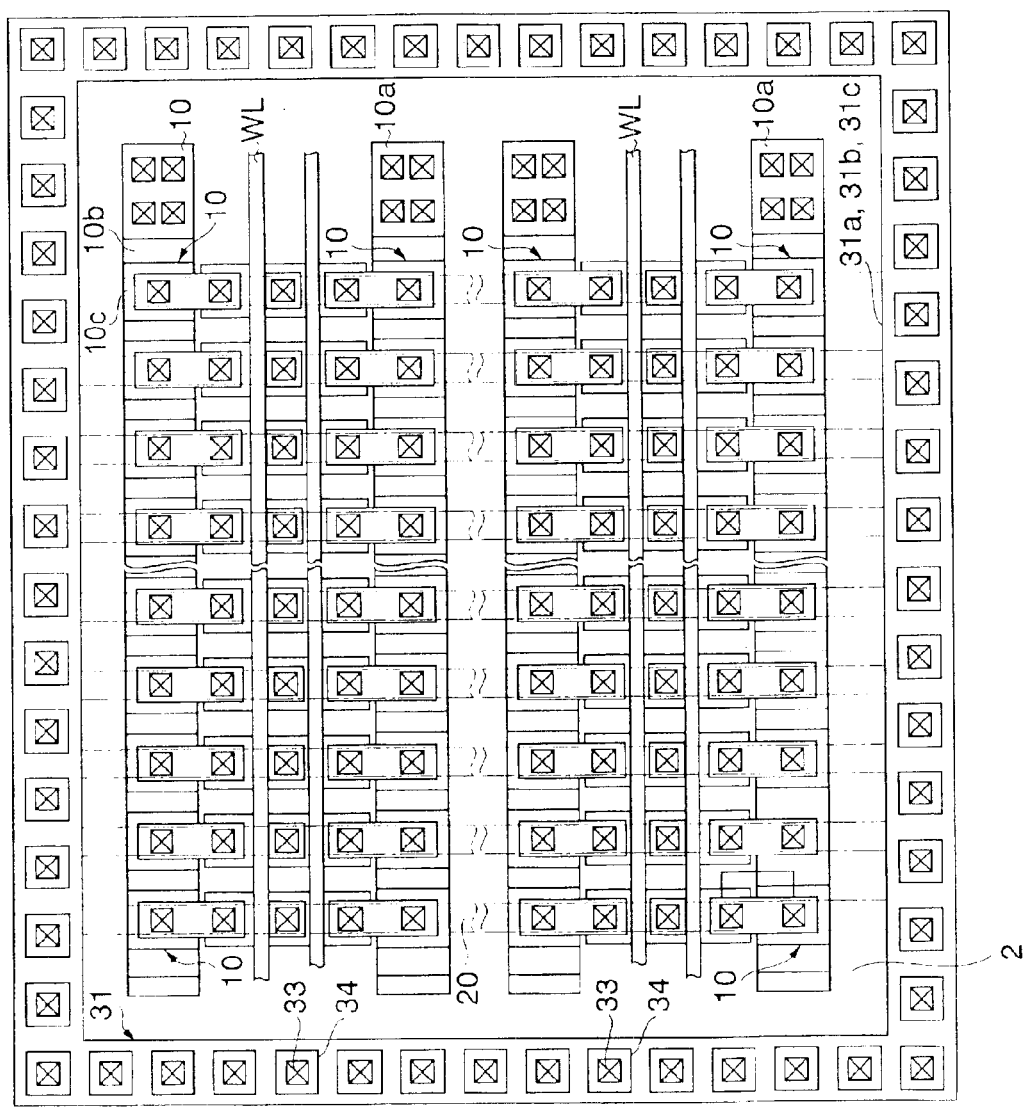
FIG. 14 is a second plan view showing the memory cell region of the semiconductor device according to the fourth embodiment of the present invention.

The dummy capacitors 26 shown in FIG. 12 are formed on the outside of four corners of the memory cell region of about square shape. In this case, as shown in FIG. 14, a plurality of dummy capacitors 31 may be aligned like a frame around the memory cell region. Otherwise, as shown in FIG. 15, a plurality of dummy capacitors 35 may be spread all over the empty region of the memory cell region and on the outside of the memory cell region.

The dummy capacitor 31 shown in FIG. 14 has such a structure that a lower electrode 31a, a ferroelectric film 31b, and an upper electrode 31c, which are formed like the frame respectively, are formed sequentially. Then, a plurality of contact holes 33 are formed in the second interlayer insulating film 13, which is formed on the dummy capacitors 31, on the upper electrodes 31c. A dummy metal pad 34 is formed in the contact holes 33 and their peripheral portions. The dummy capacitor 31 is larger in area than the actual operating capacitor 10, and also the size of the upper electrode 31c can be formed equal to or larger than the actual operating capacitor 10. Similarly to this, the size of the contact hole 33 on the upper electrode 31c of the dummy capacitor 31 can be formed equal to or larger than the contact hole 13a on the actual operating capacitor 10.

In this case, the dummy capacitors 26, 31 are formed successively at an interval from the actual operating capacitors 10. But the sizes of the dummy capacitors can be set freely because such capacitors are not operated.

Figure 15:
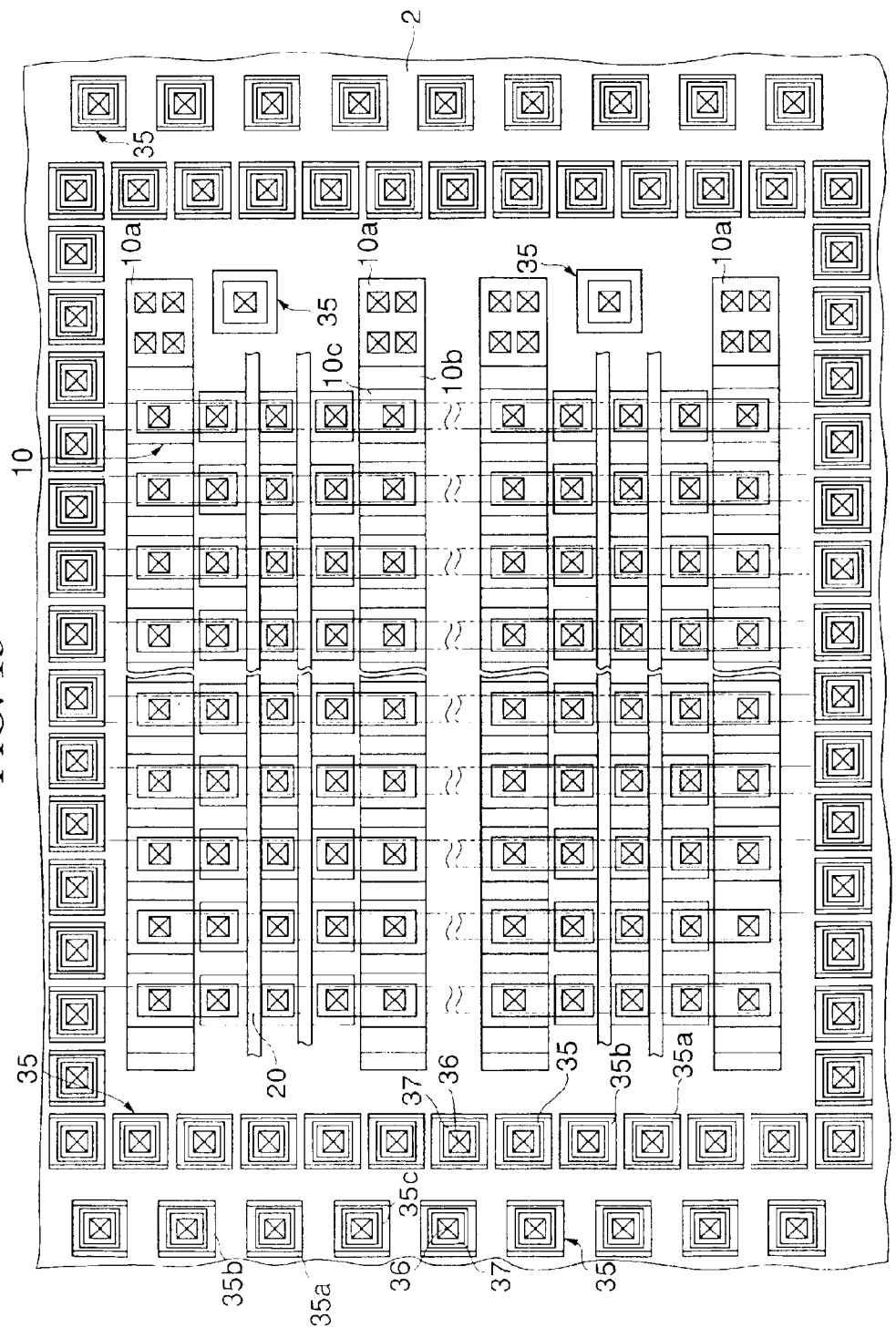
FIG. 15 is a third plan view showing the memory cell region of the semiconductor device according to the fourth embodiment of the present invention.

The dummy capacitors 35 shown in FIG. 15 are composed of a number of lower electrodes 35a, a number of ferroelectric films 35b, and a number of upper electrodes 35c, which are spread all over the peripheral portion of the memory cell region respectively and are formed like the island. Then, contact holes 36 are formed in the second interlayer insulating film 13, which covers the dummy capacitors 35, on the upper electrodes 35c. A dummy metal pad 37 is formed in the contact holes 36 and their peripheral portions.

In FIG. 14 and FIG. 15, not only capacitors formed on the first and last plate lines 10a but also the capacitors connected to the first and last bit lines 20 may be employed totally as the dummy capacitors 10F. A sectional shape along the first plate line 10a in this case is similar to that shown in FIG. 13.

In case the dummy capacitors 26, 31, 35 shown in FIG. 12, FIG. 14, and FIG. 15 are formed to the peripheral circuit region, the short-circuit between the conductive plugs must be prevented by arranging such dummy capacitors in the region that does not overlap with the conductive plugs connected to the CMOS (not shown). Also, in case the dummy capacitors 26, 31, 35 are formed in the peripheral circuit region, such dummy capacitors 26, 31, 35 must be arranged in the region that does not overlap with the first layer wiring. Accordingly, the level difference between the memory cell region and the peripheral circuit region can be reduced by the dummy capacitors and also the volume of the interlayer insulating film on the capacitors can be reduced. Thus, the deterioration of the ferroelectric film of the capacitor in the reducing atmosphere during the film formation can be suppressed.

In the meanwhile, it is effective to reduce the dummy capacitor areas by arranging four dummy capacitors around four corners of the outermost periphery of the memory cell region and two dummy capacitors on the outermost periphery except four corners. In this case, it is effective to employ such a structure that the lower electrode of the actual operating capacitors and the lower electrodes and the ferroelectric films of the dummy capacitors are integrally formed commonly, then the upper electrodes of the actual operating capacitors and the upper electrodes of the dummy capacitors are separated individually, and then the dummy wirings are connected on the upper electrodes of the dummy capacitors. In other words, for the purpose of preventing the deterioration of the characteristic, it is effective to arrange the actual operating capacitors more closely to the dummy capacitors.

(Fifth Embodiment)

In the above embodiments, the FeRAM having the planar capacitors is explained. In the present embodiment, the FeRAM having the stacked capacitors will be explained hereunder.

Figure 16:
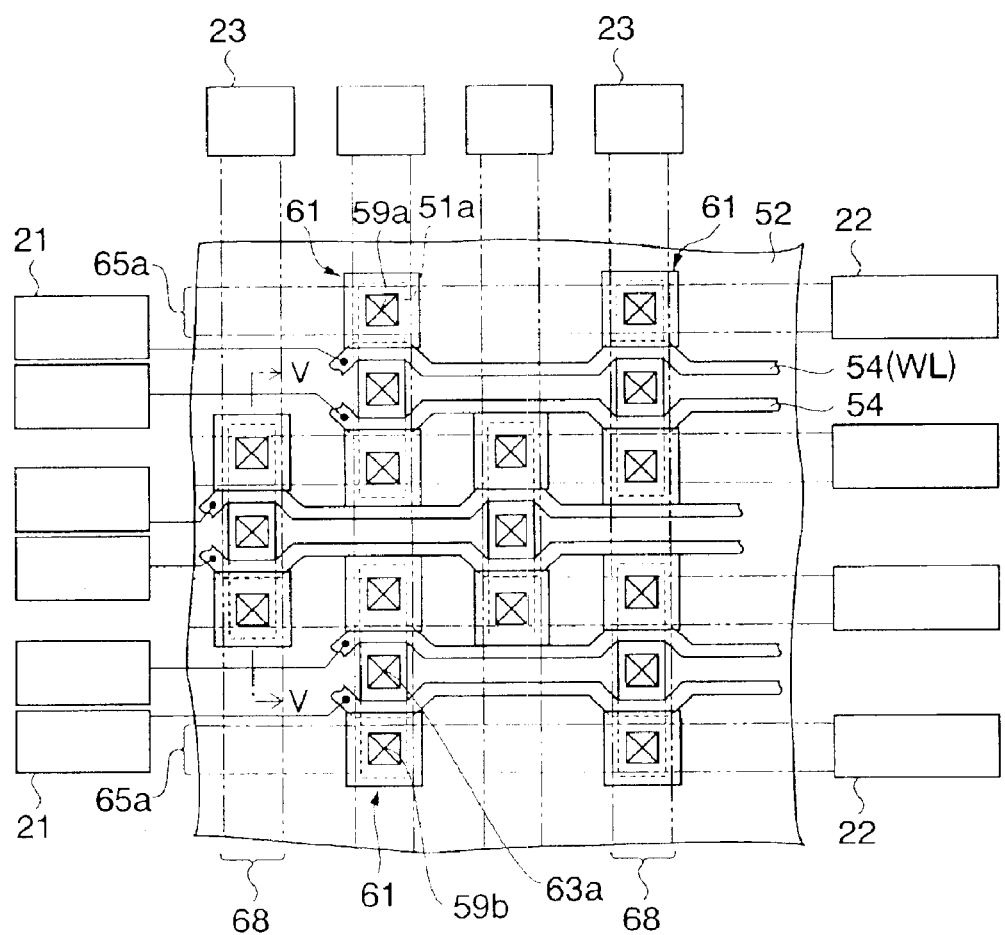
FIG. 16 is a plan view showing memory cells of a semiconductor device according to a fifth embodiment of the present invention.
Figure 17:
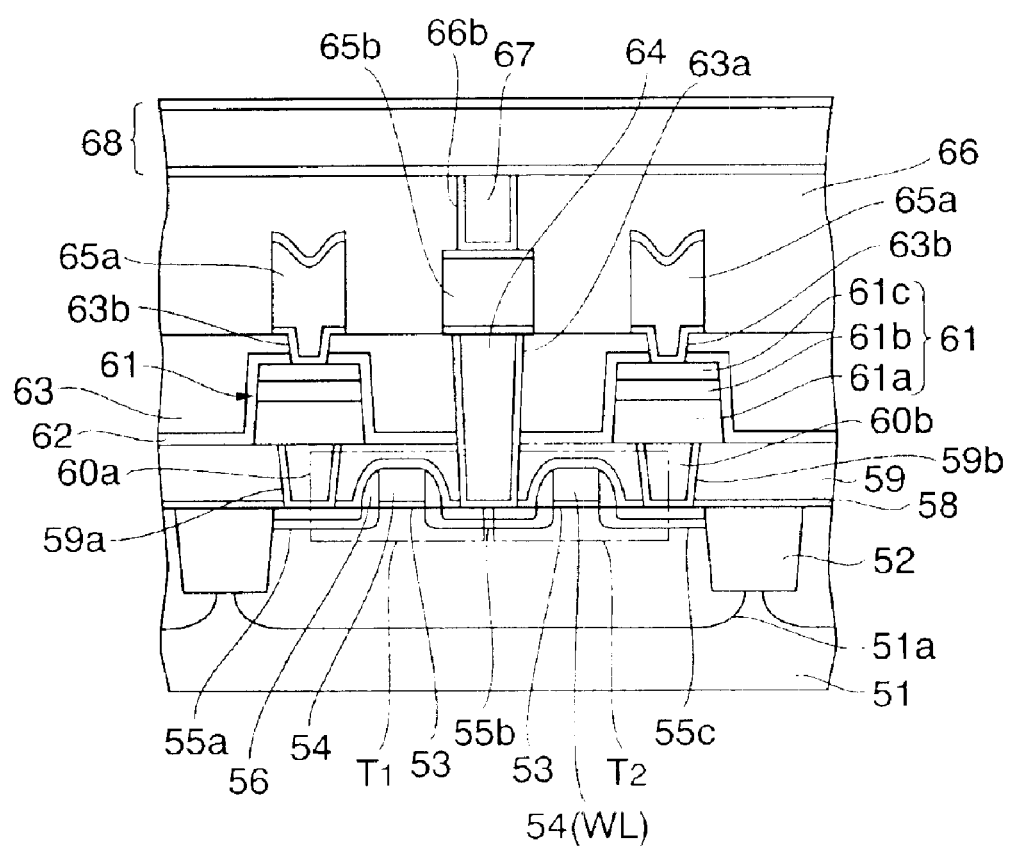
FIG. 17 is a sectional view showing the memory cells of the semiconductor device according to the fifth embodiment of the present invention.
Figure 18:
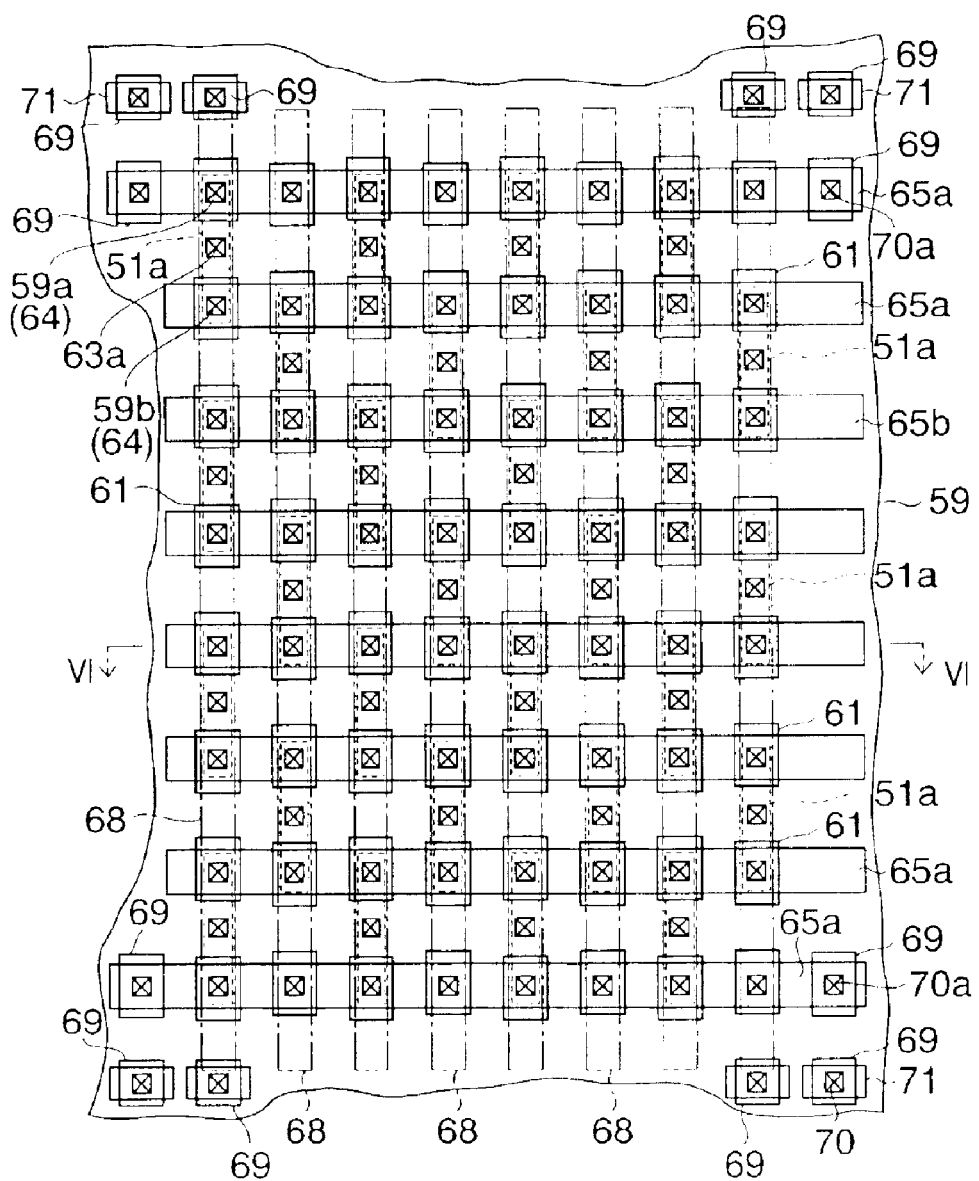
FIG. 18 is a plan view showing an arrangement of conductive patterns and active regions in the memory cell region of the semiconductor device according to the fifth embodiment of the present invention.

FIG. 16 is a plan view showing one active region and its periphery in the memory cell region of a semiconductor device according to a fifth embodiment of the present invention. FIG. 17 is a sectional view showing a part of the memory cell region of the semiconductor device according to the fifth embodiment of the present invention. FIG. 18 is a plan view showing an arrangement of conductive patterns and active regions in the memory cell region of, the semiconductor device according to the fifth embodiment of the present invention. In this case, in FIG. 16, the insulating films formed over the element isolation insulating film are omitted from the illustration.

As shown in FIG. 17, an element isolation insulating film 52 having the STI structure is formed around the active region (transistor forming region) of an n-type or p-type silicon (semiconductor) substrate 51. In this case, the element isolation insulating film 52 is also formed by the LOCOS method. A p-well 51a is formed in the transistor forming region, and a silicon oxide film is formed on a surface of the p-well 51a as a gate insulating film 53.

Two gate electrodes 54 are formed in parallel on one p-well 51a. These gate electrodes 54 constitute a part of the word line WL that passes over the element isolation insulating film 52.

First to third n-type impurity diffusion regions 55a to 55c serving as the source/drain and having the LDD structure are formed in the p-well 51a on both sides of the gate electrodes 54. The second n-type impurity diffusion region 55b formed in one transistor forming region between two gate electrodes 54 is connected electrically to the bit line. The first and third n-type impurity diffusion regions 55a, 55c formed on both sides of the transistor forming region are connected electrically to the lower electrode of the capacitor respectively.

In this case, an insulating sidewall spacer 56 is formed on side walls of the gate electrodes 54.

The gate electrodes 54 and the n-type impurity diffusion regions 55a to 55c having the LDD structure constitute MOS transistors $T_1$, $T_2$.

The MOS transistors $T_1$, $T_2$ are covered with a cover insulating film 58. As the cover insulating film 58, a silicon oxide nitride (SiON) film of about 200 nm thickness, for example, is formed by the plasma CVD method. Also, a silicon oxide ($SiO_2$) film is formed as a first interlayer insulating film 59 on the cover insulating film 58 by the plasma CVD method using the TEOS gas. In addition, an upper surface of the first interlayer insulating film 59 is planarized by the CMP method.

First and second contact holes 59a, 59b are formed in the cover insulating film 58 and the first interlayer insulating film 59 on the first and third n-type impurity diffusion regions 55a, 55c respectively. First and second conductive plugs 60a, 60b are formed on inner surfaces of the first and second contact holes 59a, 59b respectively. The first and second conductive plugs 60a, 60b have a structure, in which a titanium (Ti) film, a titanium nitride (TiN) film, and a tungsten (W) film, for example, are formed sequentially, respectively. The Ti film, the TiN film, and the W film are removed from the upper surface of the first interlayer insulating film 58 by the CMP method.

Stacked capacitors 61 that are connected to the first conductive plug 60a and the second conductive plug 60b respectively are formed on the first interlayer insulating film 59. The capacitor 61 is constructed by a lower electrode 61a, a ferroelectric film 61b, and an upper electrode 61c, which are formed sequentially on the first interlayer insulating film 59.

The lower electrode 61a is constructed by a multi-layered structure that consists of an iridium (Ir) film, an iridium oxide ($IrO_x$) film, and a platinum (Pt) film, for example. Also, the ferroelectric film 61b is formed of the PZT material, the Bi layered-structured compound material, or the like, like the first embodiment. In addition, the upper electrode 61c is formed of the $IrO_x$ film.

In this case, the ferroelectric film 61b is crystallized immediately after the growth by the annealing in the oxygen atmosphere. Also, after the etching to form the capacitors 61, the annealing is carried out to make the ferroelectric film, which is subjected to the damage, recover into the original state.

The capacitors 61 are covered with a insulating capacitor protection film 62 made of alumina, PZT, or the like. Also, a second interlayer insulating film 63, a surface of which is planarized by the CMP method, is formed on the capacitor protection film 62.

A third contact hole 63a is formed in the second interlayer insulating film 63 and the capacitor protection film 62 on the second n-type impurity diffusion region 55b, and then a third conductive plug 64 is formed in the third contact hole 63a. This third conductive plug 64 has a triple-layered structure consisting of a Ti film, a TiN film, and a W film.

Contact holes 63b are formed in the second interlayer insulating film 63 and the capacitor protection film 62 on the upper electrodes 61c of the capacitors 61. Then, the upper electrodes 61c are connected to plate wirings 65a, which are formed on the second interlayer insulating film 63, via the contact holes 63b. The plate wirings 65a extend in the same direction as the word lines (gate electrode) WL. Also, a conductive pad 65b having the same layer-structure as the plate wiring 65a is formed on the third conductive plug 64.

A third interlayer insulating film 66 is formed on the plate wirings 65a, the conductive pad 65b, and the second interlayer insulating film 63. In this case, as the second and third interlayer insulating films 63, 66, an $SiO_2$ film is formed by the CVD method using TEOS, for example.

A fourth contact hole 66a in which a fourth conductive plug 67 is buried is formed in the third interlayer insulating film 66 on the conductive pad 65b. The fourth conductive plug 67 is constructed by a double-layered structure consisting of a Ti film and a W film. In addition, the fourth conductive plug 67 is connected to a bit line 68, which extends in the direction that intersects orthogonally with the plate wirings 65a, on the third interlayer insulating film 66. In this case, the plate wiring 65a and the bit line 68 have a multi-layered metal structure in which a Ti film of 60 nm thickness, a TiN film of 30 nm thickness, an Al—Cu film of 400 nm thickness, a Ti film of 5 nm thickness, and a TiN film of 70 nm thickness, for example, are formed sequentially respectively.

A planar structure of a part of the memory cell of the semiconductor device is shown in FIG. 16, wherein the MOS transistors $T_1$, $T_2$ and the capacitor 61 are formed in plural regularly at an interval in the memory cell region. In this case, in FIG. 16, various insulating films over the element isolation insulating film 52 are omitted from the illustration.

The word lines WL in the memory cell region are connected electrically to a word line driver 21 respectively, the plate wirings 65a are connected electrically to a plate line driver 22 respectively, and the bit lines 68 are connected electrically to a sense amplifier 23 respectively.

Also, an arrangement of the capacitors 61, the contact holes 59a, 59b, 63a, the plate wirings 65a, and the bit lines 68 in the memory cell region is given as shown in FIG. 18. Then, one or plural dummy capacitors 69, which are not connected to the MOS transistors $T_1$, $T_2$ and are electrically isolated, are formed on the outside of four corners of the memory cell region. In this case, in FIG. 18, three dummy capacitors 69 are formed on the outside of four corners of the memory cell region respectively. The dummy capacitor 69 has the same structure as the capacitor 61 of the memory cell. A dummy metal pad 71 is connected to the upper portion of the dummy capacitor 69 via a contact hole 70. The dummy metal pad 71 is formed on the second interlayer insulating film 63, and has the same layer structure as the plate wiring 65a.

In FIG. 18, the dummy capacitors 69 connected to the plate wirings 65a via contact holes 70a are also formed. The n-type impurity diffusion region (not shown) is formed in the silicon substrate 51 under the dummy capacitor 69. And the n-type impurity diffusion region is connected with a lower electrode (not shown) via a conductive plug (not shown) electrically. The dummy capacitor 69 is not connected to the MOS transistor $T_1$ or $T_2$. Accordingly, the information is not stored in the dummy capacitor 69 under the plate wiring 65a.

Figure 19:
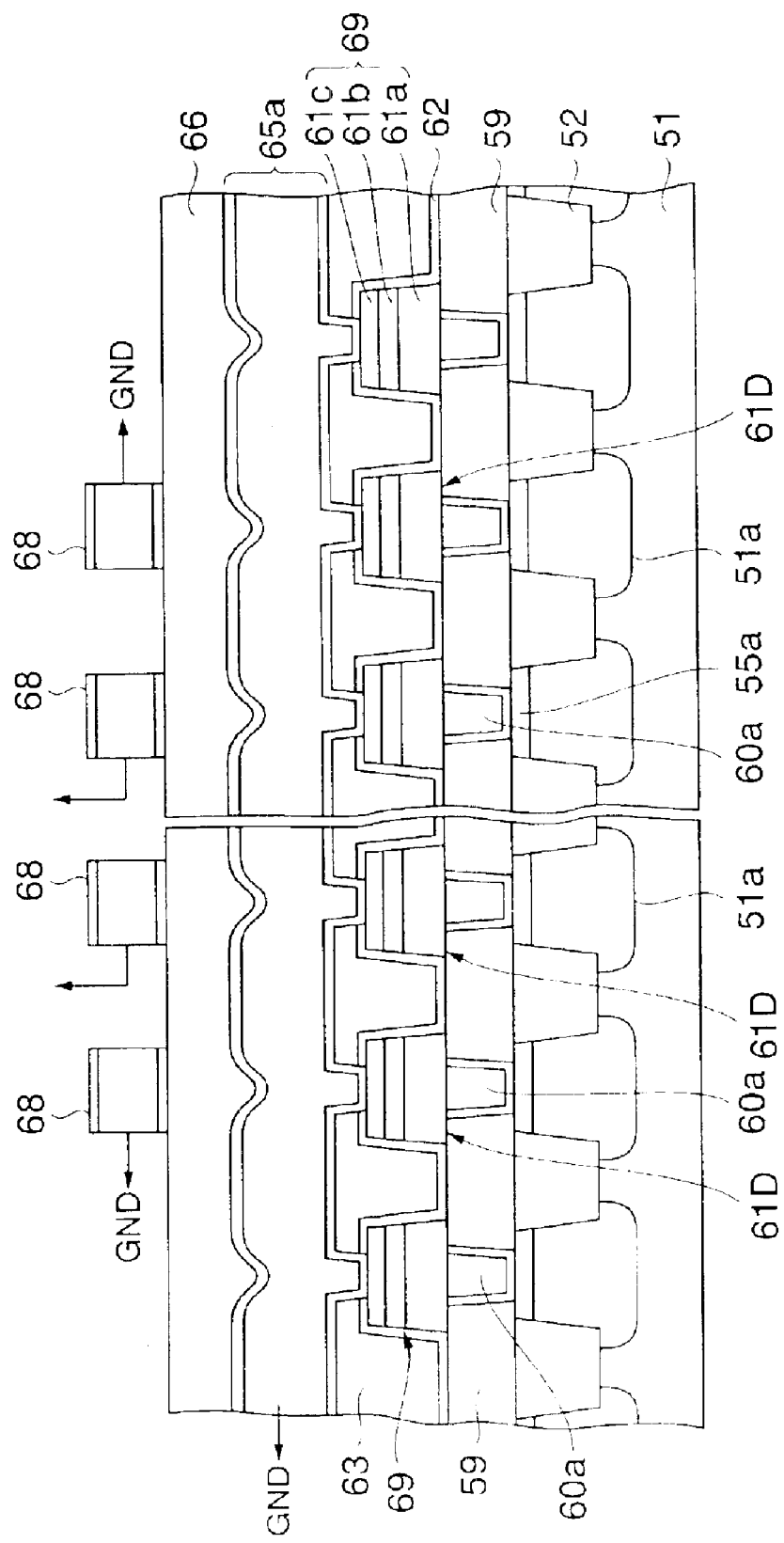
FIG. 19 is a sectional view taken along the plate line in the memory cell region of the semiconductor device according to the fifth embodiment of the present invention.

In the memory cell region having the stacked capacitors 61, as shown in a sectional shape in FIG. 19, if the first and last plate wirings and bit lines out of a plurality of plate wirings 65a and a plurality of bit lines 68 are connected to the ground respectively, the capacitors positioned in the memory cell region on the outermost periphery may be employed as dummy capacitors 61D.

Accordingly, since the stacked capacitors 61 constituting the memory cells in the memory cell region are surrounded by the dummy capacitors 61D, 69 to protect, the reduction in the quantity of stored charge is difficult to occur, like the first embodiment. In particular, the characteristic of the capacitors 61 near four corners of the memory cell region can be improved.

In this case, like the first to fourth embodiments, the stacked dummy capacitors 69 may be arranged like the frame, or like the L-shape, or arranged to spread all over as the isolated patterns.

In the above the first to fifth embodiments, the dummy capacitors out of a plurality of capacitors formed in the memory cell region are formed selectively at four corners of the memory cell region respectively. Also, when viewed from the center of the memory cell region to the outside, the dummy capacitors are formed largely in number or widely at four corners of the memory cell region or their neighborhoods rather than the outermost periphery or its periphery. Otherwise, the dummy capacitors formed along the outermost periphery of the memory cell region are arranged more largely in number or more widely in area or at a higher density at four corners than those formed in the outermost periphery except four corners. Otherwise, the dummy capacitors are provided to the positions that surround the memory cell region from the outside. In the above embodiments, the fixed potential is used instead of the ground voltage.

(Sixth Embodiment)

In the above first to fifth embodiments, the dummy capacitors are formed at least one of the inside and the outside of four corners of the memory cell region, otherwise either the number of the dummy capacitors is increased or the areas of the dummy capacitors are expanded from the dummy capacitors toward the outside of the memory cell region. Thus, the characteristics of the capacitors for the actual operation are stabilized.

In contrast, in a sixth embodiment to a tenth embodiment, stabilization of the characteristics of a plurality of capacitors for the actual operation in the memory cell region without use of the dummy capacitors will be explained hereunder.

FIGS. 20A and 20B and FIGS. 21A and 21B are sectional views showing steps of manufacturing a semiconductor device according to a sixth embodiment of the present invention. FIG. 22 is a plan view showing capacitors in the memory cell region of the semiconductor device according to the sixth embodiment of the present invention. FIGS. 20A and 20B and FIGS. 21A and 21B are sectional views that are viewed along a VII—VII line in FIG. 22. In this case, in FIGS. 20A and 20B, FIGS. 21A and 21B, and FIG. 22, the same symbols as those in the first to fifth embodiments denote the same elements.

Figure 20A:
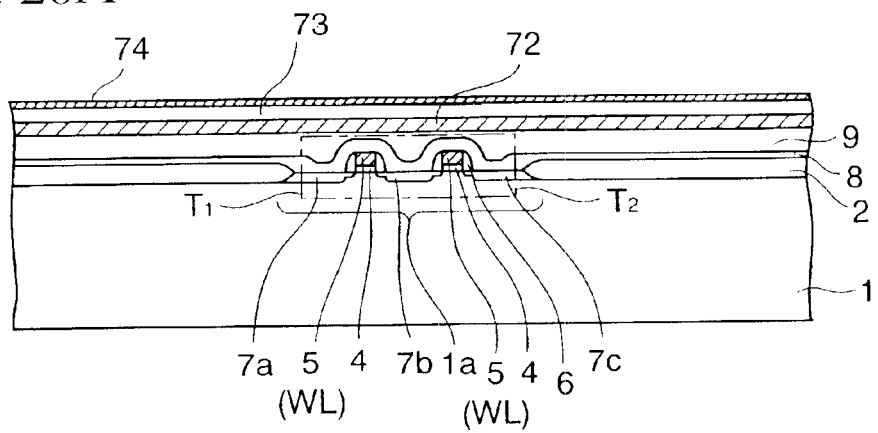
FIGS. 20A and 20B and FIGS. 21A and 21B are sectional views showing steps of manufacturing a semiconductor device according to a sixth embodiment of the present invention.

First, steps required until a structure shown in FIG. 20A is formed will be explained hereunder.

As explained in the first embodiment, the element isolation insulating film 2 is formed on the surface layer of the silicon substrate 1 by the LOCOS method. The element isolation insulating film 2 is formed at the position that surrounds a plurality of active regions 1a being arranged vertically and horizontally on the surface of the silicon substrate 1. The active regions 1a are formed between a plurality of plate line forming regions, and plural active regions 1a are arranged at an interval along respective plate line forming regions.

Then, the gate insulating films 4 are formed by oxidizing the surfaces of the active regions 1a on the silicon substrate 1.

Then, the amorphous silicon or polysilicon film is formed on the element isolation insulating film 2 and the gate insulating films 4, and then the tungsten silicide film is formed on the silicon film. Then, the gate electrodes 5 are formed over the active regions 1a by patterning the silicon film and the tungsten silicide film. Two gate electrodes 5 are formed on the active region 1a in almost parallel at an interval. The gate electrode 5 constitutes a part of the word line WL that pass over the element isolation insulating film 2.

Then, the n-type impurity is ion-implanted into the active regions 1a on both sides of the gate electrodes 5. Thus, the first to third n-type impurity diffusion regions 7a, 7b, 7c serving as the source/drain of the n-type MOS transistors $T_1$, $T_2$ are formed. The first to third n-type impurity diffusion regions 7a to 7c are aligned in the direction that intersects with the word line WL, i.e., the longitudinal direction. The second n-type impurity diffusion region 7b that is positioned in the middle of the active region 1a is connected electrically to the bit line, while the first and third n-type impurity diffusion regions 7a, 7c that are positioned on both sides of the active region 1a are connected electrically to the upper electrodes of the capacitors described later.

Then, the insulating film is formed on the silicon substrate 1, the element isolation insulating film 2, and the gate electrodes 5. Then, the sidewall insulating films 6 are left by etching back the insulating film.

Then, the n-type impurity is ion-implanted again into the active regions 1a while using the gate electrodes 5 and the sidewall insulating films 6 as a mask. Thus, the first to third n-type impurity diffusion regions 7a to 7c are formed as the LDD structure.

Accordingly, the first nMOS transistor $T_1$ having the first and second n-type impurity diffusion regions 7a, 7b and one gate electrode 5 and the second nMOS transistor $T_2$ having the second and third n-type impurity diffusion regions 7b, 7c and the other gate electrode 5 are formed.

Then, the insulating cover film 8 for covering the nMOS transistors $T_1$, $T_2$ is formed on the silicon substrate 1 by the CVD method. The silicon oxide nitride (SiON) film, for example, is formed as the cover film 8.

Then, the silicon oxide film of about 1.0 μm thickness is formed on the cover film 8 by the CVD method using TEOS. This silicon oxide film is used as the first interlayer insulating film 9.

Then, as the densifying process of the first interlayer insulating film 9, such first interlayer insulating film 9 is annealed at the temperature of about 700° C. for 30 minute in the atmospheric-pressure nitrogen atmosphere. Then, an upper surface of the first interlayer insulating film 9 is planarized by the CMP method.

Then, a titanium (Ti) film of 10 to 30 nm thickness and a platinum (Pt) film of 100 to 300 nm thickness are formed sequentially as a first conductive film 72 on the first interlayer insulating film 9 by the sputter method.

Then, a PZT film of 100 to 300 nm thickness is formed as a ferroelectric film 73 on the first conductive film 72 by the RF sputter method. As the method of forming the ferroelectric film 73, there are the MOD (Metal Organic Deposition) method, the MOCVD (Metal Organic CVD) method, the sol-gel method, etc. in addition to the above. Also, as the material of the ferroelectric film 73, the PZT material, the Bi-layered structure compound, or other metal oxide ferroelectric substance shown in the first embodiment may be employed in addition to PZT.

Then, as the crystallizing process of the PZT film constituting the ferroelectric film 73, RTA (Rapid Thermal Annealing) is executed at the temperature of 650 to 850° C. for 30 to 120 second in the oxygen atmosphere.

Then, an iridium oxide ($IrO_2$) film of 100 to 300 nm thickness is formed as a second conductive film 74 on the ferroelectric film 73 by the sputter method.

Figure 20B:
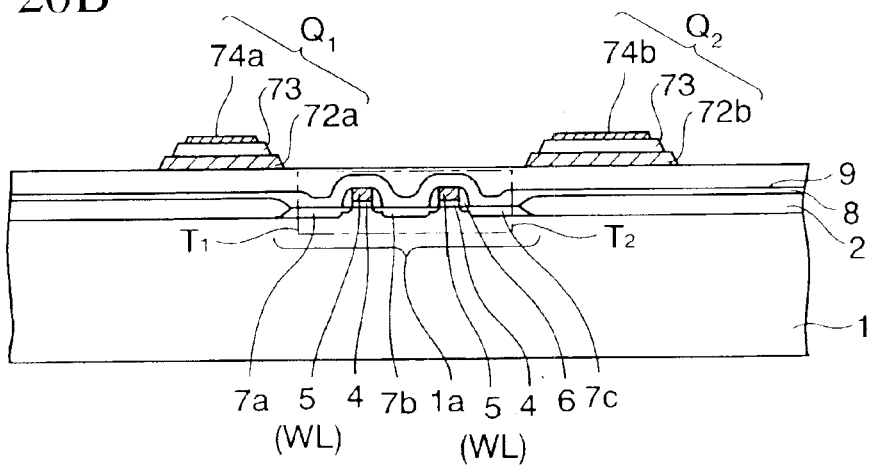

Then, as shown in FIG. 20B, a plurality of first upper electrodes 74a and a plurality of second upper electrodes 74b, both being made of the second conductive film 74, are formed in each plate line forming region by patterning the second conductive film 74. An area of a planar shape of the second upper electrode 74b is larger than an area of a planar shape of the first upper electrode 74a. In this case, the first upper electrode 74a has the planar shape of 1.7 μm×1.0 μm, and the second upper electrode 74b has the planar shape of 2.1 μm×1.0 μm.

One of the first upper electrode 74a and the second upper electrode 74b is arranged in front of and at the back of each active region 1a over the element isolation insulating film 2. That is, the first n-type impurity diffusion region 7a is positioned next to one of the first upper electrode 74a and the second upper electrode 74b, and the third n-type impurity diffusion region 7c is positioned next to one of the second upper electrode 74b and the first upper electrode 74a.

Then, the ferroelectric film 73 is left in the plate line forming region by the patterning. Then, in order to recover the film quality of the ferroelectric film 73 that is damaged by the etching, the ferroelectric film 73 is annealed in the oxygen atmosphere.

Then, a first plate line 72a and a second plate line 72b, which are made of the first conductive film 72, are formed by patterning the first conductive film 72. The first plate line 72a and the second plate line 72b function as the lower electrode of the capacitor respectively.

As shown in FIG. 22, the first plate line 72a and the second plate line 72b are formed like a stripe over the element isolation insulating films 2, which are positioned in front of and at the back of each active region 1a, to extend in the same direction as the word line WL. Like the above embodiments, the first plate line 72a and the second plate line 72b are connected to the plate line driver provided in the peripheral circuit area. Also, the word line WL is connected to the word line driver provided in the peripheral circuit area.

The first plate line 72a corresponds to plate lines out of a plurality of plate lines except the first and last plate lines. The first plate line 72a has a almost H-shaped planar shape in which its width in the direction that intersects perpendicularly to the word line WL is expanded locally at both end portions. The width at both end portions is about 2.1 μm that is almost similar to the second upper electrode 74b, and the width on the inner side than the end portion is about 1.7 μm that is almost similar to the first upper electrode 74*a*. Also, the second upper electrode 74*b* is formed on both end portions of the first plate line 72*a* via the ferroelectric film 73 respectively. Also, a plurality of first upper electrodes 74*a* are aligned at an interval on the ferroelectric film 73 in the area of the first plate line 72*a*, which is located between the second upper electrodes 74*b*, in the extending direction of the plate line.

The second plate line 72*b* corresponds to the first and last plate lines out of a plurality of plate lines that are formed at an interval in the memory cell region. A width of the second plate line 72*b* in the direction that intersects orthogonally with the word line WL is 2.1 μm, and the second plate line 72*b* has the almost same width over the entire length. Also, a plurality of second upper electrodes 74*b* each having the almost same width as the second plate line 72*b* are aligned at an interval on the ferroelectric film 73, which is formed on the second plate line 72*b*, in the extending direction of the plate line.

In this case, in FIG. 22, four first plate lines 72*a* are exemplified at an interval, but the number that is in excess of four may be employed.

The first capacitor $Q_1$ is constructed by the first upper electrode 74*a*, the underlying ferroelectric film 73, and the first plate line 72*a*, which are formed according to the above steps. Also, the second capacitor $Q_2$ is constructed by the second upper electrode 74*b*, the underlying ferroelectric film 73, and the first or second plate line 72*a*, 72*b*.

In this case, the patterning of the first conductive film 72, the ferroelectric film 73, and the second conductive film 74 is executed by using the inductively coupled plasma etching equipment, for example, while covering these films with different resist patterns (not shown). The gas that is used in these etchings is a mixed gas consisting of chlorine ($Cl_2$) and argon (Ar).

Figure 21A:
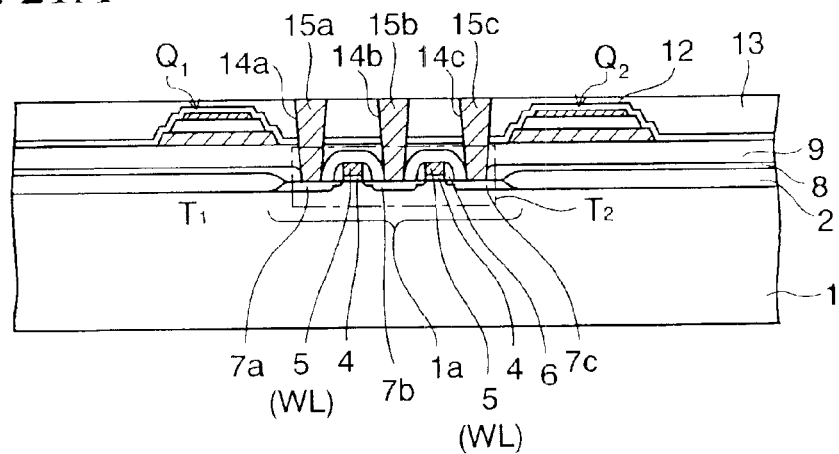
Figure 22:
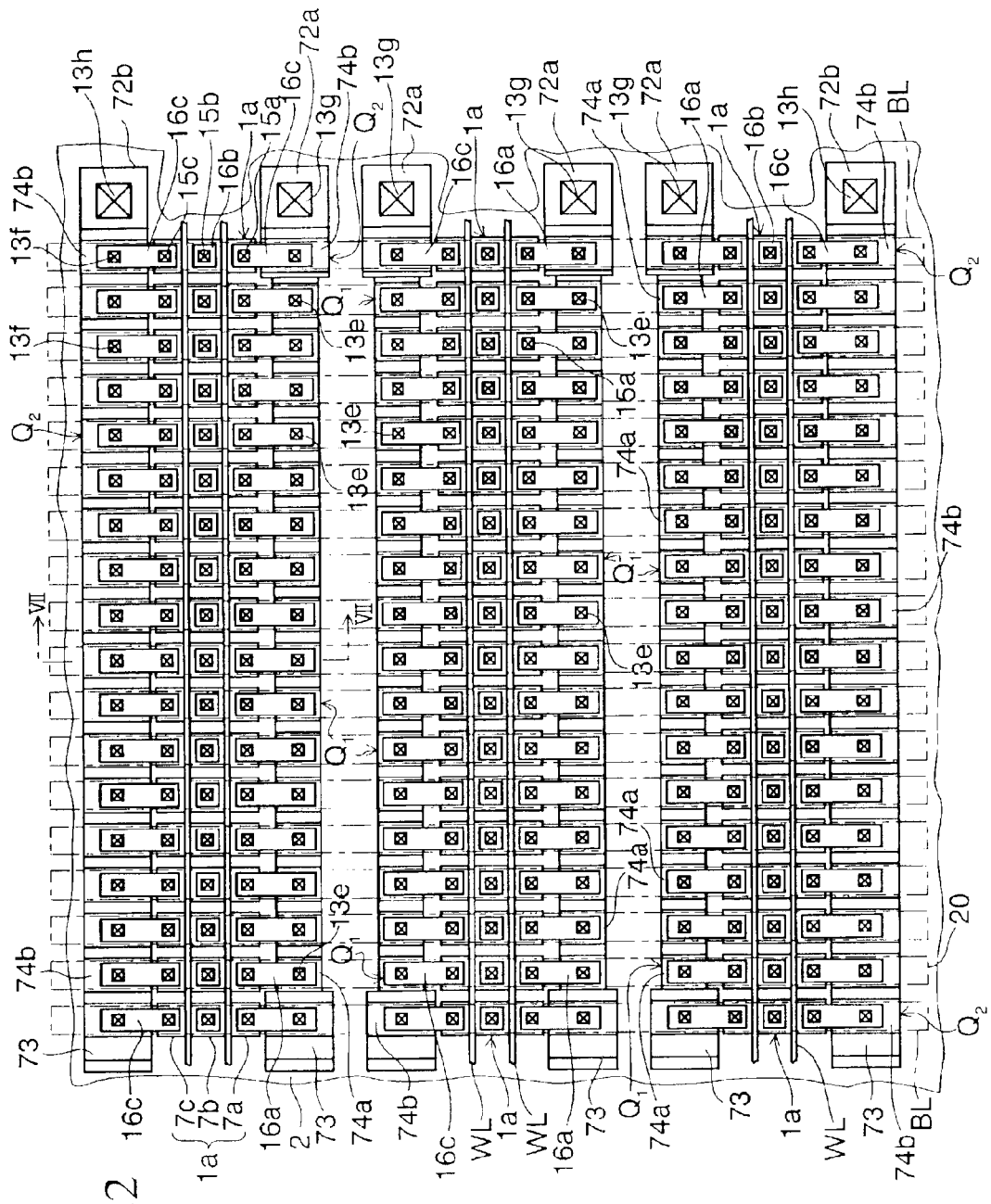
FIG. 22 is a plan view showing a memory cell region of the semiconductor device according to the sixth embodiment of the present invention.

Then, steps required until a structure shown in FIG. 21A is formed will be explained hereunder.

First, a capacitor protection insulating film 12 for covering the capacitors $Q_1$, $Q_2$ is formed on the first interlayer insulating film 9 to have a thickness of 50 nm. As the capacitor protection insulating film 12, a film made of the material having an oxygen preventing function such as alumina, PZT, or the like is formed.

Then, an $SiO_2$ film is formed as a second interlayer insulating film 13 on the capacitor protection insulating film 12. The $SiO_2$ film is formed by the CVD method using the TEOS as the source gas. Then, an upper surface of the second interlayer insulating film 13 is planarized by the CMP method. Such planarization is executed under the condition that the second interlayer insulating film 13 has a thickness of about 300 nm on the capacitors $Q_1$, $Q_2$.

Then, first to third contact holes 14*a* to 14*c* are formed on the first to third n-type impurity diffusion regions 7*a* to 7*c* respectively. Then, a titanium (Ti) film of 20 nm thickness and a titanium nitride (TiN) film of 50 nm thickness are formed sequentially as a glue film on insides of the first to third contact holes 14*a* to 14*c* and the second interlayer insulating film 13 by the sputter method. Then, a tungsten (W) film is grown on the glue film by the CVD method to have a thickness that can bury completely the first to third contact holes 14*a* to 14*c*. Then, the tungsten film and the glue film are polished by the CMP method to remove from the upper surface of the second interlayer insulating film 13. Thus, the tungsten film and the glue film being left in the first to third contact holes 14*a* to 14*c* are used as first to third conductive plugs 15*a* to 15*c* respectively.

Then, an oxidation preventing film (not shown) for covering the first to third conductive plugs 15*a* to 15*c* is formed on the second interlayer insulating film 13. Then, fourth and fifth contact holes 13*e*, 13*f* are formed on the first and second upper electrodes 74*a*, 74*b* respectively by patterning the oxidation preventing film, the second interlayer insulating film 13, and the capacitor protection insulating film 12. At the same time, a sixth contact hole 13*g* and a seventh contact hole 13*h* are formed on the contact regions that are formed near one ends of the first and second plate line 72*a*, 72*b* and are protruded to the outside from the upper electrodes 74*a*, 74*b* respectively.

Then, in order to recover the film quality of the capacitors $Q_1$, $Q_2$ from the damage caused in the formation of the fourth and fifth contact holes 13*e*, 13*f*, the capacitors $Q_1$, $Q_2$ are annealed in the oxygen atmosphere. In this case, since the planar area of the second capacitor $Q_2$ is larger the planar area of the first capacitor $Q_1$, a diameter of the fifth contact hole 13*f* may be set larger than a diameter of the fourth contact hole 13*e* to enhance the annealing effect. Then, the oxidation preventing film is removed by the etching-back.

Figure 21B:
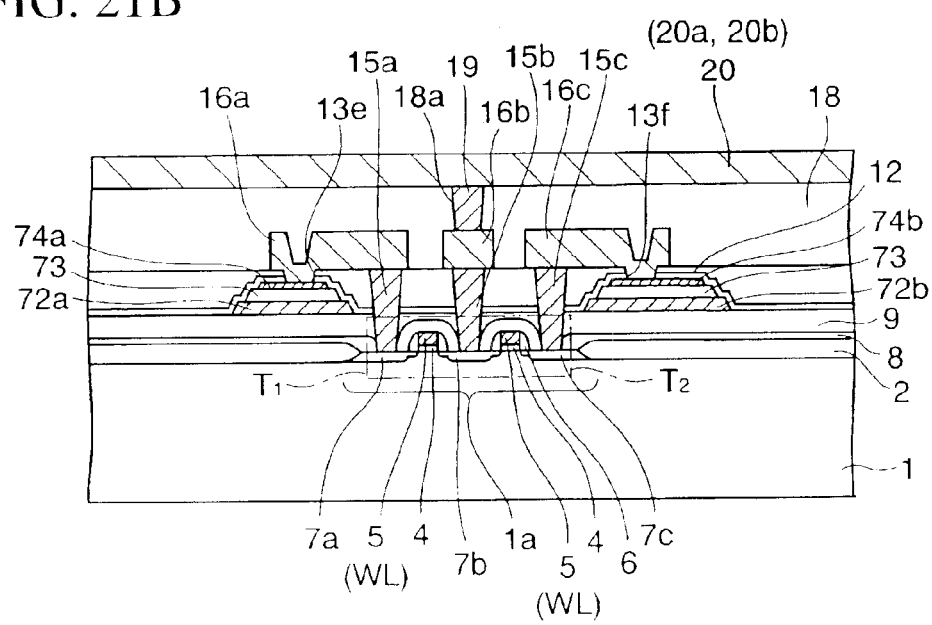

Then, steps required until a structure shown in FIG. 21B is formed will be explained hereunder.

First, a metal film, e.g., a metal film of a structure having a TiN film and an Al—Cu film is formed in the fourth to seventh contact holes 13*e* to 13*h* and on the second interlayer insulating film 13. Then, the metal film is patterned. Thus, a first wiring 16*a* for connecting the first conductive plug 15*a* and the first or second upper electrode 74*a*, 74*b* and a second wiring 16*c* for connecting the third conductive plug 15*c* and the first or second upper electrode 74*a*, 74*b* are formed, and also an island-like conductive pad 16*b* is formed on the second conductive plug 15*b*.

Then, a third interlayer insulating film 18 for covering the first and second wirings 16*a*, 16*c* and the conductive pad 16*b* is formed on the second interlayer insulating film 13. Then, a sixth contact hole 18*a* is formed in the third interlayer insulating film 18 on the conductive pad 16*b*. Then, a fourth conductive plug 19 is formed in the sixth contact hole 18*a*. Then, a bit line 20 that is connected onto the fourth conductive plug 19 is formed on the third interlayer insulating film 18. In this case, the bit line 20 is connected to a sense amplifier in the peripheral circuit.

Out of a plurality of capacitors $Q_1$, $Q_2$ formed according to the above steps, a plurality of second capacitors $Q_2$ each having the large area are arranged in the outermost peripheral portion of the memory cell region, and a plurality of first capacitors $Q_1$ are arranged in the region that is surrounded by a plurality of second capacitors $Q_2$. In addition, the planar shape of the upper electrode 74*b* constituting the second capacitor $Q_2$ is formed wider than the planar shape of the upper electrode 74*a* constituting the first capacitor $Q_1$.

Therefore, even if the deterioration of the second capacitors $Q_2$ that are arranged at positions, at which the deterioration is ready to occur, of the memory cell region is caused by the capacitor forming etching gas, etc., it can be prevented previously that an amount of stored charge $Q_{SW}$ of the second capacitors $Q_2$ is reduced rather than other first capacitors $Q_1$.

As a result, the second capacitors $Q_2$ formed in four corners of the almost square memory cell region A shown in FIG. 4 and FIG. 5 can be used as not the dummy capacitor but the actually operating capacitor. In addition, because reduction in the amount of stored charge of the second capacitor $Q_2$ is prevented, the error generated at the time of writing/reading the information by the sense amplifier can be suppressed.

In this case, in the above example, the first capacitors $Q_1$ and the second capacitors $Q_2$ are formed at the same time. But these capacitors may be formed by separate steps. Also, the planar shape of the upper electrode 74b of the second capacitor $Q_2$ may be shaped into a polygonal shape if such planar shape of the upper electrode 74b is wider than the upper electrode 74a of the first capacitor $Q_1$.

(Seventh Embodiment)

In the sixth embodiment, a plurality of plate lines except the first and last plate lines, which are positioned on the outermost periphery of the memory cell region, are formed as the almost H-shaped or hammer-like planar shape. That is, the width of the portion, on which the first upper electrode 74a is formed, of the first plate line 72a is narrowed.

Figure 23:
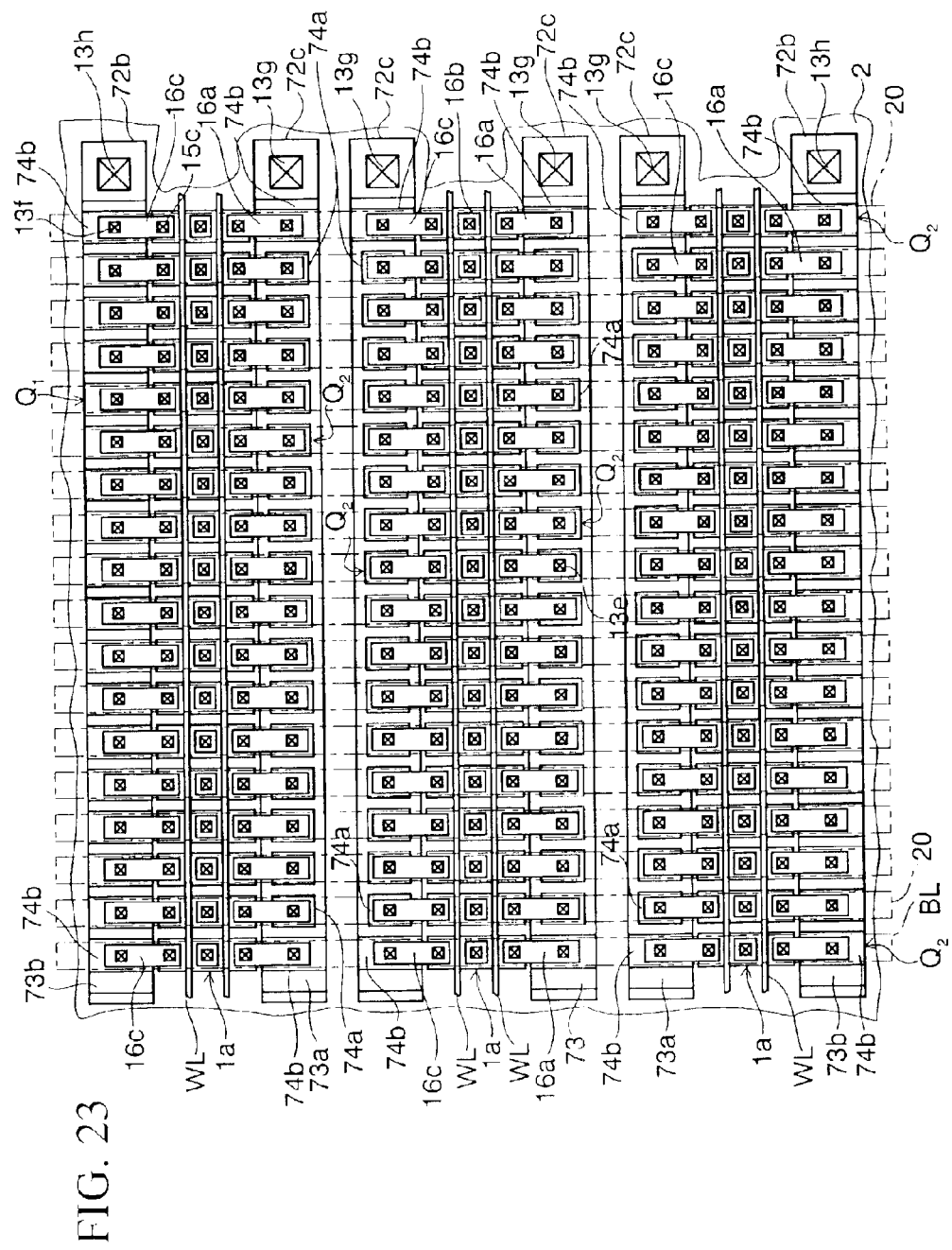
FIG. 23 is a plan view showing a memory cell region of a semiconductor device according to a seventh embodiment of the present invention.

In contrast, as shown in FIG. 23, the width of all first plate lines 72c on which both the first and second upper electrodes 74a, 74b are formed may be set almost equal to the width of the second upper electrode 74b. Like the sixth embodiment, the first plate line 72c is formed by patterning the first conductive film 72 shown in FIG. 20A.

In this case, in FIG. 23, the same symbols as those in FIG. 22 denote the same elements.

Accordingly, the first plate line 72c has the wider margin of the area in the width direction than the first upper electrode 74a formed over the first plate line 72c. Therefore, such a possibility can be eliminated that the area of the first upper electrode 74a is reduced due to the displacement of the patterning of the first conductive film 72.

(Eighth Embodiment)

In the sixth and seventh embodiments, out of the first and second capacitors $Q_1$, $Q_2$ arranged in the almost square memory cell region A, the second capacitors $Q_2$ that have the large area are aligned along the outermost periphery of the memory cell region A.

Figure 24:
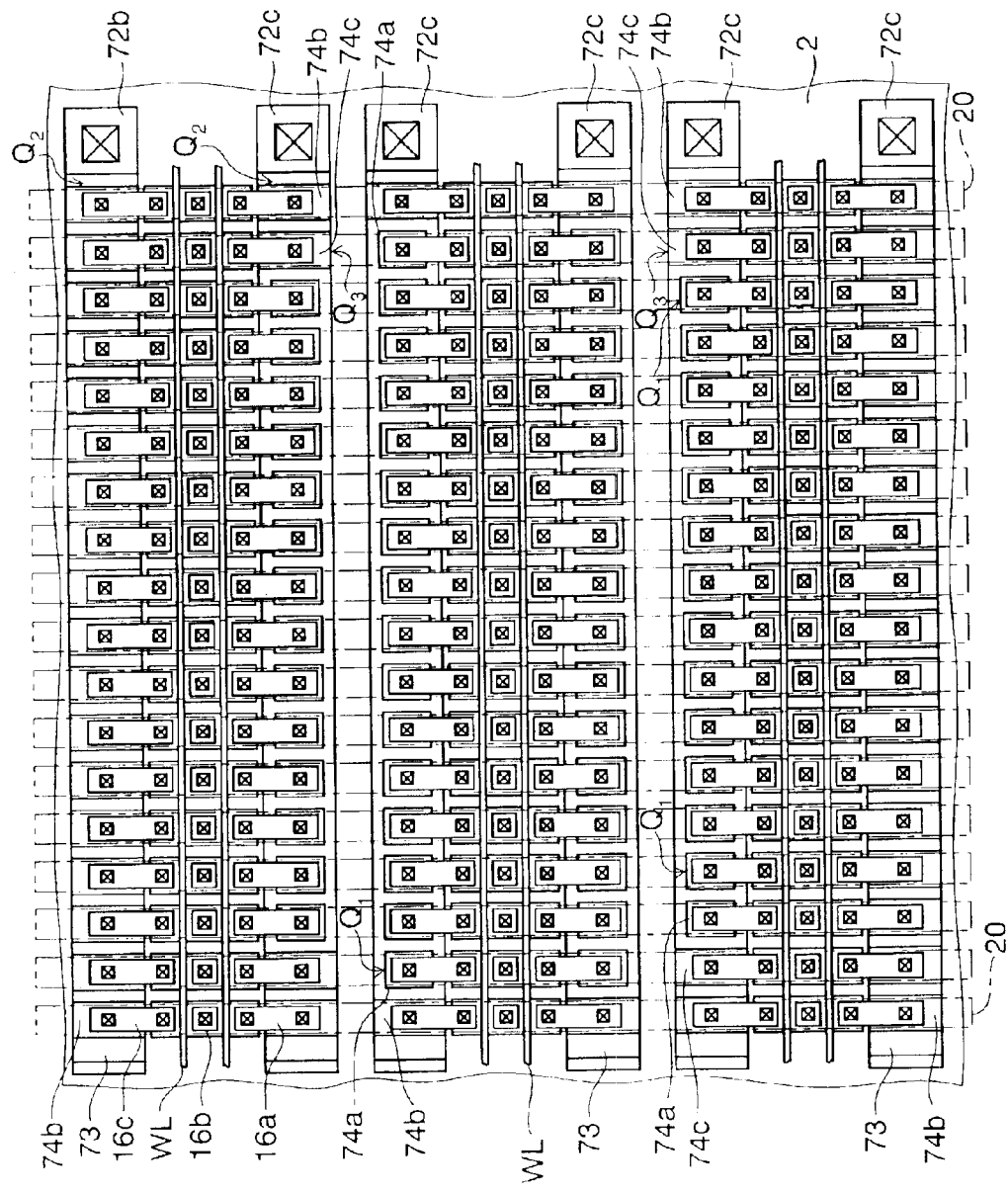
FIG. 24 is a plan view showing a memory cell region of a semiconductor device according to an eighth embodiment of the present invention.

In contrast, as shown in FIG. 24, the second capacitors $Q_2$ are formed by one around along the outermost periphery of the memory cell region A, and then one or plural third capacitors $Q_3$ may be added to the position that is closest to four corners in the diagonal direction in the memory cell region A. The third capacitor $Q_3$ consists of one of the first and second plate lines 72c, 72b, the ferroelectric film 73, and the upper electrode 74c. The upper electrode 74c of the third capacitors $Q_3$ is formed by patterning the second conductive film 74 shown in the sixth embodiment to have the area that is equal to or smaller than the upper electrode 74b of the second capacitor $Q_2$ but is larger than the upper electrode 74a of the first capacitor $Q_1$. Accordingly, an amount of stored charge $Q_{SW}$ of the third capacitors $Q_3$ is increased rather than the first capacitor $Q_1$.

According to this, as shown in FIG. 4, reduction in an amount of stored charge $Q_{SW}$ of the capacitors arranged in the portions that are close to four corners of the memory cell region A can be prevented, and also the number of the actually operating capacitors can be increased without the provision of the dummy capacitors.

In this case, in FIG. 24, the same symbols as those in FIGS. 20A and 20B, FIGS. 21A and 21B, FIG. 22 and FIG. 23 denote the same element.

(Ninth Embodiment)

In the sixth and seventh embodiments, out of the first and second capacitors $Q_1$, $Q_2$ that are arranged in the almost square memory cell region A, the second capacitors $Q_2$ having the large area are aligned along the outermost periphery of the memory cell region.

Figure 25:
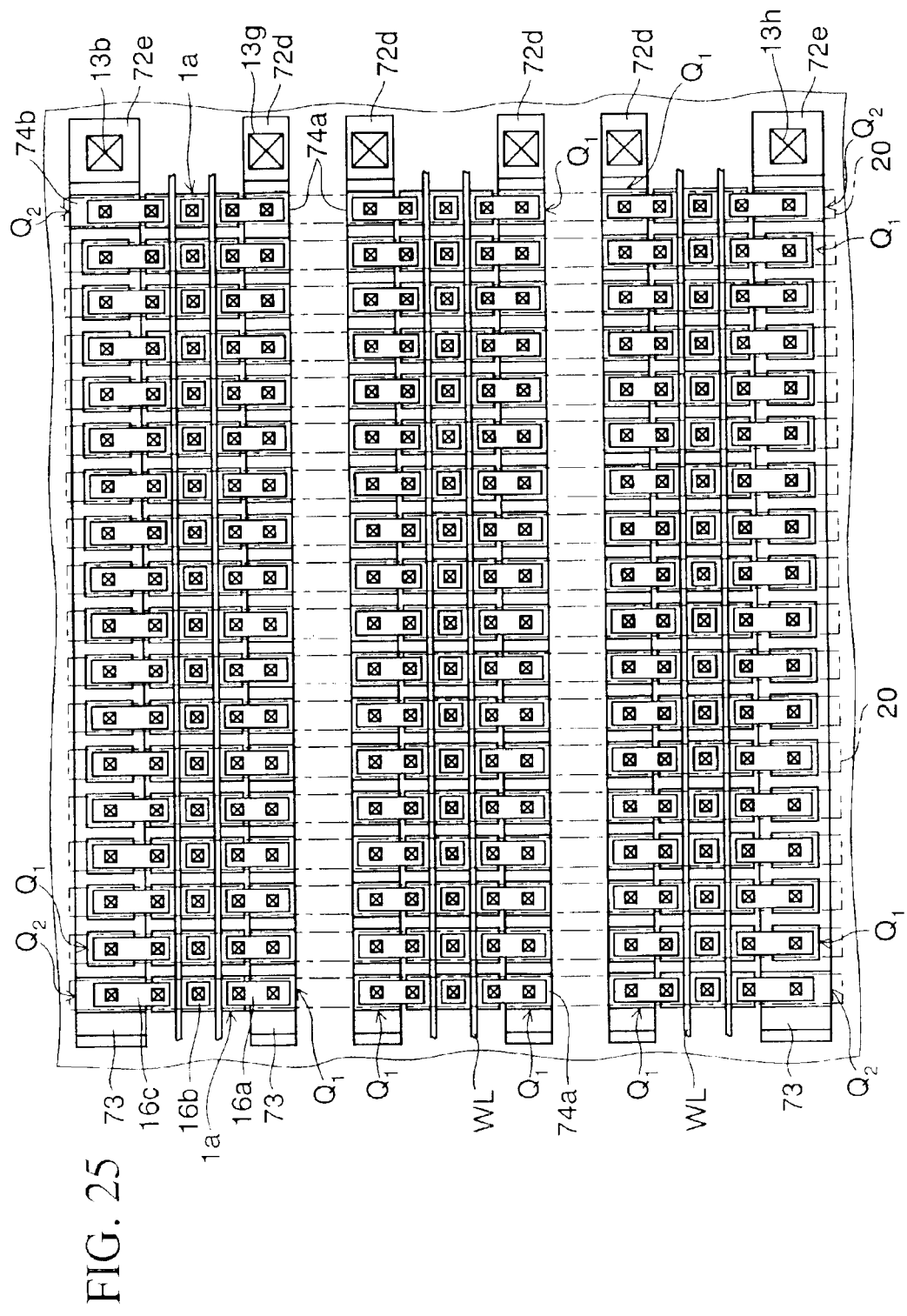
FIG. 25 is a plan view showing a memory cell region of a semiconductor device according to a ninth embodiment of the present invention.

In contrast, in the present embodiment, as shown in FIG. 25, the second capacitors $Q_2$ having the large area are arranged in a minimum number by forming the second upper electrodes one by one in four corners of the memory cell region A respectively. Also, the second plate line 72e serving as the first and last plate lines is formed to have the same width as the second upper electrode 74b constituting the second capacitor $Q_2$. Also, the first plate line 72d serving as the plate lines except the first and last plate lines is formed to have the same width as the first upper electrode 74a constituting the first capacitor $Q_1$. The first and second plate lines 72d, 72e are formed by patterning the second conductive film 74 shown in the sixth embodiment.

Therefore, in compliance with the experimental results in FIG. 4, FIG. 5, and FIG. 6, reduction in the amount of stored charge $Q_{SW}$ of the capacitors in the memory cell region A can be suppressed.

Also, because the number of the second capacitors $Q_2$ having the large area is reduced to the lowest minimum, the width of the first plate line 72d can be narrowed rather than the width of the first and last second plate lines 72e. Accordingly, the area of the memory cell region can be narrowed rather than the memory cell region in the sixth to eighth embodiments.

In this case, in FIG. 25, the same symbols as those in FIGS. 20A and 20B, FIGS. 21A and 21B, FIG. 22 and FIG. 23 denote the same element.

(Tenth Embodiment)

In the sixth to ninth embodiments, the second capacitors $Q_2$ are arranged in four corners or along the periphery of the memory cell region and the first capacitors $Q_1$ are arranged in other regions.

Figure 26:
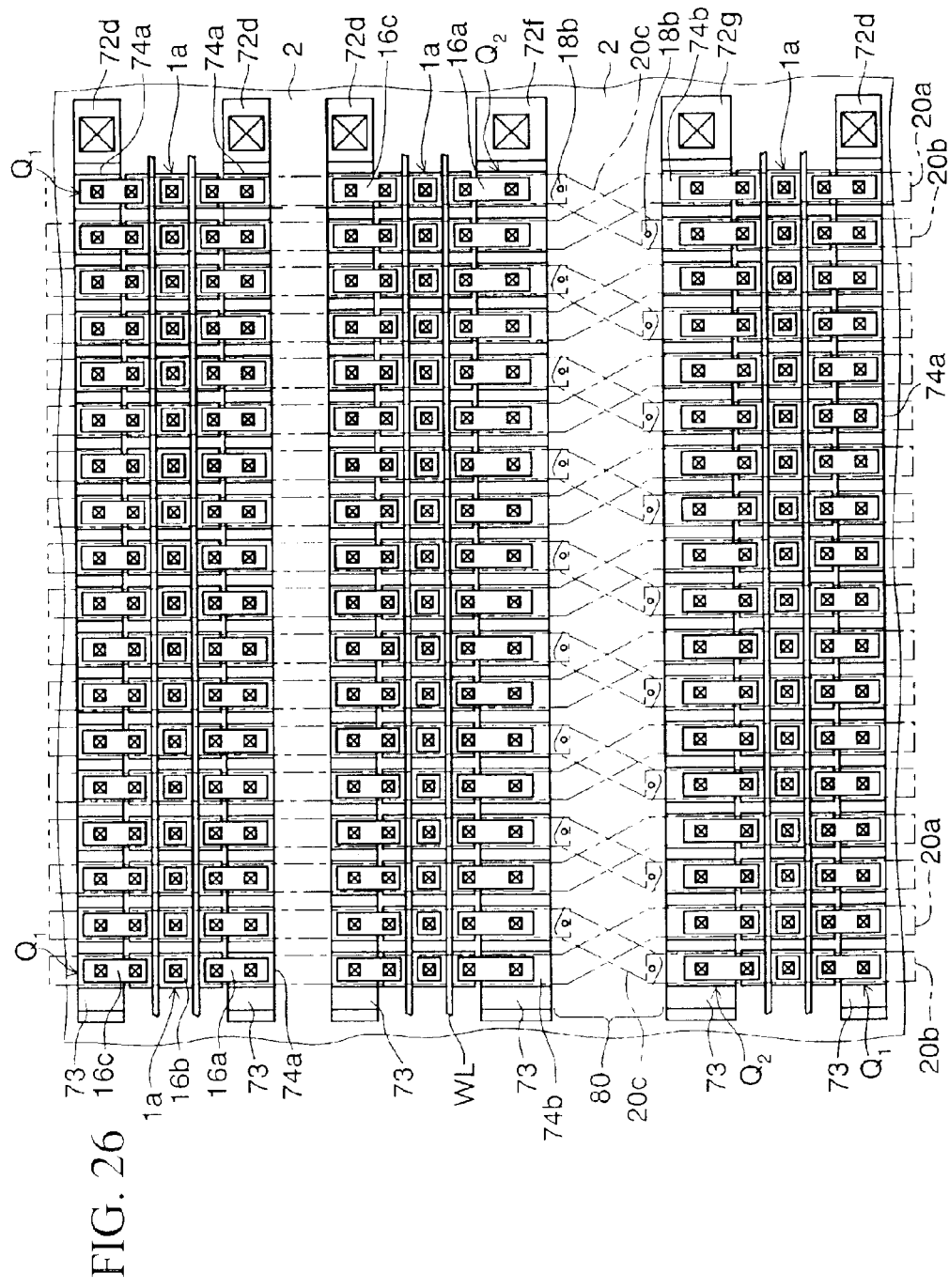
FIG. 26 is a plan view showing a memory cell region of a semiconductor device according to a tenth embodiment of the present invention.

In contrast, in the present embodiment, as shown in FIG. 26, if two plate lines 72f, 72g, which are the plate line except the first and last plate lines out of a plurality of plate lines and have the widest neighboring interval therebetween, are to be formed, the second upper electrodes 74b may be formed as the capacitor upper electrodes that are formed on these plate lines 72f, 72g. In other words, only the second capacitors $Q_2$ having the large storage capacity may be formed in the regions of these plate lines 72f, 72g.

In FIG. 26, a distance between the n-th plate line 72f and the (n+1)-th plate line 72g is set longer than the long side of the active region 1a. Also, the region between the n-th plate line 72f and the (n+1)-th plate line 72g is a twist region 80 in which the bit lines 20 intersect with each other, and the active region 1a is not arranged below the twist region 80.

In this twist region 80, a plurality of bit lines 20a, 20b are bent alternatively toward one side. The bent bit lines 20a have an orbit that changes the overlapped capacitor column into the next column before and after the twist region 80. Also, remaining not-bent bit lines 20b are disconnected in the twist region 80 to prevent the short-circuit between the bit lines 20a, 20b.

Also, in the twist region 80, a relay wiring 20c that overlaps with the bent portion of the bit line 20a is formed on the first interlayer insulating film 9 shown in FIG. 21B. This relay wiring 20c is formed by patterning the first conductive film 72 and is arranged at an interval from the plate lines 72f, 72g. Then, the relay wiring 20c connects the disconnected bit lines 20b via the contact holes 18b, 18c formed in the second and third interlayer insulating films 9, 18. The disconnected bit lines 20b are connected to the bit lines 20b having the bent portion in the twist region 80 in the intersecting direction via the relay wiring 20c.

Two plate lines 72f, 72g that put the twist region 80 therebetween have the same shape as the second plate line 72b shown in the sixth embodiment. Also, a plurality of second upper electrodes 74b are formed at a distance on these plate lines 72f, 72g via the dielectric film 72. Thus, the second capacitors $Q_2$ are formed in the area, in which the capacitor density is thin or the repetition pattern structure is disordered, within the region that is located on the inner side than four corners of the memory cell region.

As described above, the area in which the interval between the plate lines 72f, 72g is wide is placed in the similar situation to the peripheral region of the memory cell region A shown in FIG. 4 because the pattern density is thin in such area.

Therefore, an amount of stored charge of the actually operating capacitor is supplemented by arranging the second upper electrodes 74b having the large area on such plate lines 72f, 72g, and thus reduction in yield can be prevented.

In this case, in FIG. 26, the same symbols as those in FIGS. 20A and 20B, FIGS. 21A and 21B, FIG. 22, FIG. 23, FIG. 24, and FIG. 25 denote the same element.

Meanwhile, in the sixth to tenth embodiments, a plurality of actually operating capacitors having different sizes of the upper electrodes can be applied to both the 2T/2C system in which one bit is stored by two transistors and two capacitors and the 1T/1C system in which one bit is stored by one transistor and one capacitor, and are free from the circuit operating system.

(Eleventh Embodiment)

In the sixth to tenth embodiments, the memory cell having the planar-type ferroelectric capacitor is explained. In the present embodiment, the memory cell having the stacked-type ferroelectric capacitor will be explained hereunder.

FIGS. 27A and 27B and FIGS. 28A and 28B are sectional views showing steps of manufacturing a semiconductor device according to an eleventh embodiment of the present invention. FIG. 29 is a plan view showing capacitors in the memory cell region of the semiconductor device according to the eleventh embodiment of the present invention. FIGS. 27A and 27B and FIGS. 28A and 28B are sectional views that are viewed along a VIII—VIII line in FIG. 29. In this case, in FIGS. 27A and 27B, FIGS. 28A and 28B, and FIG. 29, the same symbols as those in the fifth embodiment denote the same elements.

Figure 27A:
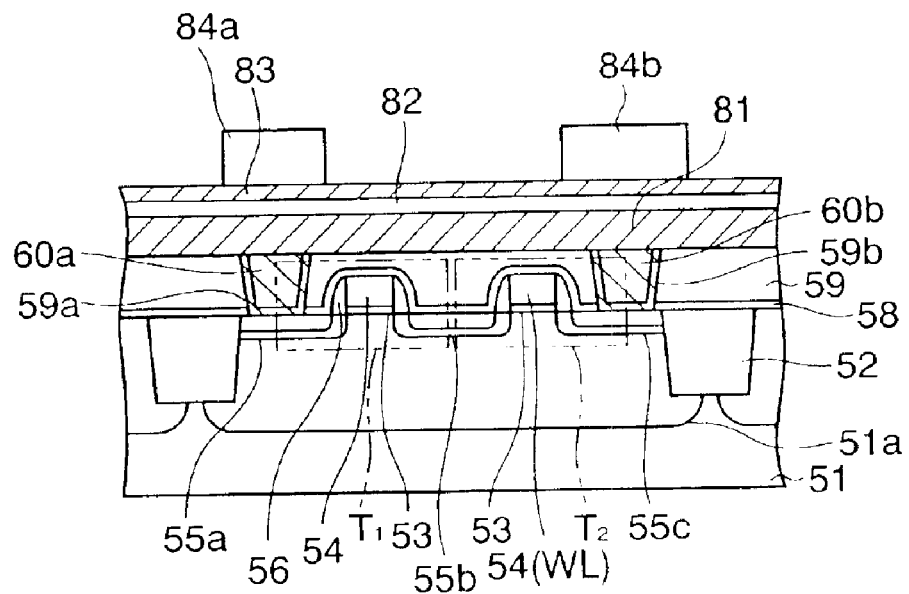
FIGS. 27A and 27B and FIGS. 28A and 28B are sectional views showing steps of manufacturing a semiconductor device according to an eleventh embodiment of the present invention.

First, steps required until a structure shown in FIG. 27A is formed will be explained hereunder.

As explained in the fifth embodiment, an element isolation insulating film 52 is formed on a surface layer of a silicon substrate 51. The element isolation insulating film 52 is formed in the area that surrounds a plurality of active regions 51a being arranged vertically and horizontally on the surface of the silicon substrate 51. A plurality of the active regions 51a are formed to direct their long sides in the same direction, as shown in FIG. 16.

Then, gate insulating films 53 are formed by oxidizing the surfaces of the active regions 51a on the silicon substrate 51.

Then, the amorphous silicon or polysilicon film is formed on the element isolation insulating film 52 and the gate insulating films 53, and then the tungsten silicide film is formed on the silicon film. Then, the gate electrodes 54 are formed over the active regions 51a by patterning the silicon film and the tungsten silicide film. Two gate electrodes 54 are formed on the active region 51a in almost parallel at an interval. The gate electrode 54 constitutes a part of the word line WL that pass over the element isolation insulating film 52.

Then, the n-type impurity is ion-implanted into the active regions 51a on both sides of the gate electrodes 54. Thus, first to third n-type impurity diffusion regions 55a, 55b, 55c serving as the source/drain of the n-type MOS transistors $T_1$, $T_2$ are formed. The first to third n-type impurity diffusion regions 55a to 55c are aligned in the direction that intersects with the word line WL. The second n-type impurity diffusion region 55b that is positioned in the middle of the active region 51a is connected electrically to the bit line whereas the first and third n-type impurity diffusion regions 55a, 55c that are positioned on both sides of the active region 51a are connected electrically to the upper electrodes of the capacitors described later.

Then, the insulating film is formed on the silicon substrate 51, the element isolation insulating film 52, and the gate electrodes 54. Then, sidewall insulating films 56 are left by etching back the insulating film.

Then, the n-type impurity is ion-implanted again into the active regions 51a while using the gate electrodes 54 and the sidewall insulating films 56 as a mask. Thus, the first to third n-type impurity diffusion regions 55a to 55c are formed as the LDD structure.

Accordingly, a first nMOS transistor $T_1$ having the first and second n-type impurity diffusion regions 55a, 55b and one gate electrode 54 and a second nMOS transistor $T_2$ having the second and third n-type impurity diffusion regions 55b, 55c and the other gate electrode 54 are formed.

Then, an insulating cover film 58 for covering the nMOS transistors $T_1$, $T_2$ is formed on the silicon substrate 51 by the CVD method. The silicon oxide nitride (SiON) film, for example, is formed as the cover film 58.

Then, the silicon oxide film of about 1.0 $\mu$m thickness is formed on the cover film 58 by the CVD method using the TEOS. This silicon oxide film is used as the first interlayer insulating film 59.

Then, first and second contact holes 59a, 59b are formed on the first and third n-type impurity diffusion regions 55a, 55c by patterning the first interlayer insulating film 59 and the cover film 58.

Then, a Ti film of 20 nm thickness and a TiN film of 50 nm thickness are formed sequentially as the glue film in the first and second contact holes 59a, 59b and on the first interlayer insulating film 59 by the sputter method. Then, a W film is grown on the glue film by the CVD method to have a thickness that buries completely the first and second contact holes 59a, 59b. Then, the W film and the glue film are polished by the CMP method to remove from the upper surface of the first interlayer insulating film 59. Thus, the tungsten film and the glue film being left in the first and second contact holes 59a, 59b are used as first and second conductive plugs 60a, 60b respectively.

Then, the Ti film of 10 to 30 nm thickness and the Pt film of 100 to 300 nm thickness are formed sequentially as a first conductive film 81 on the first interlayer insulating film 59 and the first and second conductive plugs 60a, 60b by the sputter method.

Then, the PZT film of 100 to 300 nm thickness is formed as a ferroelectric film 82 on the first conductive film 81 by the RF sputter method. As the method of forming the ferroelectric film 82, there are the MOD method, the MOCVD method, the sol-gel method, etc. in addition to the above. Also, as the material of the ferroelectric film 82, the PZT material, the Bi-layered structure compound, or other metal oxide ferroelectric substance shown in the fifth embodiment may be employed in addition to the PZT.

Then, as the crystallizing process of the PZT film constituting the ferroelectric film 82, the RTA is executed at the temperature of 650 to 850° C. for 30 to 120 second in the oxygen atmosphere.

Then, the iridium oxide ($IrO_2$) film of 100 to 300 nm thickness is formed as a second conductive film 83 on the ferroelectric film 82 by the sputter method.

Then, a first hard mask 84a and a second hard mask 84b are formed on the second conductive film 83 over the first and second conductive plugs 60a, 60b and their peripheral areas respectively. The first hard mask 84a and the second hard mask 84b have a structure in which the TiN film and the $SiO_2$ film are formed sequentially respectively. Also, the second hard mask 84b is formed on the first conductive plugs 60a or the second conductive plugs 60b that are positioned in four corners of the memory cell region, and has a bottom area that is wider than the first hard mask 84a. For example, the first hard mask 84a has the planar size of 1.0 μm×1.0 μm, and the second hard mask 84b has the planar size of 1.5 μm×1.0 μm.

Then, the second conductive film 83, the ferroelectric film 82, and the first conductive film 81 located in the areas that are not covered with the first hard mask 84a and the second hard mask 84b are etched. These films 81 to 83 are etched by using the inductively coupled plasma etching equipment. A mixed gas consisting HBr and $O_2$ is used in etching the first and second conductive films 81, 83, and a mixed gas consisting of chlorine ($Cl_2$) and argon (Ar) is used in etching the ferroelectric film 82.

Figure 27B:
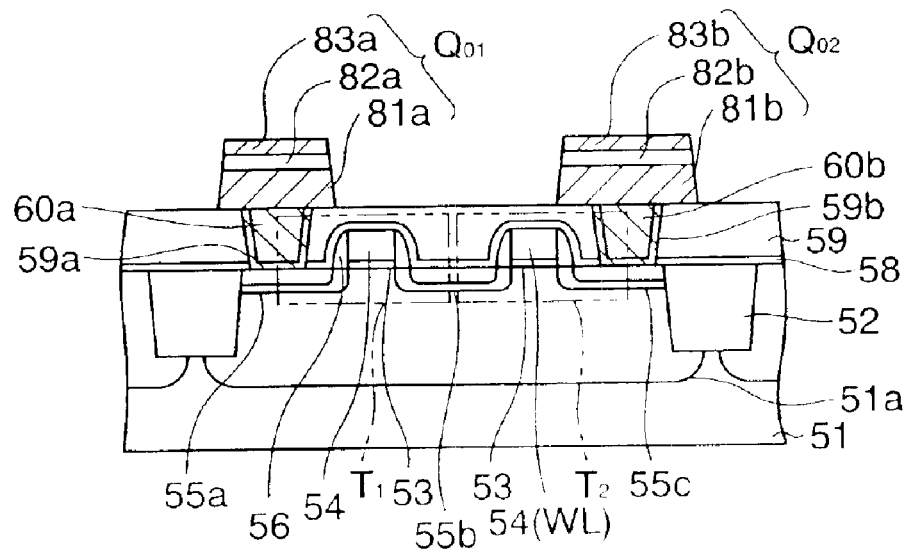

As a result, as shown in FIG. 27B, the second conductive film 83 being left under the first hard mask 84a acts as an upper electrode 84a, the ferroelectric film 82 acts as a dielectric film 82a, and the first conductive film 81 acts as a lower electrode 81a. Then, a first capacitor $Q_{01}$ consists of the lower electrode 81a, the dielectric film 82a, and the upper electrode 83a. Also, the second conductive film 83 being left under the second hard mask 84b acts as an upper electrode 83b, the ferroelectric film 82 acts as a dielectric film 82b, and the first conductive film 81 acts as a lower electrode 81b. Then, a second capacitor $Q_{02}$ consists of the lower electrode 81b, the dielectric film 82b, and the upper electrode 83b.

Positional relationships between the first and second capacitors $Q_{01}$, $Q_{02}$ and the active region 51a in the memory cell region are shown in FIG. 29 as a plan view.

Then, in order to recover the film quality of the ferroelectric film 82 that is damaged by the etching, the first and second capacitors $Q_{01}$, $Q_{02}$ are annealed in the oxygen atmosphere.

Figure 28A:
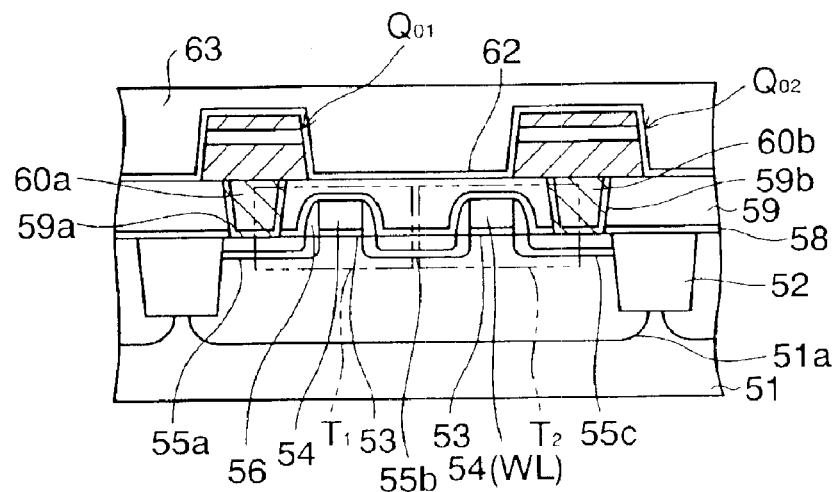
Figure 29:
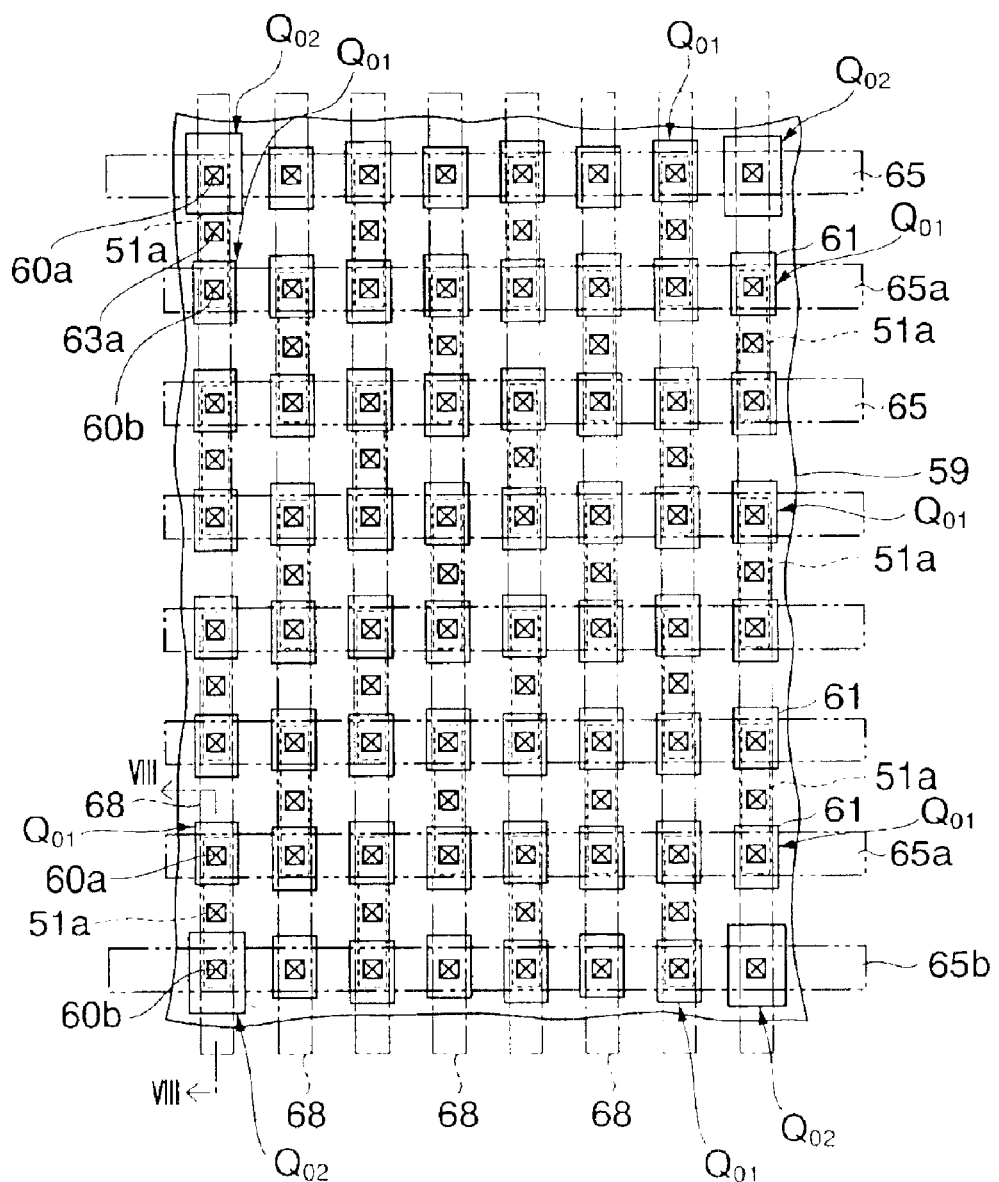
FIG. 29 is a plan view showing a memory cell region of a semiconductor device according to the eleventh embodiment of the present invention.

Then, as shown in FIG. 28A, an alumina film, for example, is formed as a capacitor protection insulating film 62, which covers the first and second capacitors $Q_{01}$, $Q_{02}$, on the first interlayer insulating film 59. Then, a second interlayer insulating film 63 made of $SiO_2$ is formed on the first interlayer insulating film 59. A surface of the second interlayer insulating film 63 is planarized by the CMP method.

Figure 28B:
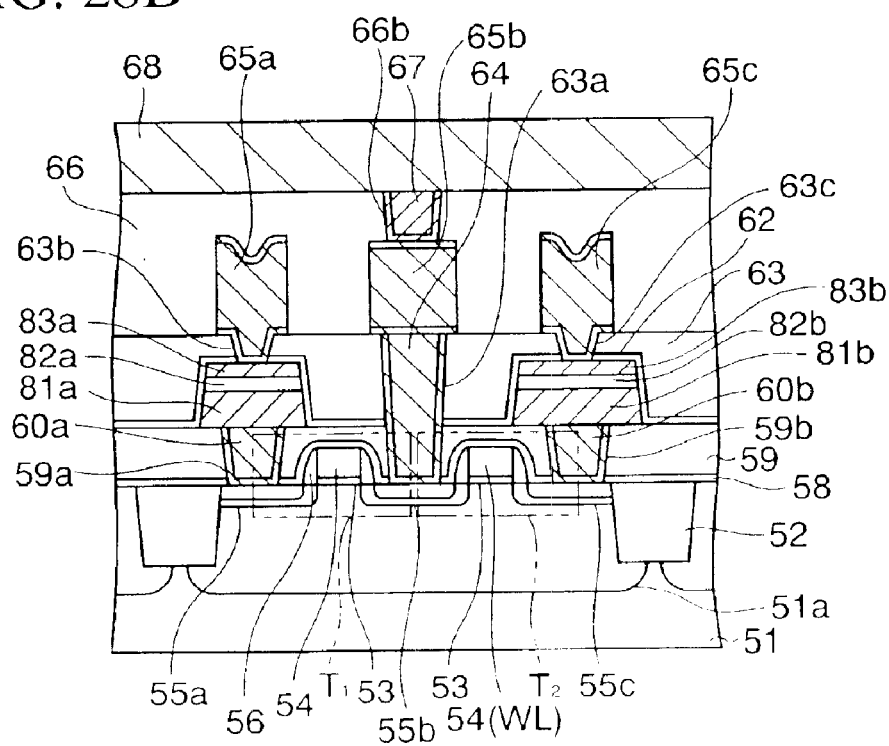

Then, as shown in FIG. 28B, a third contact hole 63a is formed by etching the second interlayer insulating film 63, the capacitor protection insulating film 62, the first interlayer insulating film 59, and the cover film 58 on the second n-type impurity diffusion region 55b. Then, a third conductive plug 64 made of the Ti layer, the TiN layer, and the W layer is formed in the third contact hole 63a. In addition, while covering the third conductive plug 64 with an oxidation preventing film (not shown), holes 63b, 63c are formed on the upper electrodes 83a, 83b of the first and second capacitors $Q_{01}$, $Q_{02}$ respectively.

Then, in order to recover the film quality of the first and second capacitors $Q_{01}$, $Q_{02}$ that are damaged in the formation of the holes 63b, 63c, the first and second capacitors $Q_{01}$, $Q_{02}$ are annealed in the oxygen atmosphere. In this case, since the flat surface of the second capacitor $Q_{02}$ is wider than the flat surface of the first capacitor $Q_{01}$, a diameter of the hole 63c on the second capacitor $Q_{02}$ is set larger than a diameter of the hole 63b on the first capacitor $Q_{01}$ to enhance the annealing effect.

Then, the oxidation preventing film is removed. Then, a first wiring 65a connected to the upper electrode 83a of the first capacitor $Q_{01}$ via the hole 63b and a second wiring 65c connected to the upper electrode 83b of the second capacitor $Q_{02}$ via the hole 63c are formed on the second interlayer insulating film 63. Also, a conductive pad 65b connected to the third conductive plug 64 is formed on the second interlayer insulating film 63.

Then, a third interlayer insulating film 66 for covering the wirings 65a, 65c and the conductive pad 65b is formed on the second interlayer insulating film 63 by the CVD method. Then, a hole 66b is formed in the third interlayer insulating film 66 on the conductive pad 65b, and then a fourth conductive plug 67 consisting of the TiN film and the W film is buried in the hole 66b. Then, a stripe-like bit line 68 that extends in the orthogonal direction to the word line WL and is connected to the fourth conductive plug 67 is formed on the third interlayer insulating film 66.

The second capacitors $Q_{02}$ formed according to the above steps are arranged in four corners of the memory cell region, and have the wider area and the larger amount of stored charge $Q_{SW}$ than the first capacitors $Q_{01}$ formed in the portions except four corners.

As a result, reduction in the amount of stored charge $Q_{SW}$ of the capacitors in four corners of the memory cell region A, as shown in FIG. 4 and FIG. 5, can be prevented, and thus values of the amount of stored charge $Q_{SW}$ of the first and second capacitors $Q_{01}$, $Q_{02}$ can be made uniform. Therefore, the first and second capacitors $Q_{01}$, $Q_{02}$ in the memory cell region A can be applied as not the dummy capacitors but the actually operating capacitors that are driven by the sense amplifier.

In this case, arrangement of the second capacitors $Q_{02}$ is not limited to four corners of the memory cell region. Like the sixth to ninth embodiments, the second capacitors $Q_{02}$ may be aligned along the outermost periphery of the memory cell region A, or two second capacitors $Q_{02}$ or more may be formed in the portions that are close to four corners in the diagonal direction of the memory cell region A, or the second capacitors $Q_{02}$ may be formed in the areas whose capacitor density is thin.

In the above examples, the first capacitors $Q_{01}$ and the second capacitors $Q_{02}$ are formed simultaneously. But these capacitors may be formed by separate steps. Also, the planar shape of the upper electrode 83b of the second capacitor $Q_{02}$ may be formed as the polygonal shape if such planar shape is wider than that of the upper electrode 83a of the first capacitor $Q_{01}$.

(Twelfth Embodiment)

In the above embodiments, reduction in the amount of stored charge of the actually operating capacitors is suppressed by using the capacitors, which are closest to four corners of the square memory cell region, as the dummy capacitors, or by increasing the areas of the capacitors, which are closest to four corners, rather than other capacitors.

In the present embodiment, to actually operate the capacitors that have the small amount of stored charge by not providing the dummy capacitors in the memory cell region or increasing the areas of a part of the capacitors but enhancing the voltages applied to the capacitors, which are provided to four corners or the outermost periphery of the memory cell region, higher than the applied voltage to other capacitors will be explained hereunder.

First, electrical connection relationships among the MOS transistor constituting the memory cell, the ferroelectric capacitor, the word line, and the plate line are shown in FIG. 30A.

In FIG. 30A, a variable voltage is applied to the plate line PL to write or read the information. Also, the gate electrode of the MOS transistor is connected to the word line WL. The ferroelectric capacitor $C_{fer}$ is connected between one of the source/drain of the MOS transistor and the plate line PL. Also, the bit line BL is connected to the other of the source/drain of the MOS transistor. The bit line BL is in the state that a bit line capacitance $C_{bit}$ is connected equivalently between the bit line BL and the portion GND that is grounded or set to a fixed voltage. Such electric circuit of one bit is rewritten into the equivalent circuit shown in FIG. 30B or FIG. 30C.

Next, a voltage applied to the bit line capacitance $C_{bit}$ is derived by using the equivalent circuit in FIG. 30C.

Figure 31:
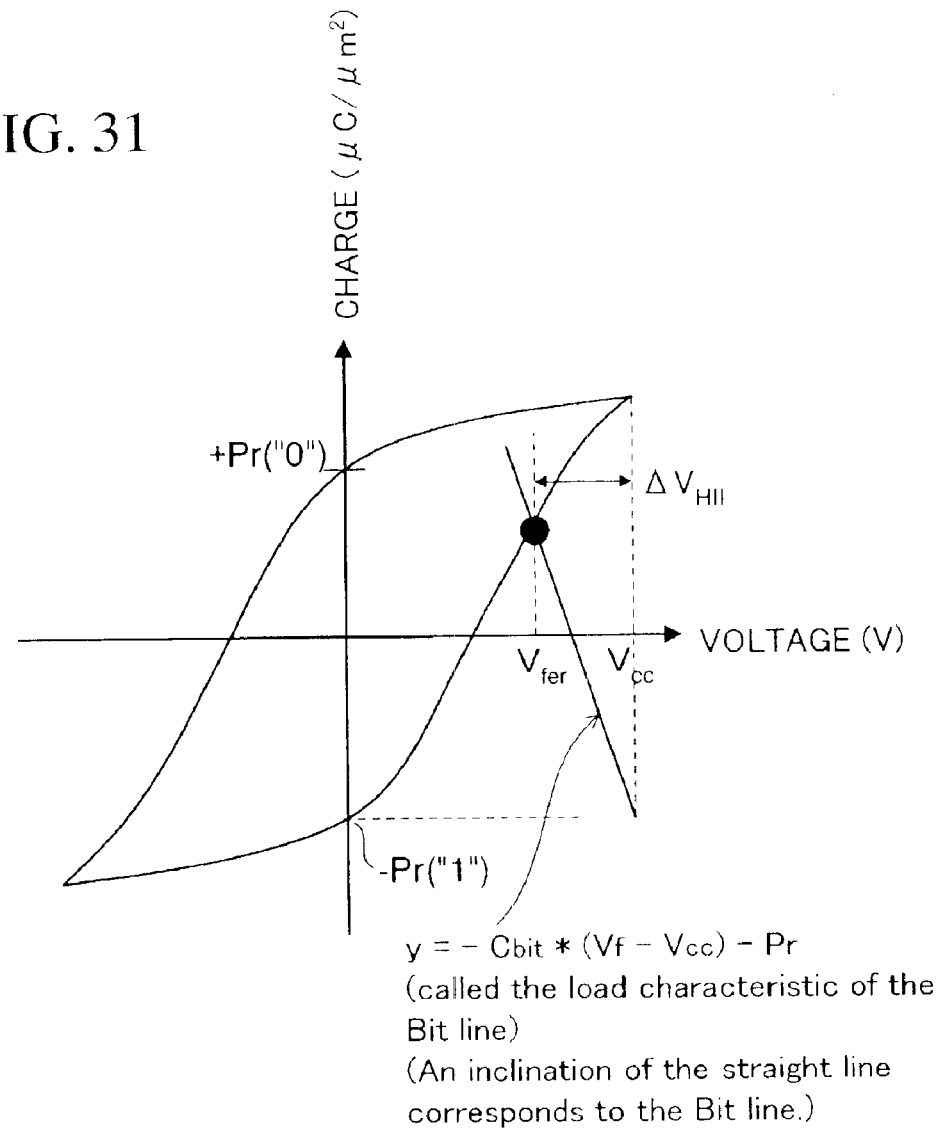
FIG. 31 is a characteristic view of a ferroelectric capacitor in the semiconductor device according to the twelfth embodiment of the present invention.

A voltage-charge characteristic of the ferroelectric capacitor has the hysteresis loop shown in FIG. 31. Assume that data "1" is written into the ferroelectric capacitor $C_{fer}$. Then, as shown in FIG. 30C, if a voltage Vcc is applied to the plate line PL to read the data from the ferroelectric capacitor $C_{fer}$, a voltage $V_{fer}$ is applied to the ferroelectric capacitor $C_{fer}$ and a voltage $V_{bit}$ is applied to the bit line capacitance $C_{bit}$. That is, $V_{cc}=V_{fer}+V_{bit}$. In this case, units of Vcc, $V_{fer}$, and $V_{bit}$ are the volt.

When Vcc is applied to the plate line PL, an amount of change $\Delta Q_{11}$ in the quantity of charge stored in the ferroelectric capacitor $C_{fer}$ is given by an equation (1). In this case, in the equation (1), $Q(V_{fer})$ is an amount of stored charge in the ferroelectric capacitor $C_{fer}$ to which the voltage $V_{fer}$ is applied.

$$\Delta Q_{11}=Q(V_{fer})-(-Pr)=Q(V_{fer})+Pr \quad (1)$$

Also, since an amount of charge of the bit line capacitance $C_{bit}$ has the same amount of charge as the ferroelectric capacitor $C_{fer}$, a following equation (2) is satisfied.

$$\Delta Q_{11}=C_{bit}\times(Vcc-V_{fer}) \quad (2)$$

Following equations (3),(4) are satisfied based on the equations (1),(2).

$$Q(V_{fer})+Pr=C_{bit}\times(Vcc-V_{fer}) \quad (3)$$

$$Q(V_{fer})=-C_{bit}\times(V_{fer}-Vcc)-Pr \quad (4)$$

Accordingly, a voltage $V_{f11}$ applied to the ferroelectric capacitor $C_{fer}$ can be derived as an intersection point between the hysteresis curve shown in FIG. 31 and a straight line y.

Also, a potential $\Delta V_{H11}$ of the bit line BL is given as $\Delta V_{H11}=Vcc-V_{f11}$, such potential can be derived by following equations (5),(6).

$$V_{f11}=V_{ref}=-((Q(V_{fer})+Pr)/C_{bit})+Vcc \quad (5)$$

$$\Delta V_{H11}=Vcc-V_{f11}=(Q(V_{fer})+Pr)/C_{bit} \quad (6)$$

According to the above equations, the potential $\Delta V_{H11}$ of the bit line BL is changed depending on the magnitude of the bit line capacitance $C_{bit}$. Therefore, if the voltage applied to the ferroelectric capacitor $C_{fer}$ is increased by increasing the bit line capacitance $C_{bit}$, the apparent amount of stored charge in the ferroelectric capacitor $C_{fer}$ in reading the data can be increased.

Accordingly, in the memory cell region A shown in FIG. 4, in order to read the data stored in the capacitor whose amount of stored charge is small, the capacity of the bit line that is connected electrically to the capacitors formed in four corners via the MOS transistor should be set larger than other bit lines.

Figure 32:
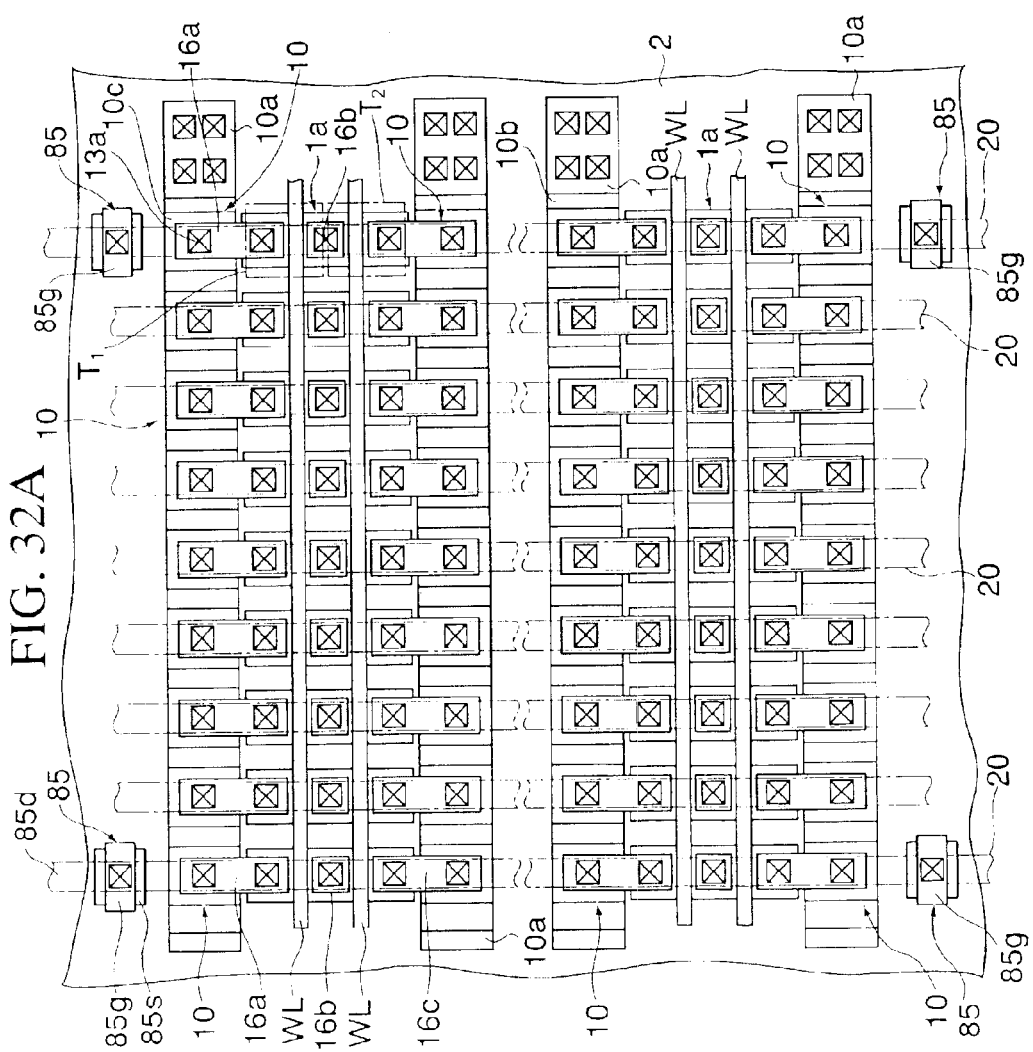
FIGS. 32A and 32B are a plan view and a circuit diagram showing a first example of the semiconductor device according to the twelfth embodiment of the present invention respectively.

Therefore, as shown in FIG. 32A, MOS transistors 85 are formed on the outside of the memory cell region near four corners on the silicon substrate 1. Then, as shown in FIG. 32B, the first and last bit lines 20 in the memory cell region are connected to gate electrodes 85g of the MOS transistors 85. These bit lines 20 are connected to the capacitors 10 via the MOS transistors $T_1$, $T_2$ that are arranged in four corners of the memory cell region. Also, source/drain 85s, 85d of the MOS transistor 85 are held at the ground potential or the fixed potential.

Accordingly, the MOS transistor 85 acts equivalently as the capacitor element, and thus the capacitances of the first and last bit lines 20 that pass through the memory cell region can be increased larger than the capacitances of other bit lines 20. In this case, a plurality of MOS transistors 85 may be connected to the bit line 20.

Figure 33:
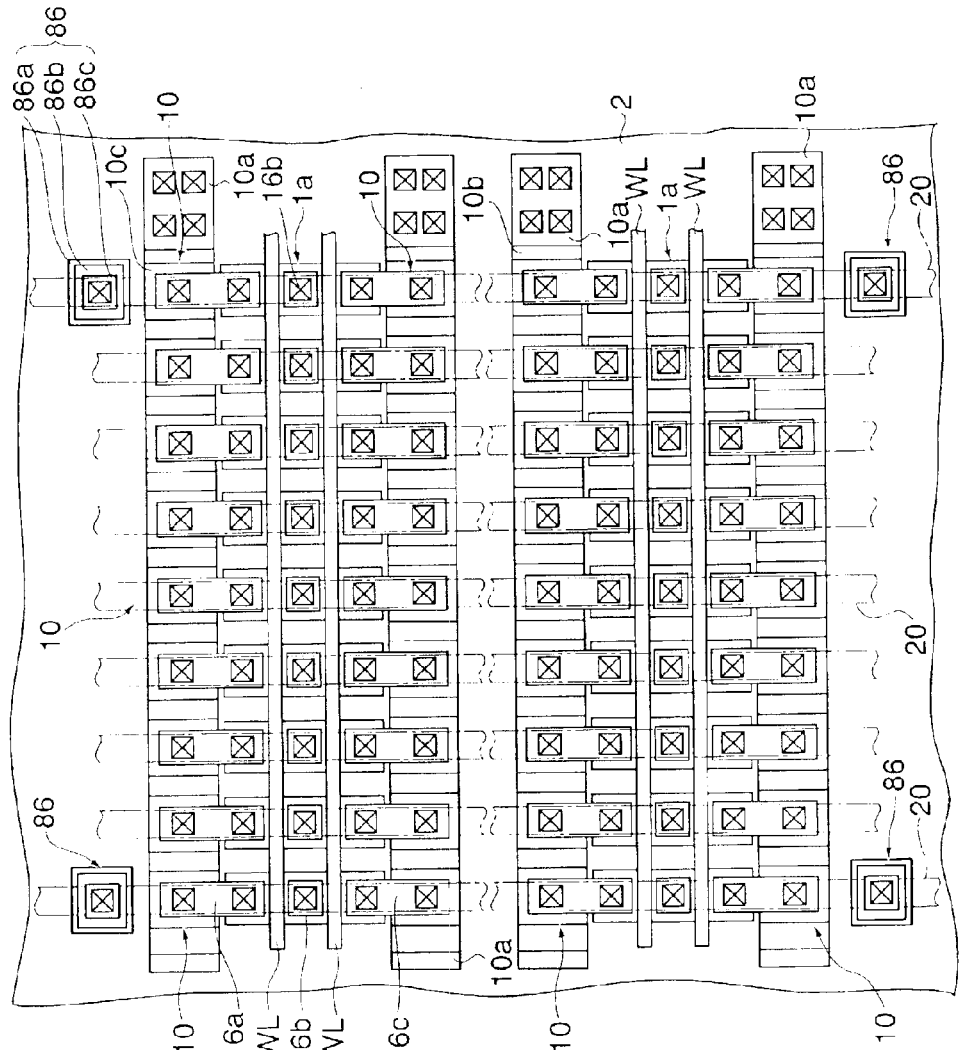
FIG. 33 is a plan view showing a second example of the semiconductor device according to the twelfth embodiment of the present invention.

Also, as shown in FIG. 33, capacitors 86 for changing the bit line capacitance $C_{bit}$ are formed on the outside of the memory cell region near four corners. The capacitors 86 are formed on the first interlayer insulating film 9 to have the same structure as the memory cell capacitor shown on the right side in FIG. 2. Also, the bit lines 20 are connected to upper electrodes 86c of the capacitance adding capacitors 86 through a hole (not shown) formed in the second and third interlayer insulating films 13, 18. In this case, lower electrodes 86a of the capacitance adding capacitors 86 are fixed at the ground potential or the fixed potential.

Figure 34:
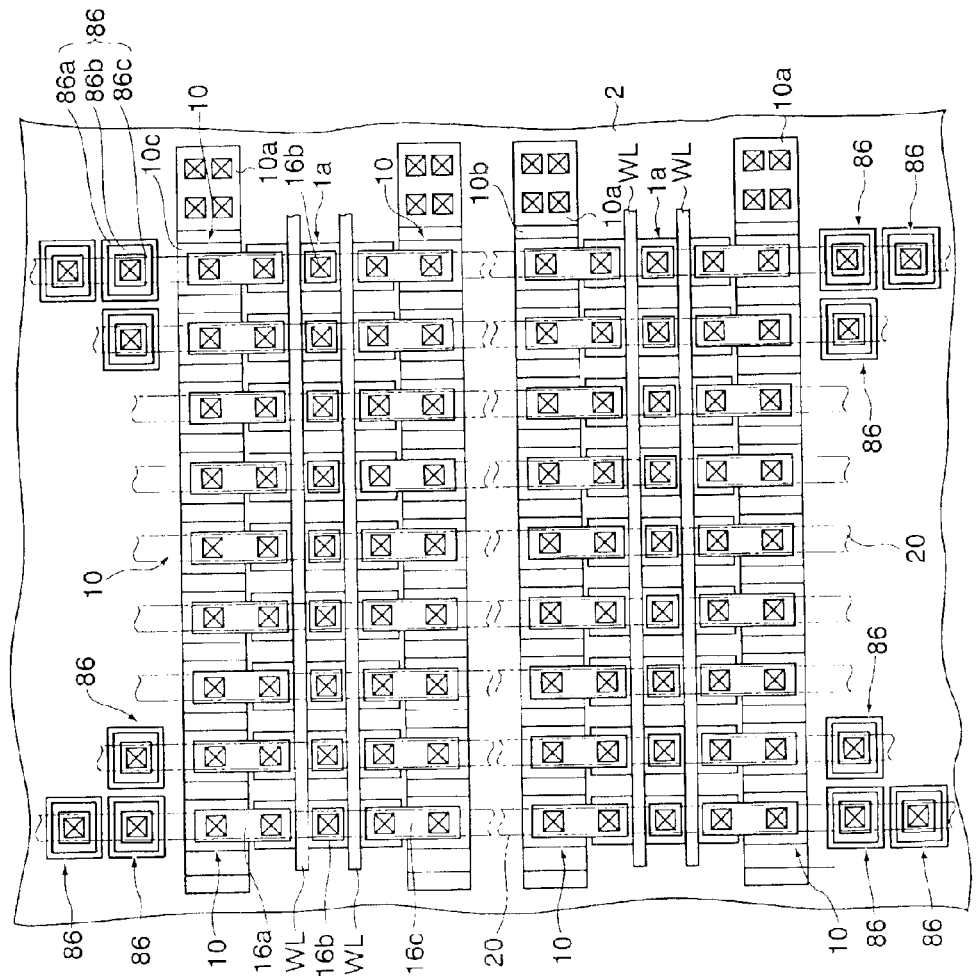
FIG. 34 is a plan view showing a third example of the semiconductor device according to the twelfth embodiment of the present invention.

Also, as shown in FIG. 34, two capacitance adding capacitors 86 or more may be connected to the first and last bit lines 20 out of a plurality of bit lines 20 that pass through the memory cell region. In this case, the capacitance adding capacitors 86 may be connected to other bit lines 20 in a number that is smaller than the first and last bit lines 20. In this case, the number of the capacitance adding capacitors 86 connected to the bit line 20 may be reduced gradually toward the center of the memory cell region. As a result, the data reading voltage of the capacitor in the memory cell region can be increased stepwise from the inside to the outside.

Here, both the capacitance adding capacitors 86 and the MOS transistors 85 may be connected to the bit line 20 to change the bit line capacitance $C_{bit}$. This is because both the capacitors 86 and the MOS transistors 85 act as the capacitance adding elements.

In above FIG. 32A, FIG. 33, and FIG. 34, the insulating films formed on the upper side than the element isolation insulating film 2 are omitted from the illustration, and the same symbols as those in FIG. 2 and FIG. 3 denote the same elements, and all the capacitors in the memory cell region are used as the actually operating ferroelectric capacitor.

By the way, in order to boost the voltage of the capacitors that are formed in four corners of the memory cell region, a following voltage boost circuit may be connected to the plate line PL. For example, the voltage boost circuit is formed in the peripheral circuit region, and then such voltage boost circuit is connected to the first and last plate lines 10a in the memory cell region respectively.

Figure 35:
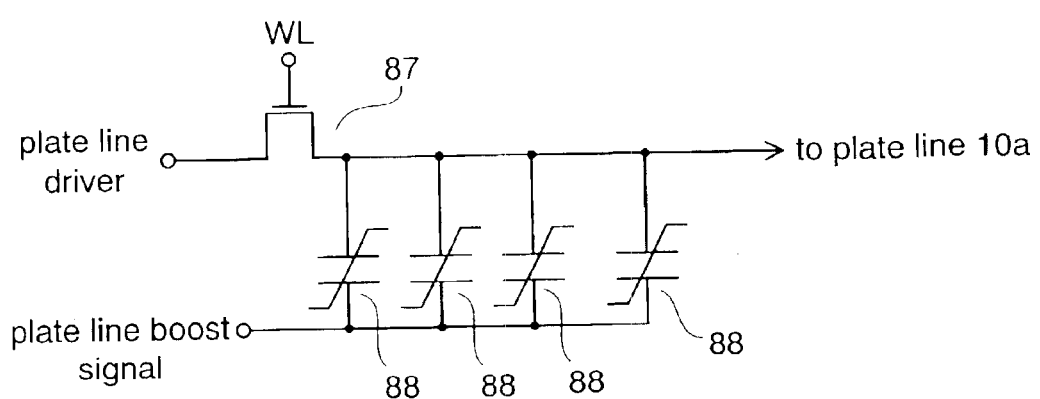
FIG. 35 is a circuit diagram of a boost circuit formed in the semiconductor device according to the twelfth embodiment of the present invention.

The voltage boost circuit shown in FIG. 35 has the MOS transistor 87 and one capacitor 88 or two capacitors 88 or more. The gate of the MOS transistor 87 is connected to the first and last word lines WL formed in the memory cell region respectively. Also, one electrode of the capacitor 88 is connected to one of the source/drain of the MOS transistor 87. If a plurality of capacitors 88 are present, these capacitors 88 are connected in parallel. In addition, a plate line boost signal line extended from the peripheral circuit is connected to the other electrode of the capacitor 88. Both the source/drain of the MOS transistor 87 are connected to the middle of the signal line that is extended from the plate line driver 22.

Then, a boost signal is applied via the plate line boost signal line at a point of time when the voltage Vcc is applied to the first and last plate lines PL (10a) and also the ON voltage is applied to the first and last word line WL. As a result, the voltage on the plate line PL is boosted in answer to the voltage of the boost signal and the number of the capacitors 88. Accordingly, the voltage Vf11 applied to the ferroelectric capacitor $C_{fer}$ shown in FIG. 30 is increased and thus the error in the reading is difficult to occur.

In this case, the plate line boost circuit may be connected to the plate lines 10a in the memory cell region except the first and last plate lines. In this case, the boost voltage may be reduced stepwise by reducing the number of the capacitors 88 in the plate line boost circuit, which is connected to the plate lines 10a, toward the center of the memory cell region.

As described above, according to the present invention, the dummy capacitors are formed selectively at four corners of the memory cell region. Therefore, the deterioration of the actual operating capacitors, which are ready to deteriorate at four corners of the memory cell region, out of a plurality of actual operating capacitors that are arranged in the memory cell region can be prevented.

Also, the structure in which the conductive pattern is connected to the upper electrode of the dummy capacitor may be employed. Therefore, the distribution of the reaction gas employed to form the actual operating capacitors, etc. can be easily uniformized in the memory cell region, and also the characteristic deterioration of the actual operating capacitors can be prevented.

As a result, the deterioration of the actual operating capacitors having the ferroelectric film can be suppressed, and the occupied area of the cell array can be minimized while maintaining the yield and the retention performance high.

According to above another invention, the areas of the capacitors, which are located closest to four corners of the memory cell region, out of a plurality of capacitors formed in the memory cell region vertically and horizontally are set wider than the areas of other capacitors.

Therefore, such an event can be suppressed that, if the storage capacitances of the capacitors that are located closest to four corners of the memory cell region are lowered locally, a quantity of stored charge in the capacitors that are located closest to four corners is reduced smaller than that of other capacitors.

Also, capacitance supplementing elements are formed in the bit line that are connected to the capacitors, which are located closest to four corners of the memory cell region, via the transistors. Therefore, even if the storage capacitances of the capacitors that are located closest to four corners are lowered locally, it can be suppressed that the error of the reading of the data stored in the capacitor is caused.

In addition, the booster circuit is connected to the plate line that is connected to the capacitors that are located closest to four corners of the memory cell region. Therefore, even if the storage capacitances of the capacitors that are located closest to four corners are lowered locally, it can be prevented that the error of the reading of the data stored in the capacitor is caused.

What is claimed is:

1. A semiconductor device comprising:
    a first insulating film formed over a semiconductor substrate;
    actual operating capacitors formed on the first insulating film in a memory cell region vertically and horizontally;
    dummy capacitors formed selectively on the first insulating film at four corners of the memory cell region; and
    a second insulating film formed on the actual operating capacitors and the dummy capacitors.

2. A semiconductor device according to claim 1, wherein the dummy capacitors are formed on at least one of insides and outsides of four corners of the memory cell region.

3. A semiconductor device according to claim 1, wherein any of the operating capacitors are formed in a region between the dummy capacitors along sides of the memory cell region.

4. A semiconductor device according to claim 1, wherein the dummy capacitors are formed to surround four corners of the memory cell region from three sides on an outside.

5. A semiconductor device according to claim 1, wherein the dummy capacitors are formed on an outermost periphery of the memory cell region, and arranged at four corners of the memory cell region doubly or more in an outward direction.

6. A semiconductor device according to claim 1, wherein the dummy capacitors are formed at a higher density or more largely in number or wider in area as the dummy capacitors are positioned closer to four corners of the memory cell region.

7. A semiconductor device according to claim 1, wherein the dummy capacitors and the actual operating capacitors consist of a lower electrode, a ferroelectric film, and an upper electrode, which are made of same material in both capacitors respectively.

8. A semiconductor device according to claim 1, wherein an upper electrode of a dummy capacitor is connected to a conductive pattern on the second insulating film via a hole formed in the second insulating film.

9. A semiconductor device according to claim 8, wherein the conductive pattern is an electrically-isolated pattern.

10. A semiconductor device according to claim 8, wherein the conductive pattern is connected electrically to the upper electrodes of a plurality of dummy capacitors.

11. A semiconductor device according to claim 8, wherein the conductive pattern is any one of a plate line and a bit line that passes through the memory cell region.

12. A semiconductor device according to claim 1, wherein the lower electrode of the dummy capacitor is a conductive plate that is also used as the lower electrode of an actual operating capacitor.

13. A semiconductor device according to claim 1, wherein a plurality of dummy capacitors are formed while using one lower electrode commonly.

14. A semiconductor device according to claim 1, wherein the dummy capacitor is formed wider than the actual operating capacitor, and a first hole formed in the second insulating film on an upper electrode of the dummy capacitor is wider than a second hole formed on an upper electrode of the actual operating capacitor.

15. A semiconductor device according to claim 1, wherein the dummy capacitors are formed in regions other than the memory cell region.

16. A semiconductor device according to claim 1, wherein a lower electrode of the dummy capacitor is extended electrically from an upper side.

17. A semiconductor device according to claim 1, wherein respective side surfaces of a lower electrode, a ferroelectric film, and an upper electrode constituting the dummy capacitor are formed to be continued.

18. A semiconductor device according to claim 1, wherein a bottom surface of a lower electrode of the dummy capacitor is connected directly to a conductive plug formed in the first insulating film.

19. A semiconductor device according to claim 1, wherein one of the upper electrode and the lower electrode of the dummy capacitor is connected electrically to an impurity diffusion region that is formed on a surface layer of the semiconductor substrate and is isolated electrically.

20. A semiconductor device according to claim 1, wherein the dummy capacitor is different in shape from the actual operating capacitor.

21. A semiconductor device comprising:
    a first insulating film formed over a semiconductor substrate;
    first actually-operating capacitors formed in a memory cell region on the first insulating film, and each having a first upper electrode, a first dielectric film, and a first lower electrode;
    second actually-operating capacitors formed in four corners in the memory cell region on the first insulating film, and each having a second upper electrode whose area is wider than the first upper electrode, a second dielectric film, and a second lower electrode; and
    a second insulating film for covering the first actually-operating capacitors and the second actually-operating capacitors.

22. A semiconductor device according to claim 21, wherein at least one of the second lower electrodes is formed integrally with at least one of other second lower electrodes and the first lower electrodes to constitute a first plate line.

23. A semiconductor device according to claim 22, wherein widths of portions positioned under the first upper electrodes are set equal to widths of portions positioned under the second upper electrodes in the first plate line in an orthogonal direction that intersects with a direction along which the first lower electrodes and the second lower electrodes are positioned adjacently.

24. A semiconductor device according to claim 22, wherein widths of portions positioned under the second upper electrodes are set wider than widths of portions positioned under the first upper electrodes in the first plate line in an orthogonal direction that intersects with a direction along which the first lower electrodes and the second lower electrodes are positioned adjacently.

25. A semiconductor device according to claim 21, further comprising:
    a second plate line constructed by forming the second lower electrodes integrally; and
    a third plate line constructed by forming the first lower electrodes integrally and having a width that is narrower than the second plate line.

26. A semiconductor device according to claim 21, further comprising:
    first holes formed in the first insulating film immediately under the first lower electrodes;
    first conductive plugs formed in the first holes and connected to the first lower electrodes;
    second holes formed in the first insulating film immediately under the second lower electrodes; and
    second conductive plugs formed in the second holes and connected to the second lower electrodes.

27. A semiconductor device according to claim 21, further comprising:
    first holes formed in the second insulating film on the first upper electrodes;
    first wirings connected electrically to the first actually-operating capacitors via the first holes;
    second holes formed in the second insulating film on the second upper electrodes and having a larger diameter than the first holes; and
    second wirings connected electrically to the second actually-operating capacitors via the second holes.

28. A semiconductor device according to claim 21, wherein the second actually-operating capacitors are formed not only in four corners of the second actually-operating capacitors are formed but also along an outermost periphery of the memory cell region.

29. A semiconductor device according to claim 21, wherein the second actually-operating capacitors are formed in plural from four corners of the memory cell region toward a center area.

30. A semiconductor device according to claim 21, wherein the first lower electrodes and the second lower electrodes have a structure that is formed by patterning the first conductive film respectively, and the first upper electrodes and the second upper electrodes have a structure that is formed by patterning the second conductive film respectively.

31. A semiconductor device according to claim 21, wherein the second actually-operating capacitors are also formed in areas whose capacitor density is thin, on an inner side than four corners of the memory cell region.

32. A semiconductor device according to claim 21, wherein the second actually-operating capacitors are also formed in areas in which a capacitor repeating structure is disordered, on an inner side than four corners of the memory cell region.

33. A semiconductor device comprising:
    a first insulating film formed over a semiconductor substrate;
    first actually-operating capacitors formed in a memory cell region on the first insulating film, and each having a first upper electrode, a first dielectric film, and first lower electrode;
    second actually-operating capacitors formed in four corners in the memory cell region on the first insulating film, and each having a second upper electrode, a second dielectric film, and a second lower electrode;
    a second insulating film for covering the first actually-operating capacitors and the second actually-operating capacitors;
    first bit lines connected electrically to the first upper electrodes of the first actually-operating capacitors via first transistors;
    second bit lines connected electrically to the second upper electrodes of the second actually-operating capacitors via second transistors; and
    one or two or more capacitance supplementing elements connected to each of the second bit lines.

34. A semiconductor device according to claim 33, wherein the second actually-operating capacitors are also formed between four corners of the memory cell region, and
    a number of the capacitance supplementing elements connected to each of the second bit lines is reduced stepwise every second bit line that is gradually away from four corners.

35. A semiconductor device according to claim 33, wherein the capacitance supplementing elements have a same structure as the first or second actually-operating capacitors.

36. A semiconductor device according to claim 33, wherein the capacitance supplementing elements are MOS transistors.

37. A semiconductor device comprising:
- a first insulating film formed over a semiconductor substrate;
- plate lines formed on the first insulating film in a memory cell region;
- capacitors connected to the plate lines respectively; and
- a boost circuit connected to each of first plate lines, which are arranged closest to four corners of the memory cell region, out of the plate lines.

38. A semiconductor device according to claim 37, wherein the boost circuit is also connected to second plate lines, which are formed between four corners of the memory cell region, out of the plate lines, and a boost voltage of the boost circuit connected to each of the first and second plate lines is made small with an increase of a distance from four corners.

39. A semiconductor device according to claim 1, wherein the only dummy capacitors are formed on the first insulating film at four corners of the memory cell region.

* * * * *